(12) United States Patent
Yamazaki et al.

(10) Patent No.: US 8,879,011 B2
(45) Date of Patent: Nov. 4, 2014

(54) DISPLAY DEVICE AND METHOD FOR MANUFACTURING THE SAME

(71) Applicant: Semiconductor Energy Laboratory Co., Ltd., Atsugi (JP)

(72) Inventors: Shunpei Yamazaki, Setagaya (JP); Junichiro Sakata, Atsugi (JP); Masashi Tsubuku, Atsugi (JP); Kengo Akimoto, Atsugi (JP); Miyuki Hosoba, Isehara (JP); Masayuki Sakakura, Tochigi (JP); Yoshiaki Oikawa, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/196,236

(22) Filed: Mar. 4, 2014

(65) Prior Publication Data

US 2014/0186997 A1 Jul. 3, 2014

Related U.S. Application Data

(63) Continuation of application No. 13/939,468, filed on Jul. 11, 2013, which is a continuation of application No. 13/363,405, filed on Feb. 1, 2012, now Pat. No. 8,488,077, which is a continuation of application No. 12/861,190, filed on Aug. 23, 2010, now Pat. No. 8,115,883.

(30) Foreign Application Priority Data

Aug. 27, 2009 (JP) .................. 2009-196618

(51) Int. Cl.
  *G02F 1/136* (2006.01)
  *H01L 29/66* (2006.01)
(52) U.S. Cl.
  CPC ............... *H01L 29/66969* (2013.01)
  USPC .............. 349/43; 349/19; 349/33; 349/41; 349/42; 349/49

(58) Field of Classification Search
  USPC ............... 349/19, 33, 41, 42, 43, 49, 50
  See application file for complete search history.

(56) References Cited

U.S. PATENT DOCUMENTS 5,534,722 A 7/1996 Takasu et al.
5,731,856 A 3/1998 Kim et al.
(Continued)

FOREIGN PATENT DOCUMENTS

CN 001892387 A 1/2007
EP 1 737 044 A 12/2006
(Continued)

OTHER PUBLICATIONS

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

(Continued)

*Primary Examiner* — Jennifer Doan
(74) *Attorney, Agent, or Firm* — Eric J. Robinson; Robinson Intellectual Property Law Office, P.C.

(57) ABSTRACT

An object is to provide a display device with excellent display characteristics, where a pixel circuit and a driver circuit provided over one substrate are formed using transistors which have different structures corresponding to characteristics of the respective circuits. The driver circuit portion includes a driver circuit transistor in which a gate electrode layer, a source electrode layer, and a drain electrode layer are formed using a metal film, and a channel layer is formed using an oxide semiconductor. The pixel portion includes a pixel transistor in which a gate electrode layer, a source electrode layer, and a drain electrode layer are formed using an oxide conductor, and a semiconductor layer is formed using an oxide semiconductor. The pixel transistor is formed using a light-transmitting material, and thus, a display device with higher aperture ratio can be manufactured.

17 Claims, 28 Drawing Sheets

(56) References Cited

U.S. PATENT DOCUMENTS

| | | | |
|---|---|---|---|
| 5,744,864 A | 4/1998 | Cillessen et al. | |
| 6,261,881 B1 | 7/2001 | Yamazaki et al. | |
| 6,285,042 B1* | 9/2001 | Ohtani et al. | 257/66 |
| 6,294,274 B1 | 9/2001 | Kawazoe et al. | |
| 6,476,784 B2 | 11/2002 | Zavracky et al. | |
| 6,482,704 B1* | 11/2002 | Amano et al. | 438/285 |
| 6,563,174 B2 | 5/2003 | Kawasaki et al. | |
| 6,727,522 B1 | 4/2004 | Kawasaki et al. | |
| 6,738,109 B2 | 5/2004 | Jeon | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,298,084 B2 | 11/2007 | Baude et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,642,573 B2 | 1/2010 | Hoffman et al. | |
| 7,674,650 B2 | 3/2010 | Akimoto et al. | |
| 7,719,185 B2 | 5/2010 | Jin et al. | |
| 7,732,819 B2 | 6/2010 | Akimoto et al. | |
| 7,745,798 B2 | 6/2010 | Takahashi | |
| 7,838,348 B2 | 11/2010 | Hoffman et al. | |
| 7,915,689 B2 | 3/2011 | Cho et al. | |
| 7,943,985 B2 | 5/2011 | Kim et al. | |
| 8,017,947 B2 | 9/2011 | Kim et al. | |
| 8,022,411 B2 | 9/2011 | Yoon et al. | |
| 8,232,551 B2 | 7/2012 | Kim et al. | |
| 8,488,077 B2 | 7/2013 | Yamazaki et al. | |
| 8,513,661 B2 | 8/2013 | Takahashi et al. | |
| 2001/0030323 A1 | 10/2001 | Ikeda | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2004/0232421 A1 | 11/2004 | Ono et al. | |
| 2005/0017302 A1 | 1/2005 | Hoffman | |
| 2005/0099551 A1 | 5/2005 | Yang et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0002199 A1 | 1/2007 | Fujikawa et al. | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0057261 A1 | 3/2007 | Jeong et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252145 A1 | 11/2007 | Toyota et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0157081 A1 | 7/2008 | Huh | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0246033 A1 | 10/2008 | Huh et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0291350 A1 | 11/2008 | Hayashi et al. | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0140438 A1 | 6/2009 | Yamazaki et al. | |
| 2009/0152506 A1 | 6/2009 | Umeda et al. | |
| 2009/0152541 A1 | 6/2009 | Maekawa et al. | |
| 2009/0189155 A1 | 7/2009 | Akimoto | |
| 2009/0189156 A1 | 7/2009 | Akimoto | |
| 2009/0225251 A1 | 9/2009 | Kaitoh et al. | |
| 2009/0278122 A1 | 11/2009 | Hosono et al. | |
| 2009/0280600 A1 | 11/2009 | Hosono et al. | |
| 2009/0283762 A1 | 11/2009 | Kimura | |
| 2010/0044696 A1 | 2/2010 | Cheng et al. | |
| 2010/0044701 A1 | 2/2010 | Sano et al. | |
| 2010/0059751 A1 | 3/2010 | Takahashi et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0163863 A1 | 7/2010 | Yaegashi | |
| 2011/0012112 A1 | 1/2011 | Yamazaki et al. | |
| 2011/0012116 A1 | 1/2011 | Yamazaki et al. | |
| 2011/0031492 A1 | 2/2011 | Yamazaki et al. | |
| 2011/0031493 A1 | 2/2011 | Yamazaki et al. | |
| 2011/0031496 A1 | 2/2011 | Yamazaki et al. | |
| 2011/0031497 A1 | 2/2011 | Yamazaki et al. | |
| 2011/0032444 A1 | 2/2011 | Yamazaki et al. | |

FOREIGN PATENT DOCUMENTS

| | | |
|---|---|---|
| EP | 1 770 788 | A 4/2007 |
| EP | 2 226 847 | A 9/2010 |
| JP | 60-198861 | A 10/1985 |
| JP | 63-210022 | A 8/1988 |
| JP | 63-210023 | A 8/1988 |
| JP | 63-210024 | A 8/1988 |
| JP | 63-215519 | A 9/1988 |
| JP | 63-239117 | A 10/1988 |
| JP | 63-265818 | A 11/1988 |
| JP | 05-251705 | 9/1993 |
| JP | 08-264794 | 10/1996 |

(56) References Cited

FOREIGN PATENT DOCUMENTS

| | | |
|---|---|---|
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-029293 | 1/2003 |
| JP | 2003-086000 | 3/2003 |
| JP | 2003-086808 | 3/2003 |
| JP | 2004-103957 | 4/2004 |
| JP | 2004-273614 A | 9/2004 |
| JP | 2004-273732 A | 9/2004 |
| JP | 2006-286773 A | 10/2006 |
| JP | 2007-081362 | 3/2007 |
| JP | 2007-096055 | 4/2007 |
| JP | 2007-123861 | 5/2007 |
| JP | 2007-163467 | 6/2007 |
| JP | 2007-171932 | 7/2007 |
| JP | 2007-529118 | 10/2007 |
| JP | 2009-176865 A | 8/2009 |
| JP | 2009-265271 | 11/2009 |
| JP | 2010-098280 | 4/2010 |
| WO | WO 2004/114391 | 12/2004 |
| WO | WO-2005/093849 | 10/2005 |
| WO | 2008/105347 | 9/2008 |
| WO | WO-2009/093722 | 7/2009 |

OTHER PUBLICATIONS

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—Zno System at 1350° C," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$ (m= 3, 4, and 5), $InGaO_3(ZnO)_3$, and $Ga_2O_3(ZnO)_m$ (m= 7, 8, 9, and 16) in the $In_2O_3$—$ZnGa_2O_4$—ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9th International Display Workshops, Dec. 4, 2002, pp. 295-298.

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUS on Flexible and Glass Substrates for Secure RFID Systems," Journal of Solid-State Circuits, 2008, vol. 43, No. 1, pp. 292-299.

Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium—Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In—Ga—Zn—Oxide TFTs," IDW '09: Proceedings of the 16th International Display Workshops, 2009, pp. 689-692.

Park et al., "Amorphous Indium—Gallium—Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Osada et al., "Development of Driver-Integrated Panel using Amorphous In—Ga—Zn—Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Ohara et al., "21.3: 4.0 IN. QVGA AMOLED Display Using In—Ga—Zn—Oxide TFTs with a Novel Passivation Layer," SID Digest '09: SID International Symposium Digest of Technical Papers, May 31, 2009, pp. 284-287.

Miyasaka, "58.2: Invited Paper: Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

(56) References Cited

OTHER PUBLICATIONS

Asaoka et al., "29.1: Polarizer-Free Reflective LCD Combined With Ultra Low-Power Driving Technology," SID Digest '09: SID International Symposium Digest of Technical Papers, 2009, pp. 395-398.
Lee et al., "Current Status of, Challenges to, and Perspective View of AM-OLED," IDW '06: Proceedings of the 13TH International Display Workshops, Dec. 7, 2006, pp. 663-666.
Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.
Kikuchi et al., "Polymer-Stabilized Liquid Crystal Blue Phases," Nature Materials, Sep. 2, 2002, vol. 1, pp. 64-68.
Kimizuka et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, Or Al; B: Mg, Mn, Fe, Ni, Cu, or Zn] at Temperatures Over 1000° C" Journal of Solid State Chemistry, 1985, vol. 60, pp. 382-384.
Kitzerow et al., "Observation of Blue Phases in Chiral Networks," Liquid Crystals, 1993, vol. 14, No. 3, pp. 911-916.
Costello et al., "Electron Microscopy of a Cholesteric Liquid Crystal and Its Blue Phase," Phys. Rev. A (Physical Review. A), May 1, 1984, vol. 29, No. 5, pp. 2957-2959.
Meiboom et al., "Theory of the Blue Phase of Cholesteric Liquid Crystals," Phys. Rev. Lett. (Physical Review Letters), May 4, 1981, vol. 46, No. 18, pp. 1216-1219.
Fortunato et al., "Wide-Bandgap High-Mobility ZNO Thin-Film Transistors Produced At Room Temperature," Appl. Phys. Lett. (Applied Physics Letters), Sep. 27, 2004, vol. 85, No. 13, pp. 2541-2543.
Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.
Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.
Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.
Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.
Van de Walle, "Hydrogen as a Cause of Doping in Zinc Oxide," Phys. Rev. Lett. (Physical Review Letters), Jul. 31, 2000, vol. 85, No. 5, pp. 1012-1015.
Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Nakamura, "Synthesis of Homologous Compound with New Long-Period Structure," Nirim Newsletter, Mar. 1, 1995, vol. 150, pp. 1-4.
Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.
Orita et al., "Mechanism of Electrical Conductivity of Transparent $InGaZnO_4$," Phys. Rev. B (Physical Review. B), Jan. 15, 2000, vol. 61, No. 3, pp. 1811-1816.
Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.
Janotti et al., "Native Point Defects in ZnO," Phys. Rev. B (Physical Review. B), Oct. 4, 2007, vol. 76, No. 16, pp. 165202-1-165202-22.
Park et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.
Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.
Janotti et al., "Oxygen Vacancies in ZnO," Appl. Phys. Lett. (Applied Physics Letters), 2005, vol. 87, pp. 122102-1-122102-3.
Oba et al., "Defect energetics in ZnO: A hybrid Hartree-Fock density functional study," Phys. Rev. B (Physical Review. B), 2008, vol. 77, pp. 245202-1245202-6.
Orita et al., "Amorphous transparent conductive oxide $InGaO_3(ZnO)_m$ (m<4): a Zn 4s conductor," Philosophical Magazine, 2001, vol. 81, No. 5, pp. 501-515.
Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Mo et al., "Amorphous Oxide TFT Backplanes for Large Size AMOLED Displays," IDW '08: Proceedings of the 6th International Display Workshops, Dec. 3, 2008, pp. 581-584.
Kim et al., "High-Performance oxide thin film transistors passivated by various gas plasmas," 214th ECS Meeting, 2008, No. 2317.
Clark et al., "First Principles Methods Using CASTEP," Zeitschrift fur Kristallographie, 2005, vol. 220, pp. 567-570.
Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.
Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.
Nozawa, "Transparent Circuit," Nikkei Electronics, Aug. 27, 2007, No. 959, pp. 39-52.
Chinese Office Action (Application No. 201010263823.5) Dated May 9, 2014.

* cited by examiner

FIG. 1A
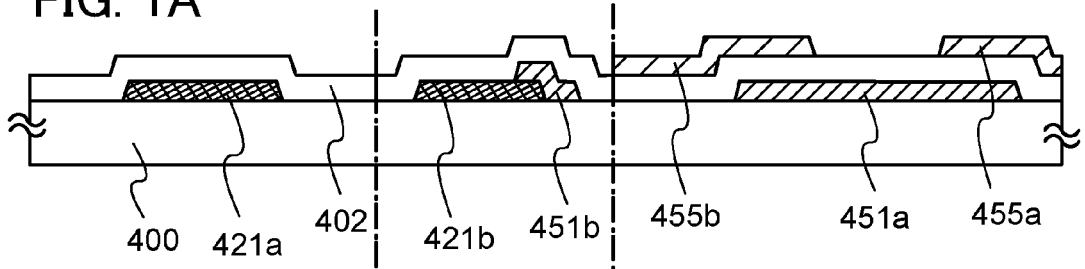
FIG. 1B
FIG. 1C
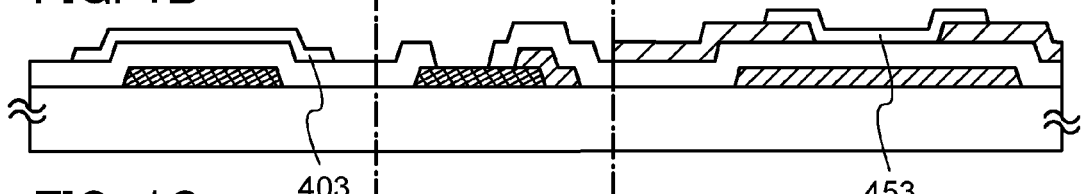
FIG. 1D
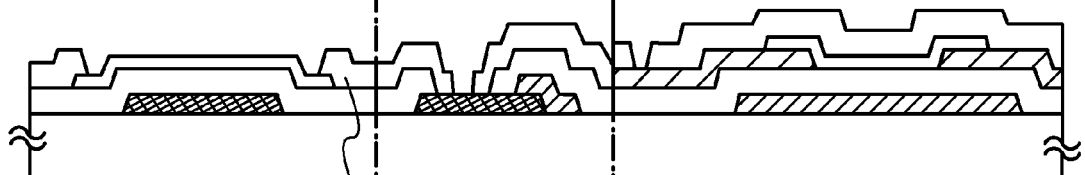
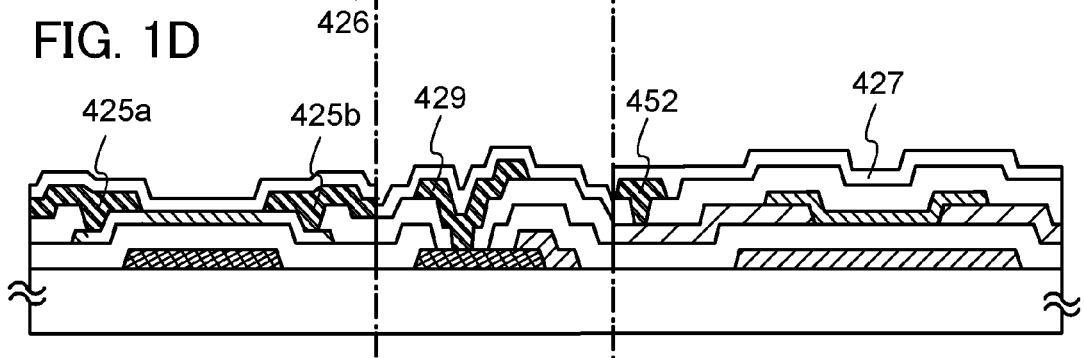
FIG. 1E
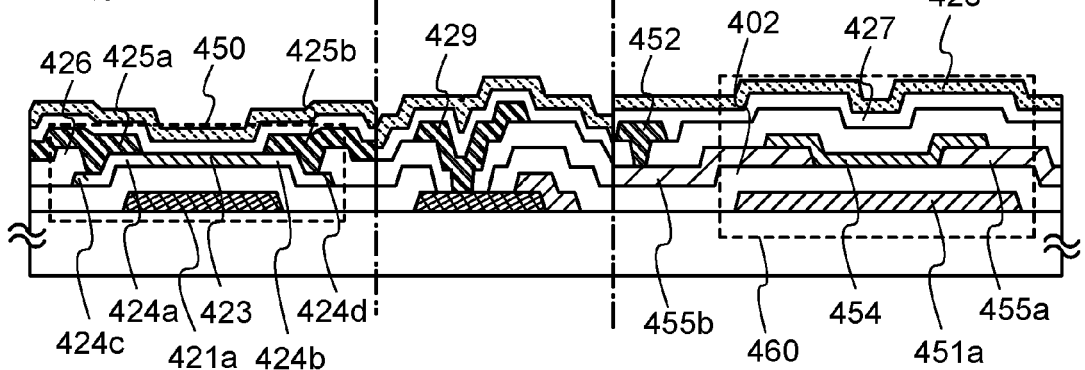

FIG. 4A1
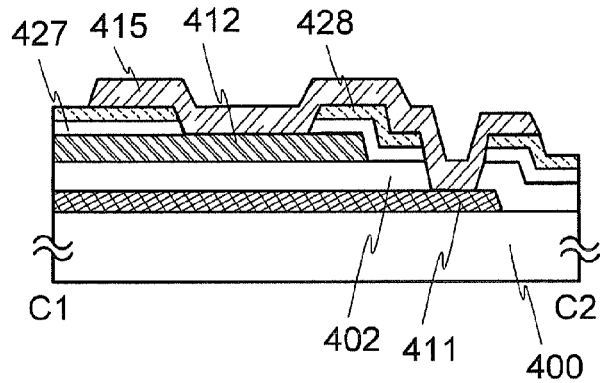
FIG. 4A2
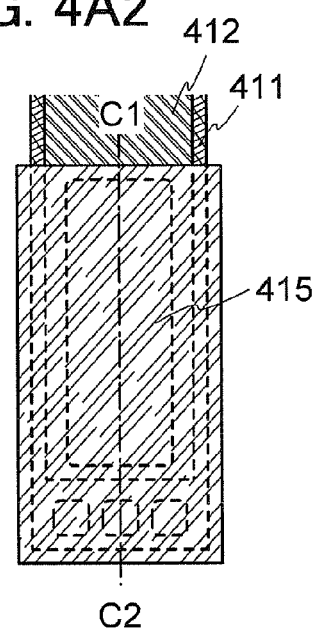
FIG. 4B1
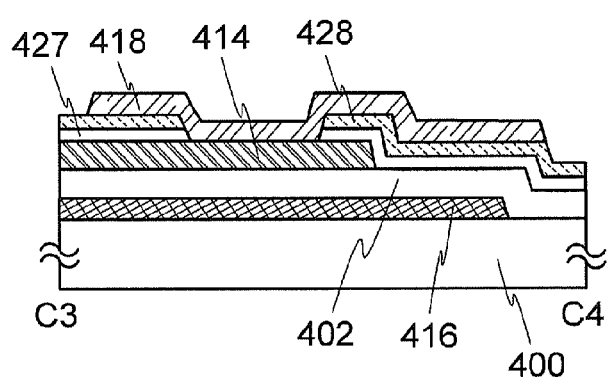
FIG. 4B2
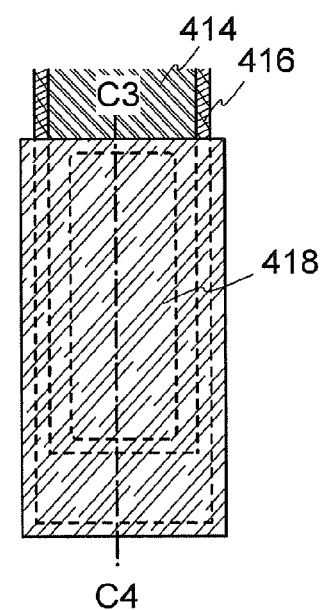

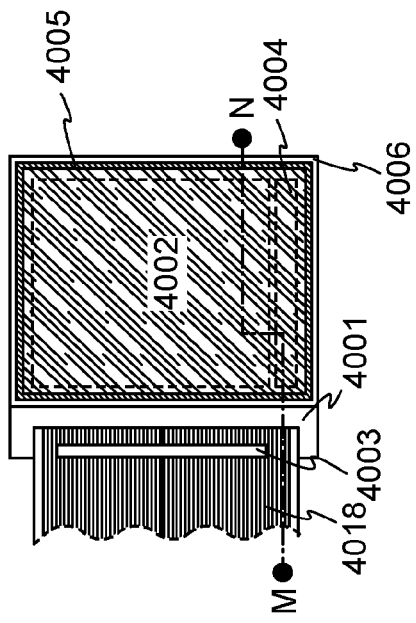
FIG. 5A1
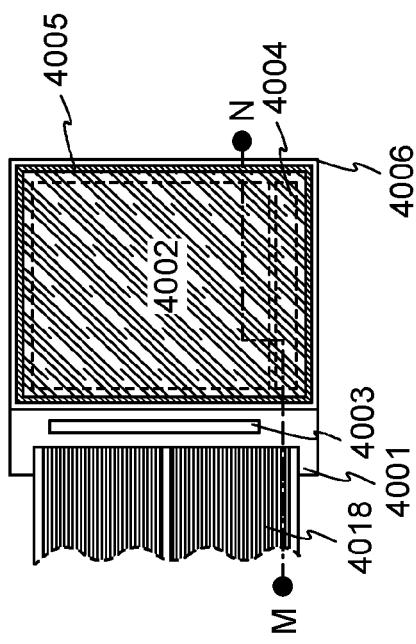
FIG. 5A2
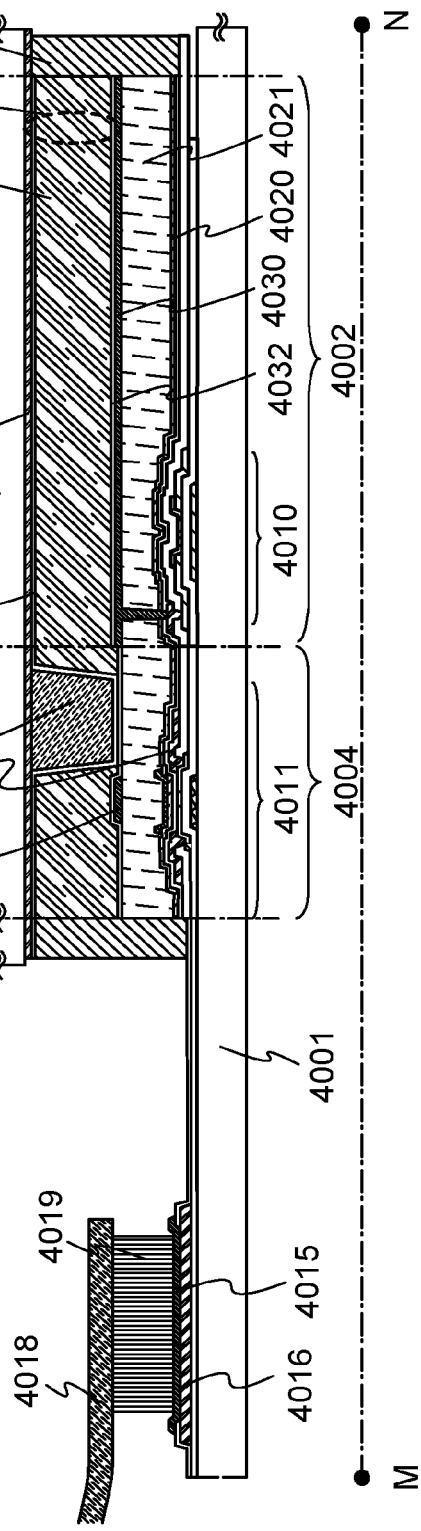
FIG. 5B

DISPLAY DEVICE AND METHOD FOR MANUFACTURING THE SAME

BACKGROUND OF THE INVENTION

1. Field of the Invention

The present invention relates to a display device including an oxide semiconductor.

2. Description of the Related Art

In recent years, a technique by which transistors are formed using semiconductor thin films formed over a substrate having an insulating surface has been attracting attention. The transistors are applied to a wide range of electronic devices such as ICs or electro-optical devices, and there is an expectation for immediate development of especially transistors to be used as switching elements for image display devices. Various metal oxides are used for a variety of applications. Indium oxide is a well-known material and is used as a transparent electrode material which is necessary for liquid crystal displays and the like.

Some metal oxides have semiconductor characteristics. Examples of such metal oxides having semiconductor characteristics include tungsten oxide, tin oxide, indium oxide, zinc oxide, and the like. Transistors in which a channel formation region is formed using such metal oxides having semiconductor characteristics are known (Patent Documents 1 and 2).

Furthermore, the transistors including oxide semiconductors have relatively high field-effect mobility. Thus, with use of the transistors, a driver circuit in a display device or the like can be formed.

REFERENCE

[Patent Document 1] Japanese Published Patent Application No. 2007-123861

[Patent Document 2] Japanese Published Patent Application No. 2007-096055

SUMMARY OF THE INVENTION

In a display device or the like, in the case where a pixel portion (also referred to as a pixel circuit) and a driver circuit portion are formed over one substrate, excellent switching characteristics, e.g., a high on-off ratio are needed for a transistor used for the pixel portion, and a high operation speed is needed for a transistor used for the driver circuit portion.

In particular, as the pixel density of the display device is increased, writing time of a display image is reduced. Therefore, it is preferable that the transistor used for the driver circuit operate at high speed. Besides, the increased pixel density causes a decrease in the aperture ratio, which is a problem in the pixel portion.

Therefore, an embodiment of the present invention disclosed in this specification is a display device which can achieve the above object and a manufacturing method thereof.

One embodiment of the present invention disclosed in this specification is a display device including a pixel portion and a driver circuit portion over one substrate, where the pixel portion includes: a first transistor including a first gate electrode layer, a gate insulating layer over the first gate electrode layer, a first source electrode layer and a first drain electrode layer which are over the gate insulating layer and partly overlap with the first gate electrode layer, and a first oxide semiconductor layer which is over the gate insulating layer and partly overlaps with the first source electrode layer and the first drain electrode layer; a first oxide insulating layer over the first source electrode layer, the first drain electrode layer, and the first oxide semiconductor layer; a connection electrode layer which is over the first oxide insulating layer and electrically connected to the first drain electrode layer; a second oxide insulating layer over the first oxide insulating layer and the connection electrode layer; a protective insulating layer over the second oxide insulating layer; and a pixel electrode layer which is over the protective insulating layer and electrically connected to the connection electrode layer, and where the driver circuit portion includes: a second transistor including a second gate electrode layer, the gate insulating layer over the second gate electrode layer, a second oxide semiconductor layer over the gate insulating layer, and a second source electrode layer and a second drain electrode layer which are over the second oxide semiconductor layer and partly overlap with the second oxide semiconductor layer; a second oxide insulating layer over the second source electrode layer, the second drain electrode layer, and the second oxide semiconductor layer; and the protective insulating layer over the second oxide semiconductor layer. The first gate electrode layer, the gate insulating layer, the first oxide semiconductor layer, the first source electrode layer, the first drain electrode layer, the first oxide insulating layer, the second oxide insulating layer, the protective insulating layer, and the pixel electrode layer each have a light-transmitting property.

Note that in this specification, the ordinal numbers such as "first" and "second" in this specification are used for convenience and do not denote the order of steps and the stacking order of layers. In addition, the ordinal numbers do not denote particular names which specify the invention.

The first gate electrode layer and the first source and drain electrode layers of the first transistor are formed using metal oxides. The second gate electrode layer and the second source and drain electrode layers of the second transistor are formed using metals.

As the metal oxide, indium oxide, an alloy of indium oxide and tin oxide, an alloy of indium oxide and zinc oxide, or zinc oxide can be used.

In addition, in the pixel portion, a light-transmitting planarization insulating layer may be formed between the second oxide insulating layer and the protective insulating layer.

Furthermore, a conductive layer may be formed over the protective insulating layer which overlaps with the second oxide semiconductor layer in the driver circuit portion.

Each of the first oxide insulating layer and the second oxide insulating layer may be formed using an inorganic insulating film by a sputtering method. For example, silicon oxide, silicon nitride oxide, aluminum oxide, or aluminum oxynitride can be used.

Further, in the second transistor, an oxide conductive layer may be formed between the second oxide semiconductor layer and the second source electrode layer and between the second oxide semiconductor layer and the second drain electrode layer. Such a structure enables contact resistance to be reduced, with which a transistor operating at high speed can be manufactured. Note that the oxide conductive layer preferably contains as a component zinc oxide but no indium oxide. Such an oxide conductive layer can be formed using zinc oxide, zinc aluminum oxide, zinc aluminum oxynitride, or gallium zinc oxide.

Another embodiment of the present invention disclosed in this specification is a method for manufacturing a display device including the steps of: forming a first gate electrode layer in a region to be a pixel portion; forming a second gate electrode layer in a region to be a driver circuit portion;

forming a gate insulating layer over the first gate electrode layer and the second gate electrode layer; forming a first transistor by forming a first source electrode layer and a first drain electrode layer over the gate insulating layer to partly overlap with the first gate electrode layer and forming a first oxide semiconductor layer over the gate insulating layer to partly overlap with the first source electrode layer and the first drain electrode layer; forming a second transistor by forming a second oxide semiconductor layer over the gate insulating layer to partly overlap with the second gate electrode layer, forming a first oxide insulating layer over the first oxide semiconductor layer, and forming a second source electrode layer and a second drain electrode layer over the first oxide insulating layer to partly overlap with the second oxide semiconductor layer; forming a connection electrode layer electrically connected to the first drain electrode layer; forming a second oxide insulating layer over the first oxide insulating layer, the second oxide semiconductor layer, the second source electrode layer, and the second drain electrode layer; forming a protective insulating layer over the second oxide insulating layer; and forming a pixel electrode layer over the protective insulating layer in the region to be the pixel portion to be electrically connected to the connection electrode layer.

In the structure of the above-described manufacturing method, the first gate electrode layer, the gate insulating layer, the first oxide semiconductor layer, the first source electrode layer, the first drain electrode layer, the first oxide insulating layer, the second oxide insulating layer, the protective insulating layer, and the pixel electrode layer each have a light-transmitting property.

The oxide insulating layer formed over the first oxide semiconductor layer and the second oxide semiconductor layer is preferably formed without exposure to air after dehydration or dehydrogenation so as to prevent reincorporation of water or hydrogen into the oxide semiconductor layer.

In this specification, the term "dehydration or dehydrogenation" refers to not only elimination of water or $H_2$ but also elimination of H, OH, or the like.

Dehydration or dehydrogenation is heat treatment which is preferably performed in an atmosphere of an inert gas such as nitrogen or a rare gas (such as argon or helium) at a temperature higher than or equal to 400° C. and lower than the strain point of the substrate, preferably higher than or equal to 425° C. and lower than or equal to 700° C.

In the case where heat treatment is performed in an atmosphere of an inert gas such as nitrogen or a rare gas (such as argon or helium), the oxide semiconductor layer becomes an oxygen-deficient type by the heat treatment to be a low-resistance oxide semiconductor layer, that is, an n-type (such as $n^-$-type) oxide semiconductor layer. Then, formation of an oxide insulating layer to be in contact with the oxide semiconductor layer allows the oxide semiconductor layer to be in an oxygen-excess state; accordingly, a high-resistance oxide semiconductor layer, that is, an i-type oxide semiconductor layer is provided. As a result, it is possible to form and provide a display device including a highly reliable transistor having favorable electrical characteristics.

The oxide semiconductor layer is subjected to dehydration or dehydrogenation under such a heat treatment condition that two peaks indicating discharge of water or at least one peak at around 300° C. is not detected even if thermal desorption spectroscopy (TDS) is performed at up to 450° C. on the dehydrated or dehydrogenated oxide semiconductor layer. Therefore, even if TDS is performed at up to 450° C. on a transistor including the dehydrated or dehydrogenated oxide semiconductor layer, at least the peak of water at around 300° C. is not detected.

It is important to prevent the dehydrated or dehydrogenated oxide semiconductor layer from being exposed to air so as to prevent reincorporation of water or hydrogen. After the dehydration or dehydrogenation, the oxide semiconductor layer is turned into a low-resistance oxide semiconductor layer, that is, an n-type ($n^-$-type, $n^+$-type, or the like) oxide semiconductor layer, and then, resistance of the oxide semiconductor layer is increased, whereby an i-type oxide semiconductor layer is formed. When a transistor is formed using such an oxide semiconductor layer, the threshold voltage of the transistor is positive voltage, so that the transistor has a so-called normally-off characteristic. It is preferable for a transistor used in a display device that a channel be formed with a gate threshold voltage that is a positive value and as close to 0 V as possible. As for an active-matrix display device, electric characteristics of a transistor included in a circuit are significant and performance of the display device depends on the electric characteristics. Especially, the threshold voltage of the transistor is important. If the threshold voltage of the transistor is negative, the transistor is in the normally-on state; in other words, current flows between the source electrode and the drain electrode even when the gate voltage is 0 V, and it is difficult to control the circuit including the transistor. Further, in some case, when the absolute value of the threshold voltage is higher, the driving voltage is insufficient, which makes it impossible for a transistor to perform switching operation even if the threshold voltage is the positive value. In the case of an n-channel transistor, it is preferable that a channel be formed and drain current begin to flow after positive gate voltage is applied. A transistor in which a channel is not formed unless the driving voltage is increased and a transistor in which a channel is formed and drain current flows even in the case of the negative voltage state are unsuitable for a transistor used for a circuit.

An atmosphere while the temperature is decreased from the temperature at which dehydration or dehydrogenation is performed may be changed into an atmosphere different from an atmosphere at the time of increasing temperature or an atmosphere of heat treatment. For example, with a furnace which has been used for dehydration or dehydrogenation, cooling can be performed by filling the furnace with a high-purity oxygen gas, a high-purity $N_2O$ gas, or an ultra-dry air (with a dew point of −40° C. or lower, preferably −60° C. or lower) while the oxide semiconductor layer is prevented from being exposed to air.

Since a transistor is easily broken due to static electricity or the like, a protective circuit for protecting the transistor in the pixel portion is preferably provided over the same substrate as a gate line or a source line. The protective circuit is preferably formed with a non-linear element including an oxide semiconductor layer.

In a display device of one embodiment of the present invention, a driver circuit portion including a driver circuit transistor and a display portion including a pixel transistor are formed over one substrate. Thus, the manufacturing cost of the display device can be reduced.

With use of an oxide semiconductor layer subjected to heat treatment for dehydration or dehydrogenation, a transistor with excellent electric characteristics can be manufactured. Further, when the transistor for the pixel circuit is formed using a light-transmitting material, a display device having high aperture ratio and excellent display characteristics can be manufactured. Furthermore, in a display device in which the pixel circuit and a driver circuit are formed over one substrate, transistors included in the pixel circuit and the driver circuit can be formed to have different structures between the circuits in order to obtain electric characteristics needed for the respective circuits easily.

BRIEF DESCRIPTION OF THE DRAWINGS

FIGS. 1A to 1E are cross-sectional process views illustrating one embodiment of the present invention.

FIGS. 4A1 and 4A2 and FIGS. 4B1 and 4B2 are cross-sectional views and plan views illustrating one embodiment of the present invention.

FIGS. 5A1 and 5A2 and FIG. 5B are plan views and a cross-sectional view illustrating one embodiment of the present invention.

DETAILED DESCRIPTION OF THE INVENTION

Figure 2A:
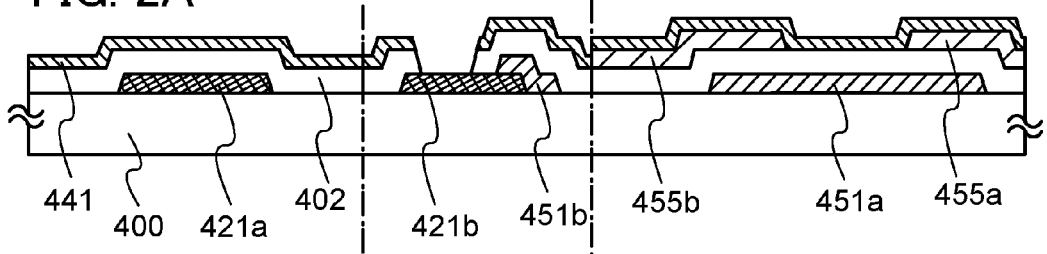
FIGS. 2A to 2E are cross-sectional process views illustrating one embodiment of the present invention.
Figure 2B:
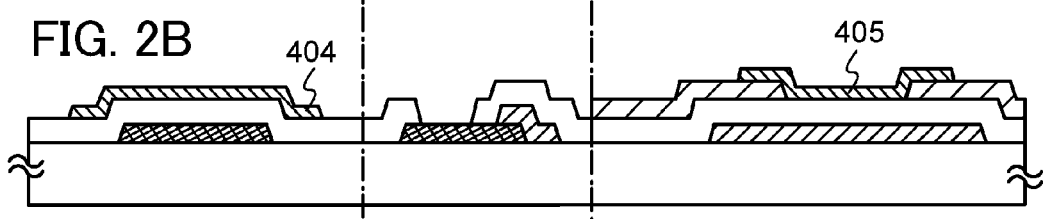
Figure 2C:
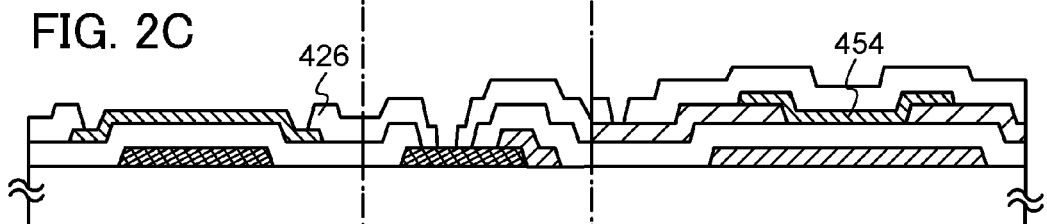

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. Note that in the drawings of this specification, the identical portions or portions having a similar function are denoted by the identical reference numerals, and description thereon may be omitted.

(Embodiment 1)

In this embodiment, a display device and a manufacturing method thereof will be described in detail with reference to drawings. FIG. 1E illustrates an example of a cross-sectional structure of a transistor in a driver circuit, a transistor in a pixel portion, and a contact portion of a gate wiring (gate electrode), which are formed over one substrate.

A transistor 450 has a bottom-gate structure called a channel-etch type, and a transistor 460 has a bottom-gate structure called a bottom-contact (also called an inverted-coplanar) type.

The transistor 460 provided in the pixel includes, over a substrate 400 having an insulating surface, a gate electrode layer 451a, a gate insulating layer 402, an oxide semiconductor layer 454 including a channel formation region, a source electrode layer 455a, and a drain electrode layer 455b. In addition, an oxide insulating layer 426 which covers the transistor 460 and is in contact with an upper surface and a side surface of the oxide semiconductor layer 454 is provided.

Although the transistor 460 provided in the pixel is described as a single-gate transistor, a multi-gate transistor having a plurality of channel formation regions may be used as necessary.

Note that the oxide semiconductor layer 454 has a light-transmitting property and be formed to partly overlap with the source electrode layer 455a and the drain electrode layer 455b. In addition, the oxide semiconductor layer 454 overlaps with the gate electrode layer 451a with the gate insulating layer 402 having a light-transmitting property interposed therebetween. The channel formation region of the transistor 460 provided in the pixel is a region which is in the oxide semiconductor layer 454 and positioned between a side surface of the source electrode layer 455a and a side surface of the drain electrode layer 455b, which faces the side surface of the source electrode layer 455a; that is, a region which is in contact with the gate insulating layer 402 and overlaps with the gate electrode layer 451a.

In order to achieve a display device with a high aperture ratio, the source electrode layer 455a and the drain electrode layer 455b of the transistor 460 are formed using a light-transmitting conductive film.

In addition, a light-transmitting conductive film is used for the gate electrode layer 451a of the transistor 460.

The transistor 450 provided in the driver circuit portion includes, over the substrate 400 having an insulating surface, a gate electrode layer 421a, the gate insulating layer 402, an oxide semiconductor layer 403, a source electrode layer 425a, and a drain electrode layer 425b. Here, the oxide semiconductor layer 403 has at least a channel formation region 423, a high-resistance source region 424a, and a high-resistance drain region 424b. In addition, over the channel formation region 423, the source electrode layer 425a, and the drain electrode layer 425b, an oxide insulating layer 427 and a protective insulating layer 428, each of which has a light-transmitting property, are provided.

A first region 424c and a second region 424d in the oxide semiconductor layer 403, which overlap with the oxide insulating layer 426, are in an oxygen-excess state like the channel formation region 423, and serve to reduce leakage current and also reduce the parasitic capacitance. Note that when the oxide insulating layer 426 does not overlap with the oxide semiconductor layer 403, the first region 424c and the second region 424d of the oxide semiconductor layer 403 are not formed.

Hereinafter, a manufacturing process of the transistor 450 and the transistor 460 over one substrate is described with reference to FIGS. 1A to 1E.

First, a metal film is formed over the substrate 400 having an insulating surface, and then by a first photolithography step and an etching step, the gate electrode layer 421a and a gate electrode layer 421b are formed. Note that although the gate electrode layer 421b corresponds to a gate wiring, it is referred to as the gate electrode layer for convenience.

Note that a resist mask used in the photolithography step may be formed by an inkjet method. Formation of the resist mask by an inkjet method needs no photomask; thus, manufacturing cost can be reduced.

As the metal film used for the gate electrode layers 421a and 421b, there are an element selected from Al, Cr, Ta, Ti, Mo, and W, an alloy including the above element, an alloy stacked film including any of these elements in combination, and the like.

As the substrate 400, a glass substrate, for example, formed from aluminosilicate glass, aluminoborosilicate glass, or barium borosilicate glass can be used. In the case where the temperature of heat treatment to be performed later is high, a substrate whose strain point is higher than or equal to 730° C. is preferably used as the substrate 400.

Note that a substrate formed of an insulator, such as a ceramic substrate, a quartz substrate, or a sapphire substrate, may be used instead of the glass substrate.

An insulating layer serving as a base film may be provided between the substrate 400 and the gate electrode layers 421a and 421b. The base film has a function of preventing diffusion of an impurity element from the substrate 400, and can be formed to have a single-layer or stacked structure using one or more of a silicon nitride film, a silicon oxide film, a silicon nitride oxide film, and a silicon oxynitride film.

Next, a light-transmitting conductive film is formed to cover the gate electrode layers 421a and 421b, and then by performance of a second photolithography step and an etching step, the gate electrode layer 451a and a gate electrode layer 451b are formed. Note that although the gate electrode layer 451b corresponds to the gate wiring layer, it is referred to as the gate electrode layer for convenience. As a material of the light-transmitting conductive film, a conductive material that transmits visible light, for example, an In—Sn—O-based metal oxide, an In—Sn—Zn—O-based metal oxide, an In—Al—Zn—O-based metal oxide, an Sn—Ga—Zn—O-based metal oxide, an Al—Ga—Zn—O-based metal oxide, an Sn—Al—Zn—O-based metal oxide, an In—Zn—O-based metal oxide, an Sn—Zn—O-based metal oxide, an Al—Zn—O-based metal oxide, an In—O-based metal oxide, an Sn—O-based metal oxide, or a Zn—O-based metal oxide can be employed. The thickness of the conductive film is selected as appropriate in the range of 50 nm to 300 nm inclusive. In the case of using a sputtering method, film formation may be performed using a target containing $SiO_2$ at 2 wt. % to 10 wt. % inclusive for the above conductive material.

In this embodiment, the gate wiring in the pixel portion is partly formed using the same metal film as the gate electrode layers 421a and 421b in order to reduce wiring resistance.

Next, the gate insulating layer 402 is formed over the gate electrode layers 421a, 421b, 451a, and 451b.

For the gate insulating layer 402, a light-transmitting insulating film such as a silicon oxide layer, a silicon nitride layer, a silicon oxynitride layer, or a silicon nitride oxide layer can be used, and such an insulating layer is formed by a plasma CVD method, a sputtering method, or the like. Further, the gate insulating layer 402 is not limited to a single layer of any of the above insulating film but may be a stacked layer including films different from each other. For example, a silicon oxynitride film can be formed using a deposition gas including silane ($SiH_4$), oxygen, and nitrogen by a plasma CVD method. The thickness of the gate insulating layer 402 is from 100 nm to 500 nm inclusive. In the case of a stacked structure, for example, a first gate insulating layer with a thickness from 50 nm to 200 nm inclusive is formed and a second gate insulating layer with a thickness from 5 nm to 300 nm inclusive are formed over the first gate insulating layer.

In this embodiment, the gate insulating layer 402 is formed using silicon oxynitride (SiON (the composition ratio N<O)) by a plasma CVD method to have a thickness of 100 nm.

Next, a light-transmitting conductive film is formed over the gate insulating layer 402, and then by performance of a third photolithography step and an etching step, the source electrode layer 455a and the drain electrode layer 455b are formed (see FIG. 1A).

For the light-transmitting conductive film, the material similar to that of the gate electrode layers 451a and 451b can be used.

Next, through a fourth photolithography step and an etching step, the gate insulating layer 402 is selectively etched, so that a contact hole reaching the gate electrode layer 421b is formed.

Next, over the gate insulating layer 402, a light-transmitting oxide semiconductor film is formed to a thickness form 5 nm to 200 nm inclusive, preferably from 10 nm to 20 nm inclusive by a sputtering method. The preferable thickness is 50 nm or smaller, so that the oxide semiconductor film can have an amorphous structure even when heat treatment for dehydration or dehydrogenation is performed after formation of the oxide semiconductor film. Reduction in thickness can prevent the oxide semiconductor film from being crystallized when heat treatment is performed later.

As the oxide semiconductor film, any of the following oxide semiconductor film can be used: an In—Sn—Ga—Zn—O film that is a quaternary metal oxide; an In—Ga—Zn—O film, an In—Sn—Zn—O film, In—Al—Zn—O film, an Sn—Ga—Zn—O film, an Al—Ga—Zn—O film, or an Sn—Al—Zn—O film that is a ternary metal oxide; an In—Zn—O film, an Sn—Zn—O film, an Al—Zn—O film, a Zn—Mg—O film, an Sn—Mg—O film, or an In—Mg—O film that is a binary metal oxide; an In—O film; an Sn—O film; a Zn—O film; and the like. In addition, the above oxide semiconductor film may contain $SiO_2$.

As the oxide semiconductor film, a thin film represented by $InMO_3 (ZnO)_m$ (m>0) can be used. Here, M represents one or more metal elements selected from Ga, Al, Mn, and Co. For example, M can be Ga, Ga and Al, Ga and Mn, Ga and Co, or the like. An oxide semiconductor film whose composition formula is represented by $InMO_3 (ZnO)_m$ (m>0), which includes Ga as M, is referred to as an In—Ga—Zn—O-based oxide semiconductor, and a thin film of the In—Ga—Zn—O-based oxide semiconductor is also referred to as an In—Ga—Zn—O-based non-single-crystal film.

In this embodiment, as the oxide semiconductor film, an In—Ga—Zn—O-based non-single-crystal film having a thickness of 15 nm is formed using an In—Ga—Zn—O-based oxide semiconductor target by a sputtering method.

The In—Ga—Zn—O-based non-single-crystal film can be formed in an oxygen atmosphere (the proportion of oxygen flow: 100%) under conditions where a target is an In—Ga—Zn—O-based oxide semiconductor ($In_2O_3$:$Ga_2O_3$:ZnO=1: 1:1 [molar ratio], i.e., In:Ga:Zn=1:1:0.5 [atomic ratio]), the distance between the substrate and the target is 100 mm, the pressure is 0.6 Pa, and the direct current (DC) power is 0.5 kW. Alternatively, a target with a composition ratio of In:Ga:Zn=1:1:1 [atomic ratio] or In:Ga:Zn=1:1:2 [atomic ratio] may be used. The filling factor of such a target is from 90% to 100% inclusive, preferably 95% to 99.9% inclusive. With use of a metal oxide target with high filling factor, the deposited oxide semiconductor film has high density.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a conductive film.

Note that in order to reduce dust generated during deposition and improve uniformity of the thickness distribution, it is preferable that sputtering be performed with use of a pulsed direct-current (DC) power source.

In addition, there is also a multi-source sputtering apparatus in which a plurality of targets of different materials can be set. With the multi-source sputtering apparatus, films of different materials can be deposited to be stacked in the same chamber, or a plurality of kinds of materials can be deposited by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin film of a compound thereof, and a bias sputtering in which a voltage is also applied to a substrate during deposition.

Note that before the oxide semiconductor film is formed by a sputtering method, dust on a surface of the gate insulating layer 402 is preferably removed by reverse sputtering in which an argon gas is introduced and plasma is generated. The reverse sputtering refers to a method in which an RF power source is used for application of voltage to a substrate side in an argon atmosphere so that ionized argon collides with the substrate to modify a surface. Note that instead of an argon atmosphere, nitrogen, helium, oxygen or the like may be used.

Before formation of the oxide semiconductor film, heat treatment (at higher than or equal to 400° C. and lower than the strain point of the substrate) may be performed in an inert gas atmosphere (e.g., nitrogen, helium, neon, or argon), so that impurities such as hydrogen and water, which are included in the gate insulating layer 402, are removed.

Next, by performance of a fifth photolithography step and an etching step, the oxide semiconductor film is processed into island-shaped oxide semiconductor layers 403 and 453 (see FIG. 1B). A resist mask used for formation of the island-shaped oxide semiconductor layers 403 and 453 may be formed by an inkjet method. Formation of the resist mask by an inkjet method needs no photomask; thus, manufacturing cost can be reduced.

Note that in this embodiment, formation of the contact hole reaching the gate electrode layer 421b is conducted in the fourth photolithography step and the etching step where the gate insulating layer is selectively etched, before formation of the oxide semiconductor film. However, formation of the contact hole may be conducted after formation of the above-described island-shaped oxide semiconductor layers 403 and 435. In that case, reverse sputtering is preferably performed so that resist residue on the surface of the oxide semiconductor layers 403 and 453 and the gate insulating layer 402 are removed.

Further alternatively, the contact hole reaching the gate electrode layer 421b may be formed after formation of the oxide semiconductor film over the gate insulating layer. In that case, after formation of the contact hole, the oxide semiconductor film is selectively etched to be processed into the island-shaped oxide semiconductor layers 403 and 453.

Next, the oxide semiconductor layers 403 and 453 are dehydrated and dehydrogenated. First heat treatment for dehydration or dehydrogenation is performed at a temperature higher than or equal to 400° C. and lower than the strain point of the substrate, preferably, 425° C. or higher. Note that in the case of the temperature that is 425° C. or higher, the heat treatment time may be one hour or shorter, whereas in the case of the temperature lower than 425° C., the heat treatment time is longer than one hour.

Here, the substrate is put in an electric furnace which is one of heat treatment apparatuses and heat treatment is performed on the oxide semiconductor layers 403 and 453 in a nitrogen atmosphere. In this embodiment, one furnace used in heat treatment is continuously used up to the time when the temperature is lowered from the heat temperature T at which dehydration or dehydrogenation of the oxide semiconductor layers 403 and 453 is performed to the temperature which is enough to prevent reincorporation of water. Specifically, slow cooling is performed in a nitrogen atmosphere up to the time when the temperature becomes lower than the heat temperature T by 100° C. or more. Without being limited to a nitrogen atmosphere, dehydration or dehydrogenation may be performed in a rare gas atmosphere, such as helium, neon, or argon.

Note that in the first heat treatment, it is preferable that water, hydrogen, and the like be not contained in nitrogen or a rare gas such as helium, neon, or argon. Here, it is preferable that the purity of nitrogen or a rare gas such as helium, neon, or argon which is introduced to the heat treatment apparatus be 6N (99.9999%) or more, more preferably 7N (99.99999%) or more.

The oxide semiconductor layers 403 and 453 are each crystallized by the first heat treatment to be a microcrystalline film or a polycrystalline film in some cases. Further, by the first heat treatment, the oxide semiconductor layers 403 and 453 each become an oxygen-deficient oxide semiconductor layer and the carrier concentration is increased to higher than or equal to $1 \times 10^{18}/\text{cm}^3$; that is, resistance of the oxide semiconductor layers 403 and 453 is reduced. In addition, the gate electrode layers 451a and 451b are each crystallized by the first heat treatment to be a microcrystalline film or a polycrystalline film in some cases. For example, in the case where an indium oxide-tin oxide alloy film is used for the gate electrode layers 451a and 451b, the gate electrode layers are easily crystallized by the first heat treatment performed at 450° C. for one hour. However, in the case where an indium oxide-tin oxide alloy film containing silicon oxide is used for the gate electrode layers, crystallization is not easily conducted.

The first heat treatment for the oxide semiconductor layer can be performed before the oxide semiconductor film is processed into the island-shaped oxide semiconductor layers. In that case, the fifth photolithography step is performed after the first heat treatment.

Next, an oxide insulating layer having a light-transmitting property is formed by a sputtering method over the gate insulating layer 402 and the oxide semiconductor layers 403 and 453. Then, a resist mask is formed by a sixth photolithography step, etching is selectively performed to form the oxide insulating layer 426 by an etching step, and then, the resist mask is removed. At this stage, the periphery and side surface of the oxide semiconductor layer 403 and the periphery and side surface of the oxide semiconductor layer 453 overlap with the oxide insulating layer 426. By the sixth photolithography step and the etching step, a contact hole reaching the gate electrode layer 421b and a contact hole reaching the drain electrode layer 455b are also formed (see FIG. 1C).

The oxide insulating layer 426 can be formed to a thickness at least 1 nm or more by a method, as appropriate, which is a method with which impurities such as water, hydrogen, and the like are prevented from entering the oxide insulating layer. In this embodiment, the oxide insulating layer 426 is formed from a silicon oxide film by a sputtering method.

The substrate temperature in film formation may be equal to or higher than room temperature and equal to or lower than 300° C. The substrate temperature in this embodiment is 100° C. The formation of the silicon oxide film by a sputtering method can be performed in a rare gas (typically, argon) atmosphere, an oxygen atmosphere, or an atmosphere of a rare gas (typically, argon) and oxygen.

Moreover, a silicon oxide target or a silicon target can be used as a target. For example, the silicon oxide film can be formed using a silicon target in an atmosphere of oxygen and a rare gas by a sputtering method. The oxide insulating layer formed to be in contact with the low-resistance oxide semiconductor layers 403 and 453, which includes an impurity such as moisture, a hydrogen ion, or OH⁻ as little as possible, is preferably formed from an inorganic insulating film which can block entry of such an impurity from the outside. As a typical inorganic insulating film, a silicon oxide film, a silicon nitride oxide film, an aluminum oxide film, an aluminum oxynitride film or the like can be used.

In this embodiment, film formation is performed by a pulsed DC sputtering method in an oxygen atmosphere (the proportion of oxygen flow: 100%) under conditions where a target is a columnar polycrystalline silicon target doped with boron (resistivity: 0.01 Ωcm, purity: 6N), the distance between the substrate and the target (T–S distance) is 89 mm, the pressure is 0.4 P, and the direct current (DC) power is 6 kW. The thickness is 300 nm.

Next, a metal film is formed over the gate insulating layer 402, the oxide insulating layer 426, and the oxide semiconductor layers 403 and 453. Then, a resist mask is formed by a seventh photolithography step, and by an etching step, the source electrode layer 425a and the drain electrode layer 425b are formed. Further, a connection electrode layer 429 electrically connected to the gate electrode layer 421b and a connection electrode layer 452 electrically connected to the drain electrode layer 455b are also formed.

The metal film can be formed by a sputtering method, a vacuum evaporation method (e.g., an electron beam evaporation method), an arc discharge ion plating method, or a spray method. The metal film is formed using an element selected from Ti, Mo, W, Al, Cr, Cu, and Ta, an alloy containing any of the above elements as its component, an alloy film containing these elements in combination, or the like. In addition, the metal film is not limited to a single layer of the above element but may be a stacked layer including different elements. In this embodiment, the metal film has a three-layer structure of a titanium film (with a thickness of 100 nm), an aluminum film (with a thickness of 200 nm), and a titanium film (with a thickness of 100 nm). Instead of a titanium film, a titanium nitride film may be used.

In the etching step performed after the seventh photolithography step, the metal film which is over and in contact with the oxide semiconductor layers 403 and 453 needs to be selectively removed. In such a case, with use of an alkaline etchant (e.g., an ammonia peroxide mixture (hydrogen peroxide water at 31 wt %:ammonia water at 28 wt %:water=5:2:2)) or the like, the metal film can be selectively removed, so that the oxide semiconductor layers 403 and 453 formed using an In—Ga—Zn—O-based oxide semiconductor can be left.

Note that the resist mask used for formation of the source electrode layer 425a and the drain electrode layer 425b may be formed by an inkjet method. Formation of the resist mask by an inkjet method needs no photomask; thus, manufacturing cost can be reduced.

Next, the oxide insulating layer 427 having a light-transmitting property is formed over the oxide insulating layer 426, the source electrode layer 425a, the drain electrode layer 425b, the connection electrode layer 429, and the connection electrode layer 452 (see FIG. 1D). As the oxide insulating layer 427, a silicon oxide film, a silicon nitride oxide film, an aluminum oxide film, an aluminum oxynitride film, or the like is used. In this embodiment, the oxide insulating layer 427 is formed using a silicon oxide film by a sputtering method.

Next, second heat treatment is performed at a temperature from 200° C. to 400° C. inclusive, preferably 250° C. to 350° C. inclusive in an atmosphere of an inert gas such as a nitrogen gas. For example, the second heat treatment in a nitrogen atmosphere at 250° C. is performed for one hour.

The second heat treatment is performed in such a condition that a part of the oxide semiconductor layer 403 is in contact with the oxide insulating layer 427 and the oxide semiconductor layer 453 is in contact with the oxide insulating layer 426. Therefore, the oxide semiconductor layers 403 and 453, with each of which resistance is reduced by the first heat treatment, are supplied with oxygen from the oxide insulating layers 427 and 426 to be in an oxygen-excess state, so that high-resistance (i-type) oxide semiconductor layers are formed.

Note that in the case where the thickness of the oxide semiconductor layer 403 is smaller than 15 nm, in regions which are included in the oxide semiconductor layer 403 and overlap with the source electrode layer 425a and the drain electrode layer 425b formed from the metal film, oxygen easily moves to the metal film side, and the regions are entirely turned into n-type regions. Alternatively, in the case where the thickness of the oxide semiconductor layer 403 is from 15 nm to 50 nm inclusive, the vicinity of an interface between the metal film and the regions becomes to be in an n-type state, but regions in the oxide semiconductor layer 403 below the n-type region becomes an i-type or n⁻ type region.

Note that although the second heat treatment is performed after formation of the silicon oxide film in this embodiment, the heat treatment can be performed at any time as long as it is performed after formation of the silicon oxide film and the timing of the heat treatment is not limited to a timing immediately after formation of the silicon oxide film.

Next, the protective insulating layer 428 having a light-transmitting property is formed over the oxide insulating layer 427 (see FIG. 1E). As the protective insulating layer 428, a silicon nitride film, a silicon nitride oxide film, an aluminum nitride film, or the like is used. In this embodiment, the protective insulating layer 428 is formed using a silicon nitride film by an RF sputtering method.

Although not illustrated, a light-transmitting planarization insulating layer may be provided between the oxide insulating layer 427 and the protective insulating layer 428 in the pixel portion. The planarization insulating layer can be formed using an organic material having heat resistance such as an acrylic-based resin, polyimide, a benzocyclobutene-based resin, polyamide, or an epoxy-based resin. In addition to such organic materials, a low-dielectric constant material (a low-k material), a siloxane-based resin, PSG (phosphosilicate glass), BPSG (borophosphosilicate glass), or the like can be used. Note that the planarization insulating layer may be formed by stacking a plurality of insulating films formed of these materials.

Through the above steps, the channel-etch type transistor 450 and the bottom-contact type transistor 460 can be formed over one substrate. Note that since in the bottom-contact type transistor 460, components other than the connection electrode layer 452 are formed using light-transmitting materials, the aperture ratio of the transistor 460 can be increased.

A channel-etch type transistor like the transistor 450 can be formed to have a small channel length easily, which is suitable for formation of a transistor like that in a driver circuit, which needs high speed operation. In other words, a display device including channel-etch type transistors can operate at higher speed than a display device in which plural circuits over one substrate are all formed using bottom-contact type transistors like the transistor 460.

Further, a pixel electrode which is necessary for the display device is provided over the protective insulating layer 428 in the pixel portion and electrically connected to the drain electrode layer of the transistor 460. Here, the pixel electrode may be connected to the connection electrode layer 452. Note that, for the pixel electrode, a light-transmitting conductive film can be used, which is similar to that used for the gate electrode layers 451a and 451b, the source electrode layer 455a, and the drain electrode layer 455b.

According to one embodiment of the present invention, in a display device where a driver circuit and a pixel circuit are provided over one substrate, transistors included in the circuits are formed to have structures different between the driver circuit and the pixel circuit in order to obtain electrical characteristics necessary for the respective circuits. As in this embodiment, when the channel-etch type transistor 450 is used for the driver circuit and the bottom-contact transistor 460 is used for the pixel circuit, a display device having excellent display characteristics can be manufactured.

Note that this embodiment can be freely combined with any of the other embodiments.

(Embodiment 2)

In this embodiment, an example of a transistor whose manufacturing process is partly different from that of Embodiment 1 will be described with reference to FIGS. 2A to 2E. FIGS. 2A to 2E are the same as FIGS. 1A to 1E except that there is a difference in part of the process. Therefore, the same portions are denoted by the same reference numerals, and detailed description of the same portions is omitted.

First, in accordance with Embodiment 1, the gate electrode layers 421a and 451a and the gate insulating layer 402 are formed over the substrate, and then the source electrode layer 455a and the drain electrode layer 455b are formed to partly overlap with the gate electrode layer 451a with the gate insulating layer 402 interposed therebetween. Then, an oxide semiconductor film is formed over the gate insulating layer 402, the source electrode layer 455a, and the drain electrode layer 455b.

Then, the oxide semiconductor film is subjected to dehydration or dehydrogenation. First heat treatment for dehydration or dehydrogenation is performed at a temperature higher than or equal to 400° C. and lower than the strain point of the substrate, preferably, 425° C. or higher. Note that in the case of the temperature that is 425° C. or higher, the heat treatment time may be one hour or shorter, whereas in the case of the temperature lower than 425° C., the heat treatment time is longer than one hour. Here, the substrate is put in an electric furnace which is one of heat treatment apparatuses and the oxide semiconductor film is subjected to heat treatment in a nitrogen atmosphere. Then, the oxide semiconductor film is not exposed to air, which prevents reincorporation of water and hydrogen into the oxide semiconductor film. After that, a high-purity oxygen gas, a high-purity $N_2O$ gas, or ultra-dry air (having a dew point of −40° C. or lower, preferably −60° C. or lower) is introduced to the same furnace and cooling is performed. It is preferable that water, hydrogen, and the like be not contained in the oxygen gas or the $N_2O$ gas. Alternatively, the oxygen gas or the $N_2O$ gas, which is introduced into the heat treatment apparatus, preferably has purity of 6N (99.9999%) or higher, further preferably purity of 7N (99.99999%) or higher. In other words, an impurity concentration in the oxygen gas or the $N_2O$ gas is preferably 1 ppm or lower, further preferably 0.1 ppm or lower.

In addition, after the first heat treatment for dehydration or dehydrogenation, heat treatment may be performed at a temperature from 200° C. to 400° C. inclusive, preferably from 200° C. to 300° C. inclusive, in an oxygen gas atmosphere or an $N_2O$ gas atmosphere.

Through the above step, the entire oxide semiconductor film is in an oxygen-excess state, and the oxide semiconductor film can have high resistance: that is, an i-type oxide semiconductor film can be obtained. Note that in this embodiment, an example in which the first heat treatment is performed immediately after formation of the oxide semiconductor film is described; however, the timing when the first heat treatment is performed is not particularly limited as long as it is performed after formation of the oxide semiconductor film.

Next, a resist mask is formed by a photolithography step, and by an etching step, the oxide semiconductor film and the gate insulating layer 402 are selectively etched, so that a contact hole reaching the gate electrode layer 421b is formed. After that, the resist mask is removed (see FIG. 2A).

Next, a resist mask is formed by a photolithography step, and by an etching step, the oxide semiconductor film is selectively etched to be processed into an island shape. By removing the resist mask, oxide semiconductor layers 404 and 405 are provided over the gate insulating layer 402 (see FIG. 2B).

Next, over the gate insulating layer 402 and the oxide semiconductor layers 404 and 405, an oxide insulating layer is formed by a sputtering method. Then, a resist mask is formed by a photolithography step, and by an etching step, the oxide insulating layer 426 is formed. After that, the resist mask is removed. At this stage, a region where the oxide insulating layer 426 overlaps with the oxide semiconductor layer 404 and a region where the oxide insulating layer 426 overlaps with the oxide semiconductor layer 405 are formed. In addition, in this step, a contact hole reaching the gate electrode layer 421b and a contact hole reaching the drain electrode layer 455b are also formed (see FIG. 2C).

The oxide insulating layer is preferably formed from an inorganic insulating film which includes impurity as little as possible, such as moisture, a hydrogen ion, or OH⁻ and blocks entry of these from the outside. Typically, a silicon oxide film, a silicon nitride oxide film, an aluminum oxide film, an aluminum oxynitride film or the like can be used.

Next, a stack of an oxide conductive film and a metal film is formed over the gate insulating layer 402, the oxide insulating layer 426, and the oxide semiconductor layers 404 and 405. With use of a sputtering method, the oxide conductive film and the metal film can be successively formed to have a stacked structure without being exposed to air.

The oxide conductive film preferably contains zinc oxide as its component but no indium oxide. Such an oxide conductive film can be formed using zinc oxide, zinc aluminum oxide, zinc aluminum oxynitride, gallium zinc oxide, or the like. In this embodiment, a zinc oxide film is used.

Further, the metal film can be formed using an element selected from Ti, Mo, W, Al, Cr, Cu, and Ta, an alloy including the above element, an alloy including any of these elements in combination, or the like. The metal film is not limited to a single layer of the above element but may be a stacked layer including elements different from each other. In this embodiment, a stacked layer including three layers of a molybdenum film, an aluminum film, and a molybdenum film.

Next, a resist mask is formed by a photolithography step, and by an etching step, the metal film is selectively etched, so that a source electrode layer 445a, a drain electrode layer 445b, a connection electrode layer 449, and a connection electrode layer 442 are formed. After that, the resist mask is removed.

A resist stripper used for removing the resist mask is an alkaline solution, and in the case where the resist stripper is used, the zinc oxide film is selectively etched with use of the above electrode layers as masks. Thus, an oxide conductive layer 446a in contact with the source electrode layer 445a and an oxide conductive layer 446b in contact with the drain electrode layer 445b are provided.

The etching rate is different between the oxide semiconductor layer and the oxide conductive layer, and therefore, the oxide conductive layer which is on and in contact with the oxide semiconductor layer can be removed by controlling the time of period.

Alternatively, after the metal film is selectively etched, the resist mask is removed by oxygen ashing treatment. Then, the zinc oxide film may be selectively etched by using as masks, the source electrode layer 445a, the drain electrode layer 445b, the connection electrode layer 449, and the connection electrode layer 442.

The oxide conductive layer 446a provided between the source electrode layer 445a and the oxide semiconductor layer 404 serves as a source region, and the oxide conductive layer 446b provided between the drain electrode layer 445b and the oxide semiconductor layer 404 serves as a drain region. Providing the oxide conductive layer 446a and the oxide conductive layer 446b allows reduction of contact resistance between the oxide semiconductor layer 404 and the source and drain electrode layers 445a and 445b. As a result, a transistor in which resistance of the current path is reduced can operate at high speed, and frequency characteristics of a periphery circuit (driver circuit) can be improved.

Molybdenum is a material whose contact resistance with an oxide semiconductor is relatively high. This is because molybdenum is less likely to be oxidized and has a weaker effect of extracting oxygen from the oxide semiconductor layer as compared to titanium, and a contact interface between molybdenum and the oxide semiconductor layer is not changed to have an n-type conductivity. Providing an oxide conductive layer between the oxide semiconductor layer and the metal electrode layer is significantly effective in reduction of contact resistance even in the case of using molybdenum.

Figure 2D:
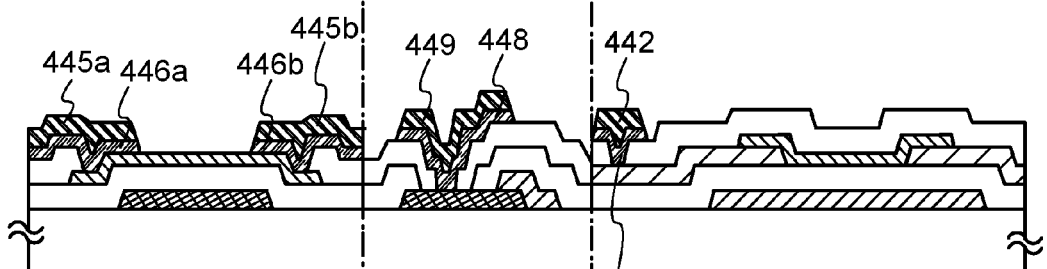

Further, in the same step, an oxide conductive layer 448 in contact with the connection electrode layer 449 and an oxide conductive layer 447 in contact with the connection electrode layer 442 are formed (see FIG. 2D).

Next, in order to reduce variation in electric characteristics of the transistors, second heat treatment may be performed in an inert gas atmosphere such as a nitrogen gas atmosphere. The second heat treatment is preferably performed at equal to or higher than 150° C. and lower than 350° C. For example, heat treatment is performed at 250° C. in a nitrogen atmosphere for one hour.

Note that the second heat treatment causes entry or diffusion of oxygen in the oxide semiconductor layers 404 and 454. By entry or diffusion of oxygen in the oxide semiconductor layers 404 and 454, resistance of channel formation regions can be increased; that is, i-type channel formation regions can be obtained. Therefore, transistors having electric characteristics of normally off can be obtained. In addition, the second heat treatment causes crystallization of the oxide conductive layers 446a, 446b, 447, and 448, and thus conductivity can be increased.

Figure 2E:
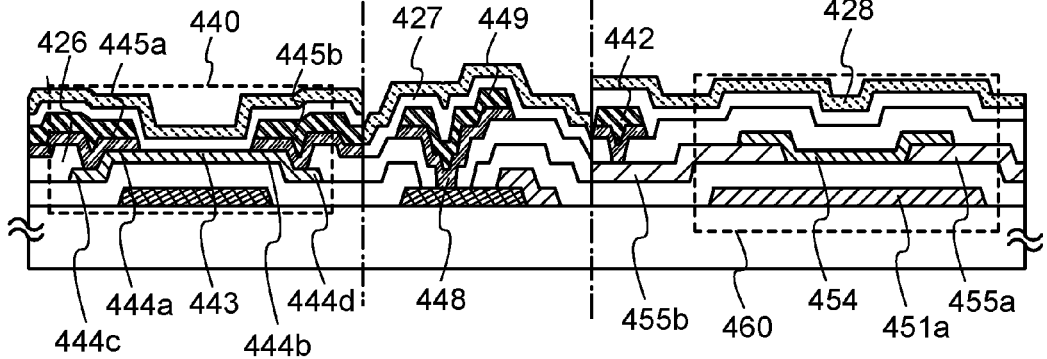

Next, the oxide insulating layer 427 and the protective insulating layer 428 are formed over the oxide insulating layer 426, the source electrode layer 445a, and the drain electrode layer 445b (see FIG. 2E). The oxide insulating layer 427 and the protective insulating layer 428 can be formed using a material and method similar to those of Embodiment 1.

Through the above steps, a transistor 440 and the transistor 460 can be formed over one substrate.

The transistor 440 provided in the driver circuit portion includes over the substrate 400 having an insulating surface, the gate electrode layer 421a, the gate insulating layer 402, the oxide semiconductor layer 404, the oxide conductive layers 446a and 446b, the source electrode layer 445a, and the drain electrode layer 445b. Here, the oxide semiconductor layer 404 has at least a channel formation region 443, a high-resistance source region 444a, and a high-resistance drain region 444b. The oxide insulating layer 427 and the protective insulating layer 428 are provided over the channel formation region 443, the source electrode layer 445a, and the drain electrode layer 445b.

The oxide conductive layer 446a serving as a source region is provided between the high-resistance source region 444a and the source electrode layer 445a, and the oxide conductive layer 446b serving as a drain region is provided between the high-resistance drain region 444b and the drain electrode layer 445b; thus, contact resistance is reduced.

Further, a first region 444c and a second region 444d which are in the oxide semiconductor layer 404 and overlap with the oxide insulating layer 426 are in an oxygen-excess state like the channel formation region 443, and serves to reduce leakage current and also reduce the parasitic capacitance. Note that in the case where the oxide insulating layer 426 does not overlap with the oxide semiconductor layer 404, neither the first region 444c nor the second region 444d are formed in the oxide semiconductor layer 404.

Note that this embodiment can be freely combined with any of the other embodiments.

(Embodiment 3)

In this embodiment, an example in which a liquid crystal display device is manufactured with the active-matrix substrate described in Embodiment 1 or 2 will be described.

Figure 3:
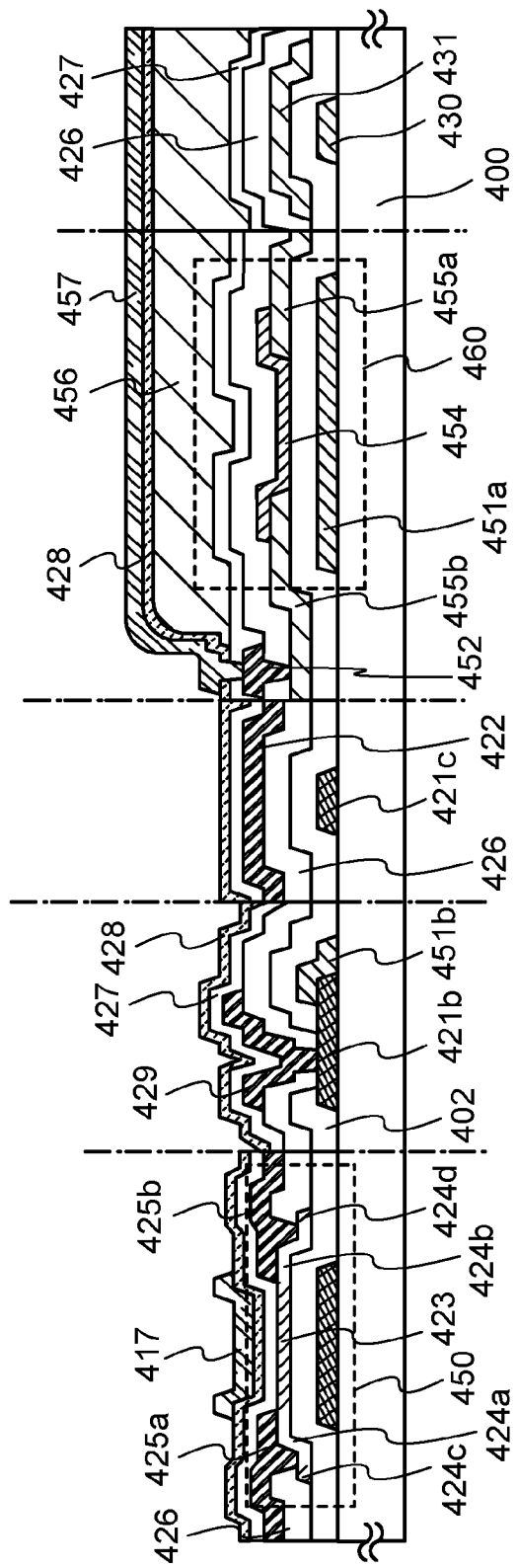
FIG. 3 is a cross-sectional view illustrating one embodiment of the present invention.

FIG. 3 illustrates an example of a cross-sectional structure of an active-matrix substrate.

Embodiments 1 and 2 show the example in which the transistor for the driver circuit portion, the transistor for the pixel portion, and the gate wiring (gate electrode) contact portion are formed over one substrate. In this embodiment, in addition to the above components, a storage capacitor and an intersection of the gate wiring and the source wiring are illustrated and described.

The capacitor, the gate wiring, and the source wiring can be formed in the same manufacturing steps as those in Embodiment 1 or 2, without an increase in the number of photomasks and an increase in the number of steps. Further, in a portion serving as a display region in a pixel portion, the gate wiring, the source wiring, and a capacitor wiring layer are all formed using light-transmitting conductive films, which results in high aperture ratio. Furthermore, a metal wiring can be used for the source wiring layer other than the display region in order to reduce the wiring resistance.

In FIG. 3, the transistor 450 is a transistor provided in a driver circuit portion, and the transistor 460 is a transistor provided in a pixel portion, which is electrically connected to a pixel electrode layer 457.

In this embodiment, the transistor 460 formed over the substrate 400 has the same structure as the transistor 460 in Embodiment 1 or 2.

A capacitor wiring layer 430, which is formed using the same light-transmitting conductive material in the same step as the gate electrode layer 451a of the transistor 460, overlaps with a capacitor electrode 431 with a gate insulating layer 402 serving as a dielectric interposed therebetween, thereby forming the storage capacitor. Note that the capacitor electrode 431 is formed using the same light-transmitting material in the same process as the source electrode layer 455a and the drain electrode layer 455b of the transistor 460. Since the storage capacitor as well as the transistor 460 has a light-transmitting property, the aperture ratio can be increased.

The light-transmitting property of the storage capacitor is important in increasing the aperture ratio. For small liquid crystal display panels of 10 inches or smaller in particular, high aperture ratio can be achieved even when the size of pixels is decreased. Moreover, wide viewing angle is realized by using a light-transmitting film for components in the transistor 460 and the storage capacitor, so that high aperture ratio can be achieved even when one pixel is divided into a plurality of subpixels. For example, when one pixel includes two to four subpixels and a storage capacitor, the storage capacitors have light transmitting properties as well as the transistors, so that the aperture ratio can be increased.

Note that the storage capacitor is provided below the pixel electrode layer 457, and the capacitor electrode 431 is electrically connected to the pixel electrode layer 457.

An example in which the storage capacitor is formed with the capacitor electrode 431, the gate insulating layer 402, and the capacitor wiring layer 430 is described in this embodiment, but there is no particular limitation on the structure forming the storage capacitor. For example, instead of providing the capacitor wiring layer, part of the gate wiring in an adjacent pixel may be used as the capacitor wiring layer. Alternatively, besides the gate insulating layer, an insulating layer included in the pixel portion, such as a protective insulating layer or a planarization insulating layer, may be used as a dielectric.

A plurality of gate wiring layers, source wiring layers, and capacitor wiring layers are provided depending on the pixel density. In the terminal portion, a plurality of first terminal electrodes at the same potential as the gate wiring, a plurality of second terminal electrodes at the same potential as the source wiring, a plurality of third terminal electrodes at the same potential as the capacitor wiring layer, and the like are arranged. There is no particular limitation on the number of each of the terminal electrodes, and the number of the terminal electrodes may be determined by a practitioner as appropriate.

In the gate wiring contact portion, the gate electrode layer 421b can be formed using a low-resistance metal material. The gate electrode layer 421b is electrically connected to the connection electrode layer 429 through a contact hole reaching the gate wiring.

The gate electrode layer of the transistor 450 in the driver circuit portion may be electrically connected to a conductive layer 417 provided above the oxide semiconductor layer.

In a wiring intersection portion, in order to reduce parasitic capacitance, the gate insulating layer 402 and the oxide insulating layer 426 are stacked between a gate wiring layer 421c and a source wiring layer 422 as illustrated in FIG. 3. Note that although the gate wiring layer 421c is formed from a metal film in the case of FIG. 3, the gate wiring layer 421c can be formed using the same light-transmitting conductive film as the gate electrode layer 451a of the transistor 460.

Further, in the case of manufacturing an active-matrix liquid crystal display device, an active-matrix substrate and a counter substrate provided with a counter electrode are bonded to each other with a liquid crystal layer therebetween. A common electrode electrically connected to the counter electrode on the counter substrate is provided over the active-matrix substrate, and a fourth terminal electrode electrically connected to the common electrode is provided in the terminal portion. The fourth terminal electrode is used for setting the common electrode to a fixed potential such as GND or 0 V. The fourth terminal electrode can be formed using the same light-transmitting material as the pixel electrode layer 457.

When the gate electrode, the source electrode, the drain electrode, the pixel electrode, another electrode, and some wiring layers are formed using the same material, the same sputtering target and the same manufacture apparatus can be used. In addition, the material cost and the cost relating to an etchant or an etching gas used in etching can be reduced, which results in reduction in the manufacturing cost.

In the case where a photosensitive resin material is used for the planarization insulating layer 456 in the structure of FIG. 3, the step of formation of a resist mask can be omitted.

Note that this embodiment can be freely combined with any of the other embodiments.

(Embodiment 4)

In this embodiment, an example of a structure of a terminal portion provided over the same substrate as the transistor will be described with reference to FIGS. 4A1 to 4B2. Note that in FIGS. 4A1 to 4B2, components common to FIG. 3 maintain the same reference numerals.

FIGS. 4A1 and 4A2 respectively illustrate a cross-sectional view and a top view of the terminal portion of the gate wiring. FIG. 4A1 is the cross-sectional view taken along line C1-C2 of FIG. 4A2.

In FIG. 4A1, a conductive layer 415 formed over a stack of the oxide insulating layer 427 and the protective insulating layer 428 is a terminal electrode for connection which functions as an input terminal. Furthermore, in a terminal portion of FIG. 4A1, a first terminal 411 formed using the same material as the gate wiring layer 421c and a connection electrode layer 412 formed using the same material as the source wiring layer 422 overlap each other with the gate insulating layer 402 interposed therebetween, and are electrically connected to each other through the transparent conductive layer 415. The conductive layer 415 can be formed using the same light-transmitting material and the same step as the pixel electrode layer 457.

FIGS. 4B1 and 4B2 respectively illustrate a cross-sectional view and a top view of a source wiring terminal portion. FIG. 4B1 is the cross-sectional view taken along line C3-C4 of FIG. 4B2.

In FIG. 4B1, a conductive layer 418 formed over a stack of the oxide insulating layer 427 and the protective insulating layer 428 is the terminal electrode for connection which functions as an input terminal. Further in a terminal portion of FIG. 4B1, an electrode layer 416 formed using the same material as the gate wiring layer 421c is located below and overlapped with a second terminal 414 electrically connected to the source wiring with the gate insulating layer 402 interposed therebetween. The electrode layer 416 is not electrically connected to the second terminal 414, and a capacitor for preventing noise or static electricity can be formed if the potential of the electrode layer 416 is set to a potential different from that of the second terminal 414, such as floating, GND, or 0 V. The second terminal 414 is electrically connected to the conductive layer 418. The conductive layer 418 can be formed using the same light-transmitting material and step as the pixel electrode layer 457.

A plurality of gate wiring layers, source wiring layers, common potential lines, and power supply lines are provided depending on the pixel density. In the terminal portion, a plurality of first terminals at the same potential as the gate wiring, a plurality of second terminals at the same potential as the source wiring, a plurality of third terminals at the same potential as the power supply line, a plurality of fourth terminals at the same potential as the common potential line, and the like are arranged. There is no particular limitation on the number of each of the terminals, and the number of the terminals may be determined by a practitioner as appropriate.

Note that this embodiment can be freely combined with any of the other embodiments.

(Embodiment 5)

In this embodiment, an example of a structure of a liquid-crystal display device and a manufacturing method thereof will be described.

In this embodiment, a display device including a liquid crystal element (also referred to as a liquid crystal display element) is described; however, this embodiment is not limited thereto but can be applied to a display medium such as an electronic ink where contrast is changed by electric operation.

Note that a display device in this specification includes a panel in which the display element is sealed, an integrated circuit (IC) for operating the panel, and the like. In addition, an element substrate provided with the display element includes, per pixel, means which supply current for the display element. Further, the "display device" includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

The appearance and a cross section of a liquid crystal display panel, which is an embodiment of a display device, will be described with reference to FIGS. 5A1, 5A2, and 5B. FIGS. 5A1 and 5A2 are plan views of panels in which transistors 4010 and 4011 and a liquid crystal element 4013 are sealed with a sealant 4005 between a first substrate 4001 and a second substrate 4006. FIG. 5B is a cross-sectional view taken along line M-N of FIGS. 5A1 and 5A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. Further, a signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 5A1 illustrates an example of mounting the signal line driver circuit 4003 by a COG method, and FIG. 5A2 illustrates an example of mounting the signal line driver circuit 4003 by a TAB method.

A plurality of transistors are included in the pixel portion 4002 and the scan line driver circuit 4004, which are formed over the first substrate 4001. FIG. 5B illustrates the transistor 4010 included in the pixel portion 4002 and the transistor 4011 included in the scan line driver circuit 4004. Insulating layers 4041, 4020, and 4021 are provided over the transistors 4010 and 4011.

Any of the high-reliable transistors including the oxide semiconductor layer described in Embodiment 1 or 2 can be used as the transistors 4010 and 4011. As the transistor 4011 for the driver circuit, the transistor 450 described in Embodiment 1 or 2 can be used, and as the transistor 4010 for a pixel, the transistor 460 described in Embodiment 1 or 2 can be used. In this embodiment, the transistors 4010 and 4011 are n-channel transistors.

A conductive layer 4040 is provided over part of the insulating layer 4021, which overlaps with a channel formation region of an oxide semiconductor layer in the transistor 4011 for the driver circuit. The conductive layer 4040 is provided at the position overlapping with the channel formation region of the oxide semiconductor layer, whereby the amount of shift in threshold voltage of the transistor 4011 can be reduced. A potential of the conductive layer 4040 may be the same as or different from that of a gate electrode layer of the transistor 4011. The conductive layer 4040 can also function as a second gate electrode. Alternatively, the potential of the conductive layer 4040 may be GND or 0 V, or the conductive layer 4040 may be in a floating state.

A pixel electrode 4030 included in the liquid crystal element 4013 is electrically connected to the transistor 4010. A counter electrode 4031 of the liquid crystal element 4013 is formed on the second substrate 4006. The liquid crystal element 4013 corresponds to a region where the pixel electrode 4030, the counter electrode 4031, and the liquid crystal layer 4008 overlap with each other. Note that the pixel electrode 4030 and the counter electrode 4031 are respectively provided with an insulating layer 4032 and an insulating layer 4033 each serving as an alignment film.

Note that a light-transmitting substrate can be used as the first substrate 4001 and the second substrate 4006; glass, ceramics, or plastics can be used. As plastic, a fiberglass-reinforced plastics (FRP) plate, a polyvinyl fluoride (PVF) film, a polyester film, or an acrylic resin film can be used.

A columnar spacer 4035 which can be obtained in such a manner that an insulating layer is selectively etched is provided to control a distance (a cell gap) between the pixel electrode 4030 and the counter electrode 4031. Alternatively, a spherical spacer may be used.

The counter electrode 4031 is electrically connected to a common potential line provided over the same substrate as the transistor 4010. With the use of a common connection portion, the counter electrode 4031 can be electrically connected to the common potential line through conductive particles provided between the pair of substrates. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition including a chiral agent at 5 wt % or more so as to improve the temperature range is preferably used for the liquid crystal layer 4008. The liquid crystal composition including liquid crystal exhibiting a blue phase and a chiral agent has a short response time of 1 msec or less and is optically isotropic; therefore, alignment treatment is not necessary and viewing angle dependence is small.

In the transistor 4011, the insulating layer 4041 is formed in contact with the oxide semiconductor layer. The insulating layer 4041 can be formed using a material and method similar to those of the oxide insulating layer 427 described in Embodiment 1, and here a silicon oxide film formed by a sputtering method is used.

The protective insulating layer 4020 is formed over the insulating layer 4041. The protective insulating layer 4020 can be formed using a material and a method which are similar to those of the protective insulating layer 428 described in Embodiment 1. Here as the protective insulating layer 4020, a silicon nitride film formed by a plasma CVD method is used.

The insulating layer 4021 is formed as the planarization insulating layer. As the insulating layer 4021, an organic material having heat resistance such as polyimide, an acrylic-based resin, a benzocyclobutene-based resin, polyamide, or an epoxy-based resin can be used. Other than such an organic material, it is also possible to use a low-dielectric constant material (low-k material), a siloxane-based resin, PSG (phosphosilicate glass), BPSG (borophosphosilicate glass), or the like. Note that the insulating layer 4021 may be formed by stacking a plurality of insulating layers formed of these materials.

Note that the siloxane-based resin corresponds to a resin including a Si—O—Si bond formed using a siloxane-based material as a starting material. A siloxane-based resin may include, as a substituent, an organic group (e.g., an alkyl group or an aryl group) or a fluoro group. In addition, the organic group may include a fluoro group.

A formation method of the insulating layer 4021 is not particularly limited, and the following method can be employed depending on the material: a sputtering method, an SOG method, a spin coating method, a dipping method, a spray coating method, an inkjet method, screen printing, offset printing, or the like. Further, the insulating layer 4021 can be formed with a doctor knife, a roll coater, a curtain coater, a knife coater, or the like. The baking step of the insulating layer 4021 also serves as annealing of the semiconductor layer, whereby the number of steps can be reduced.

The pixel electrode 4030 and the counter electrode 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Alternatively, the pixel electrode 4030 and the counter electrode 4031 can be formed using a conductive composition containing a conductive high molecule (also referred to as a conductive polymer). The pixel electrode formed using the conductive composition preferably has a sheet resistance of less than or equal to 10000 ohms per square and a transmittance of greater than or equal to 70% at a wavelength of 550 nm Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

In addition, a connection terminal electrode 4015 is formed from the same conductive film as the pixel electrode 4030, and a terminal electrode 4016 is formed from the same conductive film as source and drain electrode layers of the transistor 4011.

The connection electrode 4015 is electrically connected to a terminal included in the FPC 4018 through an anisotropic conductive film 4019.

Note that FIGS. 5A1, 5A2, and 5B illustrate an example in which the signal line driver circuit 4003 is formed separately and mounted on the first substrate 4001; however, the present invention is not limited to this structure. The scan line driver circuit may be separately formed and then mounted, or only part of the signal line driver circuit or part of the scan line driver circuit may be separately formed and then mounted.

Figure 6:
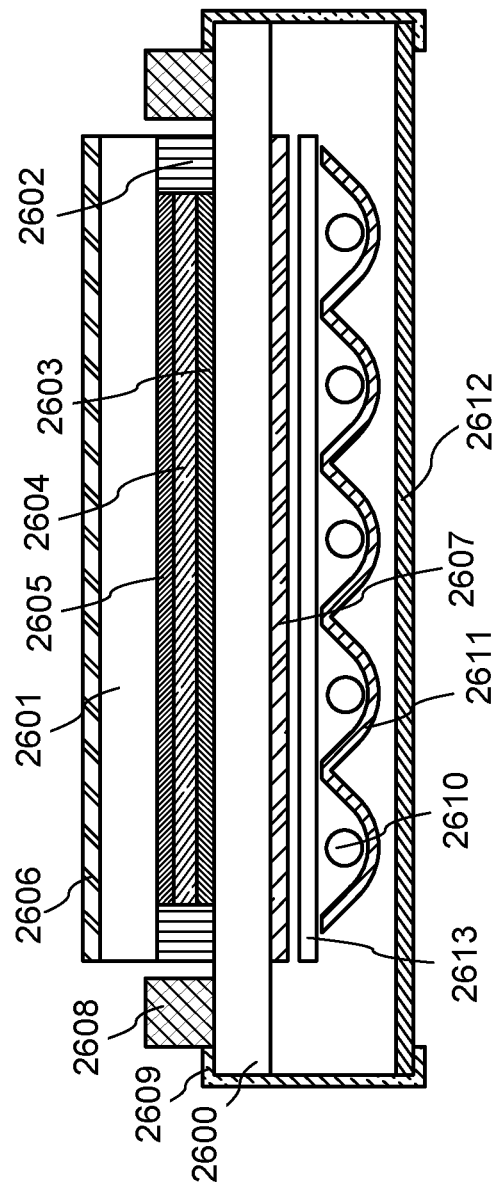
FIG. 6 is a cross-sectional view illustrating one embodiment of the present invention.

FIG. 6 illustrates an example of a liquid crystal display module which is formed as a display device by using a transistor substrate 2600 manufactured according to the manufacturing method disclosed in this specification.

The transistor substrate 2600 and a counter substrate 2601 are fixed to each other with a sealant 2602, and a pixel portion 2603 including a transistor and the like, a display element 2604 including a liquid crystal layer, and a coloring layer 2605 are provided between the substrates to form a display region.

The coloring layer 2605 is necessary to perform color display. In the RGB system, coloring layers corresponding to colors of red, green, and blue are provided for pixels. Polarizing plates 2606 and 2607 and a diffusion plate 2613 are provided outside the transistor substrate 2600 and the counter substrate 2601.

A light source includes a cold-cathode tube 2610 and a reflector 2611. A circuit board 2612 is connected to a wiring circuit portion 2608 of the transistor substrate 2600 by a flexible wiring board 2609 and includes an external circuit such as a control circuit or a power source circuit. A retardation plate may be provided between the polarizing plate and the liquid crystal layer.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Through the above process, a highly reliable liquid crystal display panel as a display device can be manufactured.

Note that this embodiment can be freely combined with any of the other embodiments.

(Embodiment 6)

In this embodiment, an example of operation of a driver circuit and a pixel portion will be described, in which the driver circuit and the pixel portion are formed with transistors which are manufactured over one substrate.

In this embodiment, with use of a manufacturing method of a transistor in accordance with Embodiment 1, a pixel portion and a driver circuit portion are formed over one substrate. Note that the transistors described in Embodiment 1 are n-channel transistors, and the driver circuit portion described here is limited to some circuits that can be constituted by only n-channel TFTs.

Figure 7A:
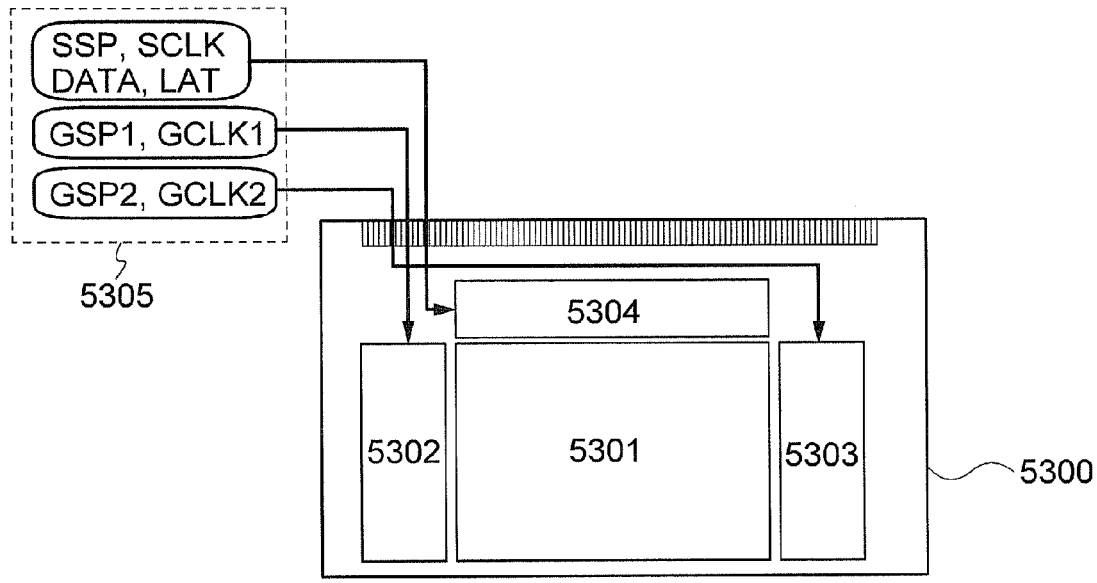
FIGS. 7A and 7B are block diagrams each illustrating a display device.

FIG. 7A illustrates an example of a block diagram of an active-matrix display device. The display device includes a pixel portion 5301, a first scan line driver circuit 5302, a second scan line driver circuit 5303, and a signal line driver circuit 5304 over a substrate 5300. In the pixel portion 5301, a plurality of signal lines extended from the signal line driver circuit 5304 are placed and a plurality of scan lines extended from the first scan line driver circuit 5302 and the second scan line driver circuit 5303 are placed. Note that pixels each including a display element are arranged in matrix in regions where the scan lines and the signal lines intersect with each other. The substrate 5300 of the display device is connected to a timing control circuit 5305 (also referred to as a controller or a control IC) through a connection portion such as an FPC (flexible printed circuit).

In FIG. 7A, the first scan line driver circuit 5302, the second scan line driver circuit 5303, and the signal line driver circuit 5304 are formed over the same substrate 5300 as the pixel portion 5301. Consequently, the number of components of a driver circuit and the like that are externally provided is reduced, so that costs can be reduced. In addition, the number of connection portions (such as FPC) for the substrate 5300 and the external driver circuit can be reduced; thus, reliability and yield can be improved.

The timing control circuit 5305 supplies, for example, a first scan line driver circuit start signal (GSP1) and a scan line driver circuit clock signal (GCLK1) to the first scan line driver circuit 5302. In addition, the timing control circuit 5305 supplies, for example, a second scan line driver circuit start signal (GSP2) (also referred to as a start pulse) and a scan line driver circuit clock signal (GCLK2) to the second scan line driver circuit 5303.

The timing control circuit 5305 supplies a signal line driver circuit start signal (SSP), a signal line driver circuit clock signal (SCLK), video signal data (DATA) (also simply referred to as a video signal), a latch signal (LAT) and the like to the signal line driver circuit 5304. Note that each clock signal may be a plurality of clock signals whose phases are shifted or may be supplied together with an inverted clock signal (CKB) which is obtained by inverting the clock signal. One of the first scan line driver circuit 5302 and the second scan line driver circuit 5303 can be omitted.

Figure 7B:
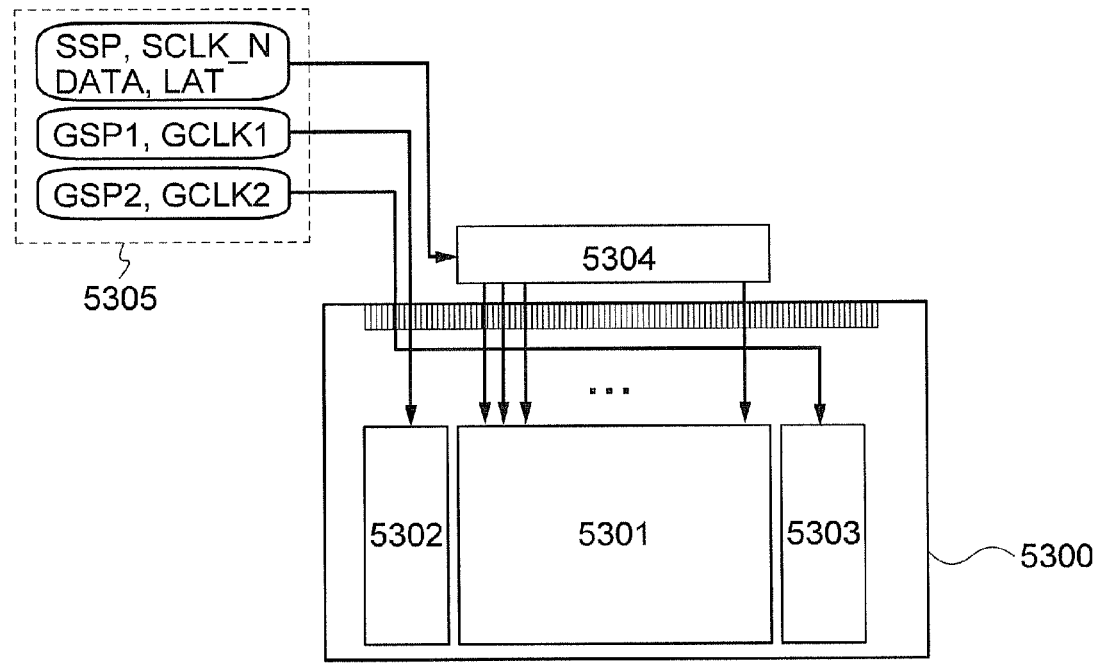

FIG. 7B illustrates a structure in which circuits with low driving frequency (e.g., the first scan line driver circuit 5302 and the second scan line driver circuit 5303) are formed over the same substrate 5300 as the pixel portion 5301 and the signal line driver circuit 5304 is formed over a substrate which is different from the pixel portion 5301. With use of the structure, even when transistors whose electrical field mobility is relatively lower are used, some of the driver circuits can be formed over the same substrate as the pixel portion. Therefore, reduction in cost, improvement in yield, or the like can be achieved.

Next, an example of a structure of a signal line driver circuit including n-channel transistors and operation thereof are described with reference to FIGS. 8A and 8B.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of transistors 5603_1 to 5603_k (k is a natural number). Here, the transistors 5603_1 to 5603_k are n-channel transistors.

A connection relation in the signal line driver circuit is described using the switching circuit 5602_1 as an example. Respective first terminals of the transistors 5603_1 to 5603_k are connected to corresponding wirings 5604_1 to 5604_k. Second terminals of the transistors 5603_1 to 5603_k are connected to signal lines S1 to Sk, respectively. Gates of the transistors 5603_1 to 5603_k are connected to a wiring 5605_1.

The shift register 5601 has a function of sequentially selecting the switching circuits 5602_1 to 5602_N by sequentially outputting H-level signals (also referred to as an H signal or a signal at a high power supply potential level) to wirings 5605_1 to 5605_N.

The switching circuit 5602_1 has a function of controlling conduction states between the wirings 5604_1 to 5604_k and the signal lines S1 to Sk (electrical continuity between the first terminals and the second terminals), that is, a function of controlling whether potentials of the wirings 5604_1 to 5604_k are supplied to the signal lines S1 to Sk. That is, the switching circuit 5602_1 functions as a selector. Further, the transistors 5603_1 to 5603_k have a function of controlling electrical continuity between the wirings 5604_1 to 5604_k and the signal lines S1 to Sk, that is, a function of supplying potentials of the wirings 5604_1 to 5604_k to the signal lines S1 to Sk. Thus, the transistors 5603_1 to 5603_k each function as a switch.

Video signal data (DATA) is input to each of the wirings 5604_1 to 5604_k. The video signal data (DATA) is an analog signal corresponding to image data or image signals in many cases.

Figure 8A:
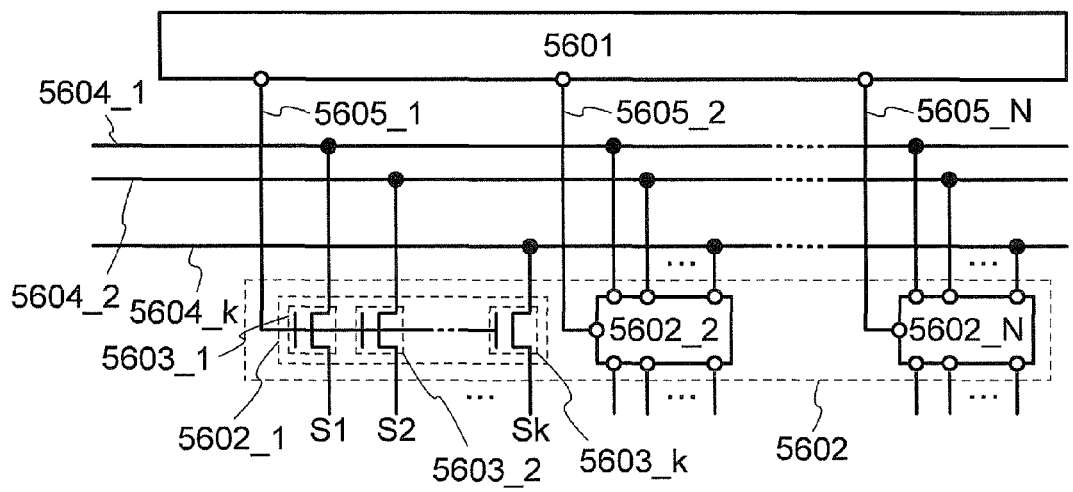
FIG. 8A is a configuration diagram of a signal line driver circuit and FIG. 8B is a timing chart describing operation of the signal line driver circuit.
Figure 8B:
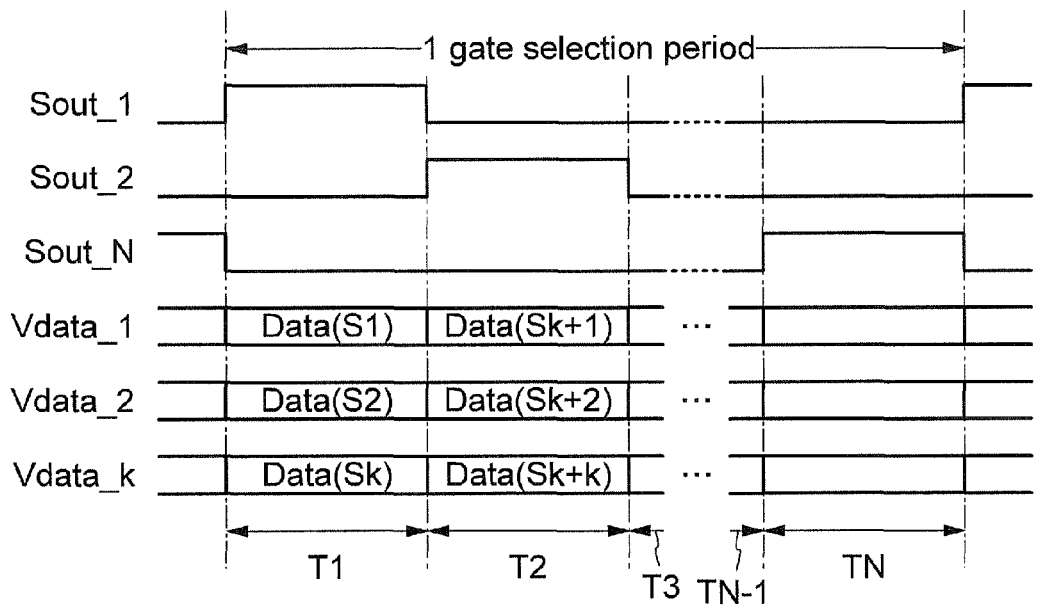

Next, operation of the signal line driver circuit shown in FIG. 8A is described with reference to a timing chart in FIG. 8B. FIG. 8B illustrates examples of signals Sout_1 to Sout_N and signals Vdata_1 to Vdata_k. The signals Sout_1 to Sout_N are examples of output signals from the shift register 5601. The signals Vdata_1 to Vdata_k are examples of signals input to the wirings 5604_1 to 5604_k. Note that one operation period of the signal line driver circuit corresponds to one gate selection period in a display device. For example, one gate selection period is divided into periods T1 to TN. Each of the periods T1 to TN is a period for writing the video signal data (DATA) into a pixel in a selected row.

Note that signal waveform distortion and the like in drawings in this embodiment are exaggerated for simplicity in some cases. Therefore, the present invention is not necessarily limited to such scales illustrated in the drawings.

In the periods T1 to TN, the shift register 5601 sequentially outputs H-level signals to the wirings 5605_1 to 5605_N. For example, in the period T1, the shift register 5601 outputs a high-level signal to the wiring 5605_1. Then, the transistors 5603_1 to 5603_k are turned on, so that the wirings 5604_1 to 5604_k and the signal lines S1 to Sk have electrical continuity. In this case, Data (S1) to Data (Sk) are input to the wirings 5604_1 to 5604_k, respectively. The Data (S1) to Data (Sk) are input to pixels in the first to k-th columns in the selected row through the transistors 5603_1 to 5603_k. In such a manner, in the periods T1 to TN, the video signal data (DATA) are sequentially written into the pixels in the selected row by k columns.

Since the video signal data (DATA) is written to pixels by a plurality of columns as described above, the number of video signal data (DATA) or the number of wirings can be reduced. Consequently, the number of connections with an external circuit can be reduced. Moreover, the time for writing can be extended when video signals are written into pixels by a plurality of columns; thus, insufficient writing of video signals can be prevented.

Note that a circuit including the transistor described in Embodiment 1 or 2 can be used as the shift register 5601 and the switching circuit 5602. In this case, all transistors included in the shift register 5601 can be unipolar transistors.

Described next is constitution of a scan line driver circuit. The scan line driver circuit includes a shift register. Additionally, the scan line driver circuit may include a level shifter, a buffer, and the like in some cases. In the scan line driver circuit, when the clock signal (CLK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can supply a large current is used.

One embodiment of a shift register which is used for part of the scan line driver circuit and/or the signal line driver circuit is described with reference to FIGS. 9A to 9D and FIGS. 10A and 10B.

Figure 9A:
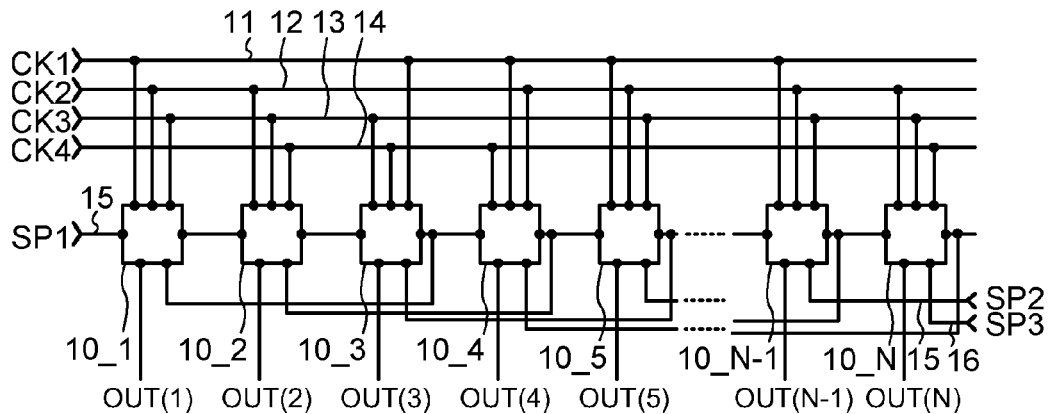
FIGS. 9A to 9D are circuit diagrams showing a configuration of a shift register.

The shift register includes first to Nth pulse output circuits 10_1 to 10_N (N is a natural number greater than or equal to 3) (see FIG. 9A). In the shift register, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to Nth pulse output circuits 10_1 to 10_N.

A start pulse SP 1 (a first start pulse) is input from a fifth wiring 15 to the first pulse output circuit 10_1. To the nth pulse output circuit 10_n of the second or subsequent stage (n is a natural number greater than or equal to 2 and less than or equal to N), a signal from the pulse output circuit of the preceding stage (such a signal is referred to as a preceding-stage signal OUT(n−1)) is input.

To the first pulse output circuit 10_1, a signal from the third pulse output circuit 10_3 of the stage following the next stage is input. Similarly, to the nth pulse output circuit 10_n of the second or its subsequent stage, a signal from the (n+2)th pulse output circuit 10_(n+2) of the stage following the next stage (such a signal is referred to as a subsequent-stage signal OUT(n+2)) is input.

Therefore, the pulse output circuits of the respective stages output first output signals OUT(1)(SR) to OUT(N)(SR) to be input to the pulse output circuit of the subsequent stage and/or the pulse output circuit of the stage before the preceding stage and second output signals OUT(1) to OUT(N) to be input to another circuit or the like. Note that since the subsequent-stage signal OUT(n+2) is not input to the last two stages of the shift register as illustrated in FIG. 9A, a second start pulse SP2 and a third start pulse SP3 may be input to the stage before the last stage and the last stage, respectively, for example.

Note that a clock signal (CK) is a signal whose level alternates between an H-level and an L-level (also referred to as an L signal or a signal at low power supply potential level) at regular intervals. Here, the first clock signal (CK1) to the fourth clock signal (CK4) are each delayed by ¼ cycle sequentially (i.e., they are 90° out of phase with each other). In this embodiment, by using the first to fourth clock signals (CK1) to (CK4), control or the like of driving of a pulse output circuit is performed. Although the clock signal is also represented by GCK or SCK depending on the driver circuit to which the signal is input, CK is used here.

A first input terminal 21, a second input terminal 22, and a third input terminal 23 are electrically connected to any of the first to fourth wirings 11 to 14. For example, in FIG. 9A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In the second pulse output circuit 10_2, the first input terminal 21 is electrically connected to the second wiring 12, the second input terminal 22 is electrically connected to the third wiring 13, and the third input terminal 23 is electrically connected to the fourth wiring 14.

Figure 9B:
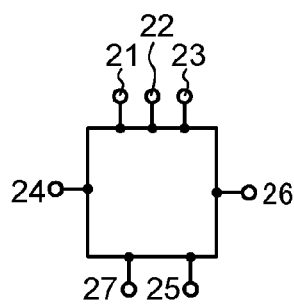

Each of the first to Nth pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 9B).

In the first pulse output circuit 10_1, the first clock signal CK1 is input to the first input terminal 21; the second clock signal CK2 is input to the second input terminal 22; the third clock signal CK3 is input to the third input terminal 23; the start pulse is input to the fourth input terminal 24; the subsequent stage signal OUT (3) is input to the fifth input terminal 25; the first output signal OUT (1) (SR) is output from the first output terminal 26; and the second output signal OUT (1) is output from the second output terminal 27.

Figure 9C:
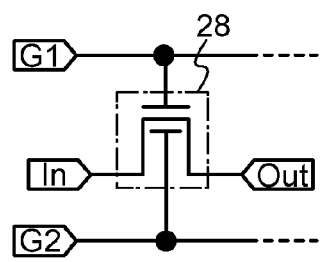

Note that in the first to Nth pulse output circuit 10_1 to 10_N, a transistor 28 with four terminals can be used besides the transistor with three terminals (see FIG. 9C). Note that in this specification, when a transistor includes two gate electrodes with a semiconductor layer therebetween, the gate electrode which is located below the semiconductor layer is also referred to as a lower gate electrode and the gate electrode which is located above the semiconductor layer is also referred to as an upper gate electrode. The transistor 28 is an element which can control electric current between an IN terminal and an OUT terminal with a first control signal G1 which is input to a lower gate electrode and a second control signal G2 which is input to an upper gate electrode.

When an oxide semiconductor is used for a semiconductor layer including a channel formation region in a transistor, the threshold voltage sometimes shifts in a positive or negative direction depending on a manufacturing process. For that reason, the transistor in which an oxide semiconductor is used for a semiconductor layer including a channel formation region preferably has a structure with which the threshold voltage can be controlled. The transistor 28 illustrated in FIG. 9C has a structure in which gate electrodes are provided above and below a channel formation region with a gate insulating film interposed between the upper gate electrode and the channel formation region and with a gate insulating film interposed between the lower gate electrode and the channel formation region, so that the threshold voltage of the transistor 28 can be controlled to be a desired level by controlling a potential of the upper gate electrode and/or the lower gate electrode Next, an example of a specific circuit configuration of the pulse output circuit is described with reference to FIG. 9D.

Figure 9D:
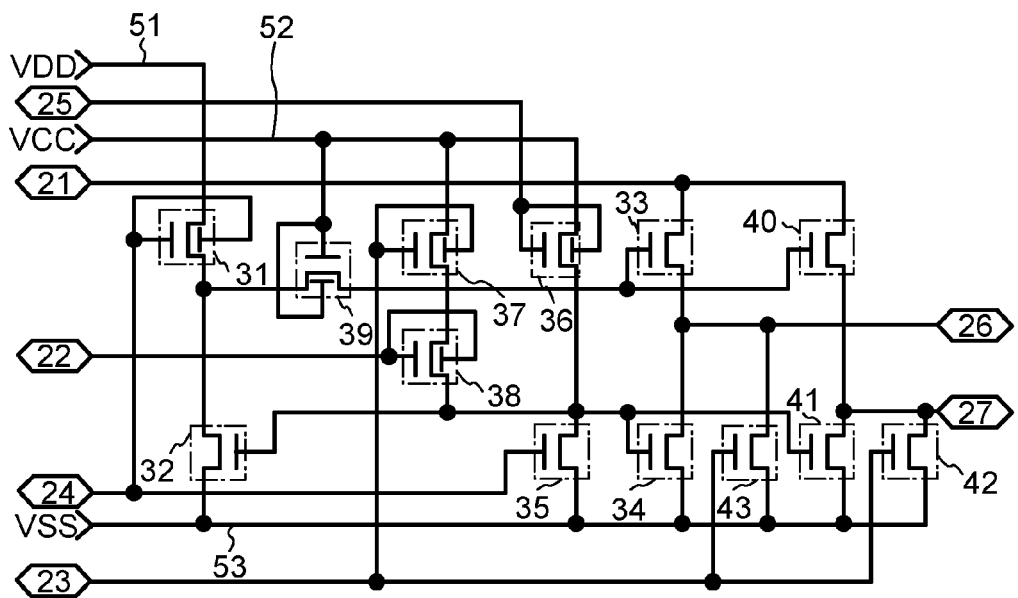

The pulse output circuit illustrated in FIG. 9D includes a first to thirteenth transistors 31 to 43. A signal or a power supply potential is supplied to the first transistor 31 to the thirteenth transistor 43 from a power supply line 51 to which a first high power supply potential VDD is supplied, a power supply line 52 to which a second high power supply potential VCC is supplied, and a power supply line 53 to which a low power supply potential VSS is supplied, in addition to the above-described first input terminal 21 to fifth input terminal 25, the first output terminal 26, and the second output terminal 27, which are described above.

The relation of the power supply potentials of the power supply lines in FIG. 9D is as follows: the first power supply potential VDD is higher than or equal to the second power supply potential VCC, and the second power supply potential VCC is higher than the third power supply potential VSS. The first to fourth clock signals (CK1) to (CK4) are signals which become H-level signals and L-level signals repeatedly at a regular interval. The potential is VDD when the clock signal is at the H-level, and the potential is VSS when the clock signal is at the L-level.

By making the potential VDD of the power supply line 51 higher than the potential VCC of the power supply line 52, a potential applied to a gate electrode of a transistor can be lowered, shift in threshold voltage of the transistor can be reduced, and deterioration of the transistor can be suppressed without an adverse effect on the operation of the transistor.

Note that as in FIG. 9D, the transistor 28 with four terminals which is illustrated in FIG. 9C is preferably used as the first transistor 31 and the sixth to ninth transistors 36 to 39 among the first to thirteenth transistors 31 to 43.

The first transistor 31 and the sixth to ninth transistors 36 to 39 need to switch a potential of a node to which one electrode serving as a source or a drain is connected depending on a control signal of the gate electrode, and are desired to enable a malfunction of the pulse output circuit to be reduced by quick response (sharp rising of on current) to the control signal input to the gate electrode. Thus, by using the transistor 28 with four terminals, the threshold voltage can be controlled, and a malfunction of the pulse output circuit can be further reduced. Note that although the first control signal G1 and the second control signal G2 are the same control signals in FIG. 9D, the first control signal G1 and the second control signal G2 may be different control signals.

In FIG. 9D, a first terminal of the first transistor 31 is electrically connected to the power supply line 51, a second terminal of the first transistor 31 is electrically connected to a first terminal of the ninth transistor 39, and gate electrodes (a lower gate electrode and an upper gate electrode) of the first transistor 31 are electrically connected to the fourth input terminal 24.

A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34.

A first terminal of the third transistor 33 is electrically connected to the first input terminal 21, and a second terminal of the third transistor 33 is electrically connected to the first output terminal 26.

A first terminal of the fourth transistor 34 is electrically connected to the power supply line 53, and a second terminal of the fourth transistor 34 is electrically connected to the first output terminal 26.

A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24.

A first terminal of the sixth transistor 36 is electrically connected to the power supply line 52, a second terminal of the sixth transistor 36 is electrically connected to the gate electrode of the second transistor 32 and the gate electrode of the fourth transistor 34, and gate electrodes (a lower gate electrode and an upper gate electrode) of the sixth transistor 36 are electrically connected to the fifth input terminal 25.

A first terminal of the seventh transistor 37 is electrically connected to the power supply line 52, a second terminal of the seventh transistor 37 is electrically connected to a second terminal of the eighth transistor 38, and gate electrodes (a lower gate electrode and an upper gate electrode) of the seventh transistor 37 are electrically connected to the third input terminal 23.

A first terminal of the eighth transistor 38 is electrically connected to the gate electrode of the second transistor 32 and the gate electrode of the fourth transistor 34, and gate electrodes (a lower gate electrode and an upper gate electrode) of the eighth transistor 38 is electrically connected to the second input terminal 22.

The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and gate electrodes (a lower gate electrode and an upper gate electrode) of the ninth transistor 39 are electrically connected to the power supply line 52.

A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39.

A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34.

A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrodes (the lower gate electrode and the upper gate electrode) of the seventh transistor 37.

A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrodes (the lower gate electrode and the upper gate electrode) of the seventh transistor 37.

In FIG. 9D, a portion where the gate electrode of the third transistor 33, the gate electrode of the tenth transistor 40, and the second terminal of the ninth transistor 39 are connected is referred to as a node A. Further, the portion where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B (see FIG. 10A).

Figure 10A:
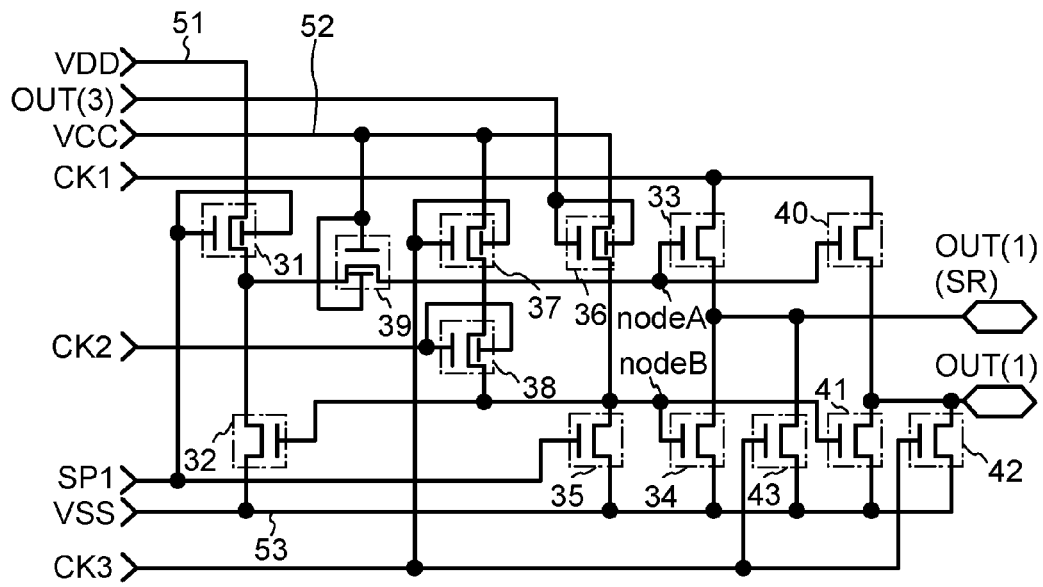
FIG. 10A is a circuit diagram of a shift register and FIG. 10B is a timing chart describing operation of the shift register.

In FIG. 10A, the signals that are input or output to/from the first to fifth input terminals 21 to 25 and the first and second output terminals 26 and 27 in the case where the pulse output circuit illustrated in FIG. 9D is applied to the first pulse output circuit 10_1 are shown.

Specifically, the first clock signal CK1 is input to the first input terminal 21; the second clock signal CK2 is input to the second input terminal 22; the third clock signal CK3 is input to the third input terminal 23; the start pulse is input to the fourth input terminal 24; the subsequent-stage signal OUT(3) is input to the fifth input terminal 25; the first output signal OUT(1)(SR) is output from the first output terminal 26; and the second output signal OUT(1) is output from the second output terminal 27.

Note that a transistor is an element with at least three terminals of a gate, a drain, and a source. The transistor has a channel region between a drain region and a source region, and current can flow through the drain region, the channel region, and the source region. Here, since the source and the drain of the transistor may change depending on the structure, the operating condition, and the like of the transistor, it is difficult to define which is a source or a drain. Therefore, a region functioning as source and drain is not called the source or the drain in some cases. In such a case, one of the source and the drain may be referred to as a first terminal and the other thereof may be referred to as a second terminal, for example.

Note that in FIG. 10A, a capacitor may be provided independently in order to perform bootstrap operation by bringing the node A into a floating state. Furthermore, a capacitor having one electrode electrically connected to the node B may be additionally provided in order to hold a potential of the node B.

Figure 10B:
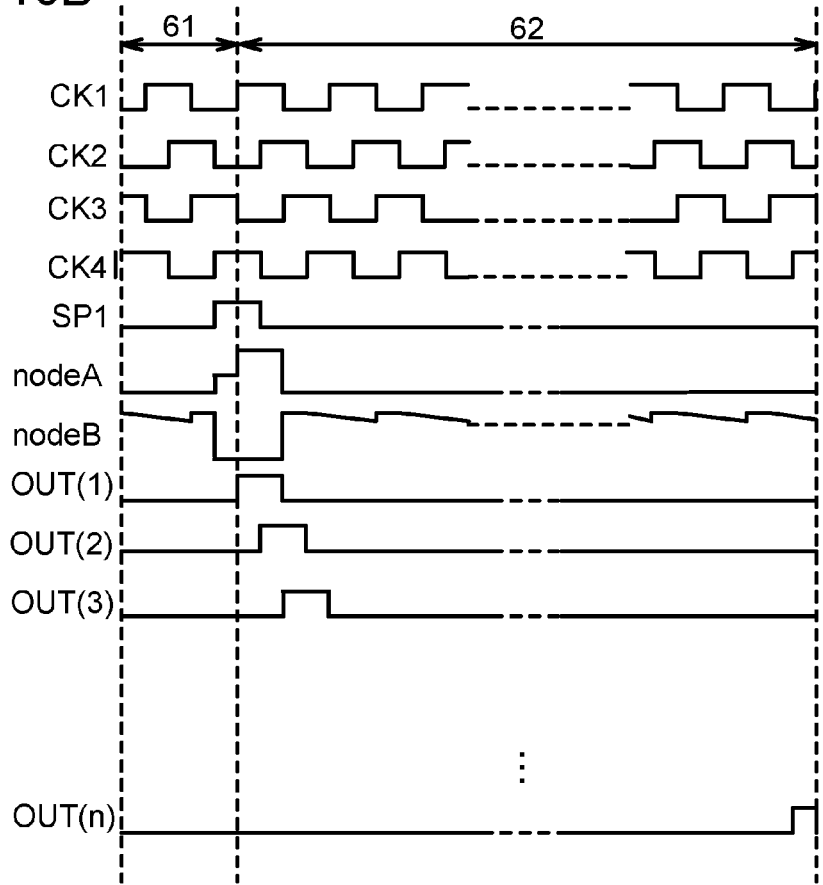

FIG. 10B shows a timing chart of the shift register including a plurality of pulse output circuits shown in FIG. 10A. Note that when the shift register is included in a scan line driver circuit, a period 61 in FIG. 10B corresponds to a vertical retrace period and a period 62 corresponds to a gate selection period.

Note that by providing the ninth transistor 39 in which the second power supply potential VCC is applied to the gate as illustrated in FIG. 10A, the following advantages before and after bootstrap operation are provided.

Without the ninth transistor 39 in which the second power supply potential VCC is applied to the gate electrode, if a potential of the node A is raised by bootstrap operation, a potential of the source which is the second terminal of the first transistor 31 rises to a value higher than the first power supply potential VDD. Then, the source of the first transistor 31 is switched to the first terminal side, that is, on the power supply line 51 side. Consequently, in the first transistor 31, a high bias voltage is applied and thus significant stress is applied between the gate and the source and between the gate and the drain, which might cause deterioration of the transistor.

Therefore, with the ninth transistor 39 in which the second power supply potential VCC is applied to the gate electrode, an increase in potential of the second terminal of the first transistor 31 can be prevented while the potential of the node A is raised by bootstrap operation. In other words, the placement of the ninth transistor 39 can lower the value of a negative bias voltage applied between the gate and the source of the first transistor 31. Thus, the circuit configuration in this embodiment can reduce a negative bias voltage applied between the gate and the source of the first transistor 31, so that deterioration of the first transistor 31 due to stress can be suppressed.

Note that the ninth transistor 39 can be provided anywhere as long as the first terminal and the second terminal of the ninth transistor 39 are connected to the second terminal of the first transistor 31 and the gate of the third transistor 33 respectively. In the case of employing a shift register including a plurality of pulse output circuits of this embodiment, the ninth transistor 39 may be omitted in a signal line driver circuit in which the number of stages is larger than that of a scan line driver circuit, in order to reduce the number of transistors.

When an oxide semiconductor is used for each of the semiconductor layers of the first to thirteenth transistors 31 to 43, the amount of off current of the transistors can be reduced, the amount of on current and field-effect mobility can be increased, and the rate of deterioration can be decreased, whereby malfunctions of the circuit can be reduced. Moreover, the degree of deterioration of the transistor using an oxide semiconductor by application of a high potential to a gate electrode is smaller than that of a transistor using amorphous silicon. Therefore, even when the first power supply potential VDD is supplied to the power supply line to which the second power supply potential VCC is supplied, similar operation can be performed and the number of power supply lines provided between the circuits can be reduced, whereby size reduction in a circuit can be achieved.

Note that a similar function is obtained even when the connection relation is changed so that a clock signal that is supplied to the gate electrodes (the lower gate electrode and the upper gate electrode) of the seventh transistor 37 from the third input terminal 23 and a clock signal that is supplied to the gate electrodes (the lower gate electrode and the upper gate electrode) of the eighth transistor 38 from the second input terminal 22 are supplied from the second input terminal 22 and the third input terminal 23, respectively.

In the shift register shown in FIG. 10A, a state of the seventh transistor 37 and the eighth transistor 38 is changed so that both the seventh transistor 37 and the eighth transistor 38 are on, then the seventh transistor 37 is off and the eighth transistor 38 is on, and then the seventh transistor 37 and the eighth transistor 38 are off; thus, the fall in potential of the node B, which is caused by fall in potentials of the second input terminal 22 (CK2) and the third input terminal 23 (CK3), is caused twice by fall in potential of the gate electrode of the seventh transistor 37 and fall in potential of the gate electrode of the eighth transistor 38.

On the other hand, in the case where a state of the seventh transistor 37 and the eighth transistor 38 in the shift register illustrated in FIG. 10A is changed so that both the seventh transistor 37 and the eighth transistor 38 are on, then the seventh transistor 37 is on and the eighth transistor 38 is off, and then the seventh transistor 37 and the eighth transistor 38 are off; the fall in potential of the node B, which is caused by fall in potentials of the second input terminal 22 (CK2) and the third input terminal 23 (CK3), is caused only once by fall in potential of the gate electrode of the eighth transistor 38.

Therefore, the connection relation, that is, the clock signal CK3 is supplied from the third input terminal 23 to the gate electrodes (the lower electrode and the upper electrode) of the seventh transistor 37 and the clock signal CK2 is supplied from the second input terminal 22 to the gate electrodes (the lower gate electrode and the upper gate electrode) of the eighth transistor 38, is preferable. This is because fluctuation of the potential of the node B can be reduced and noise can be reduced.

In such a manner, an H-level signal is regularly supplied to the node B in a period during which the potentials of the first output terminal 26 and the second output terminal 27 are held at L level; thus, a malfunction of the pulse output circuit can be suppressed.

Note that this embodiment can be freely combined with any of the other embodiments.

(Embodiment 7)

In this embodiment, an example of a liquid crystal display device will be described as one embodiment of a display device with reference to FIGS. 11 to 24, which includes the transistor described in Embodiment 1 or 2 and a liquid crystal element as a display element.

First, a vertical alignment (VA) liquid crystal display device is shown. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. In this embodiment, in particular, a pixel is divided into some regions (for example, two to four subpixels), and molecules are aligned in different directions in their respective regions. This is referred to as multi-domain or multi-domain design. Hereinafter, a liquid crystal display device of multi-domain design is described.

Figure 11:
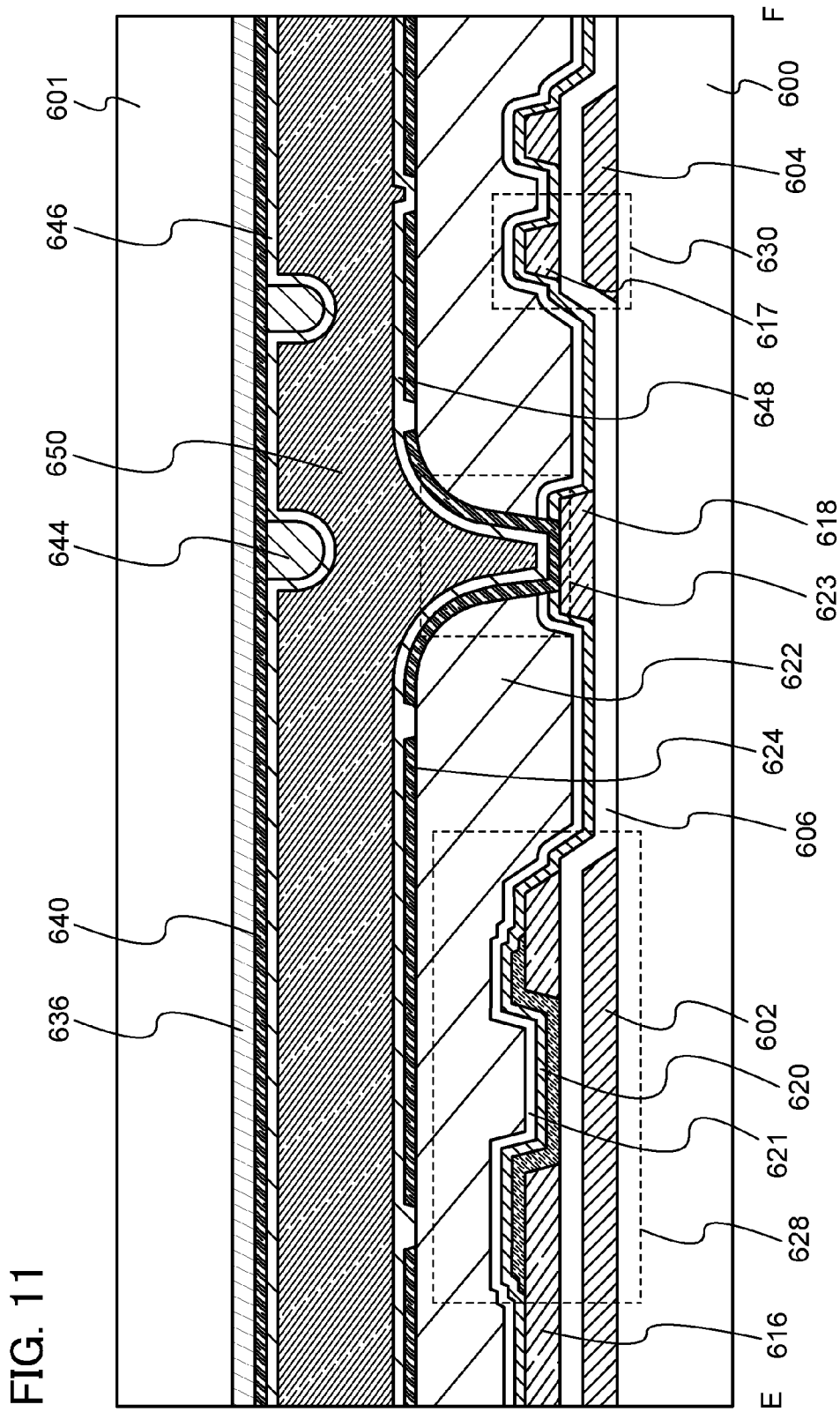
FIG. 11 is a cross-sectional view illustrating a display device.
Figure 12:
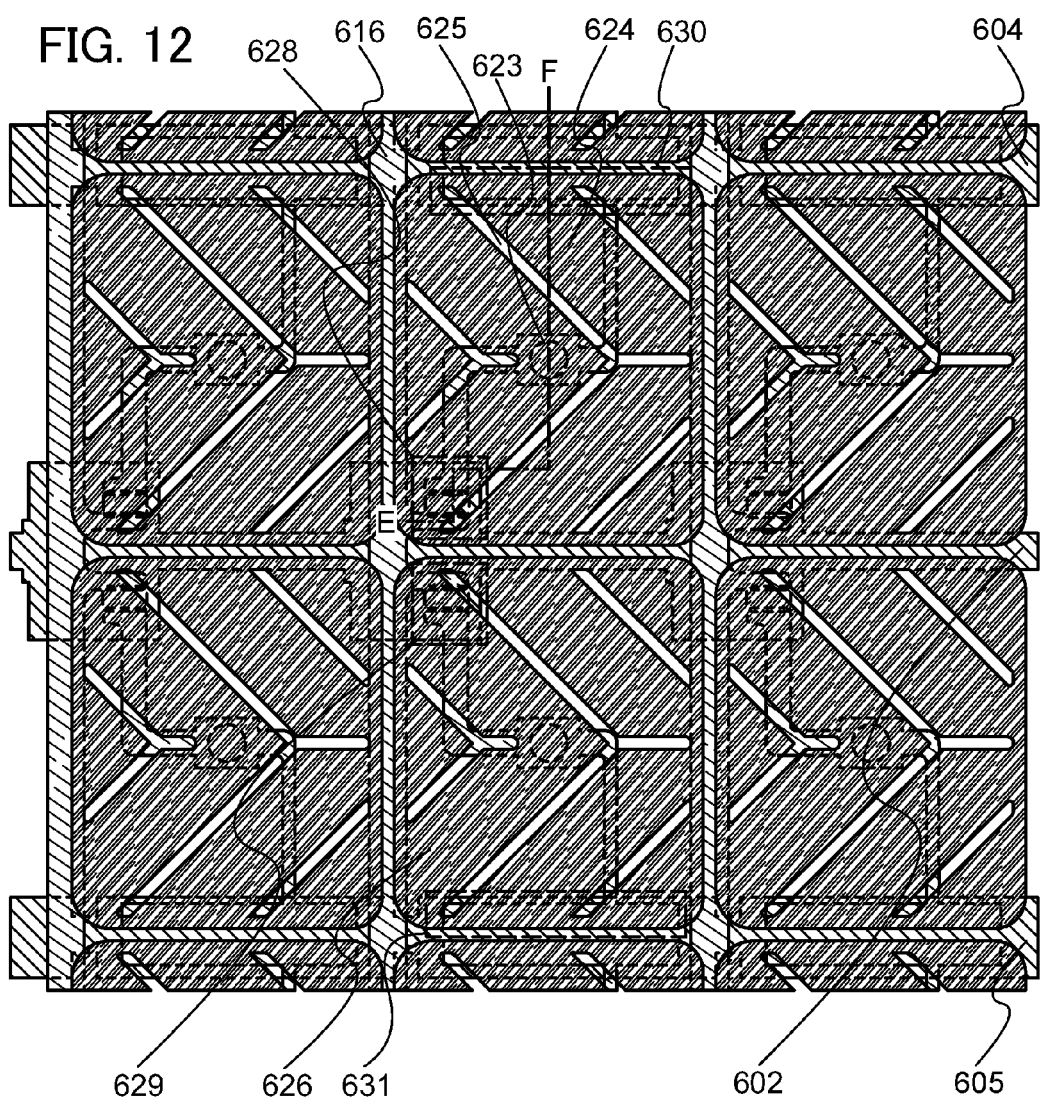
FIG. 12 is a plan view illustrating a display device.
Figure 13:
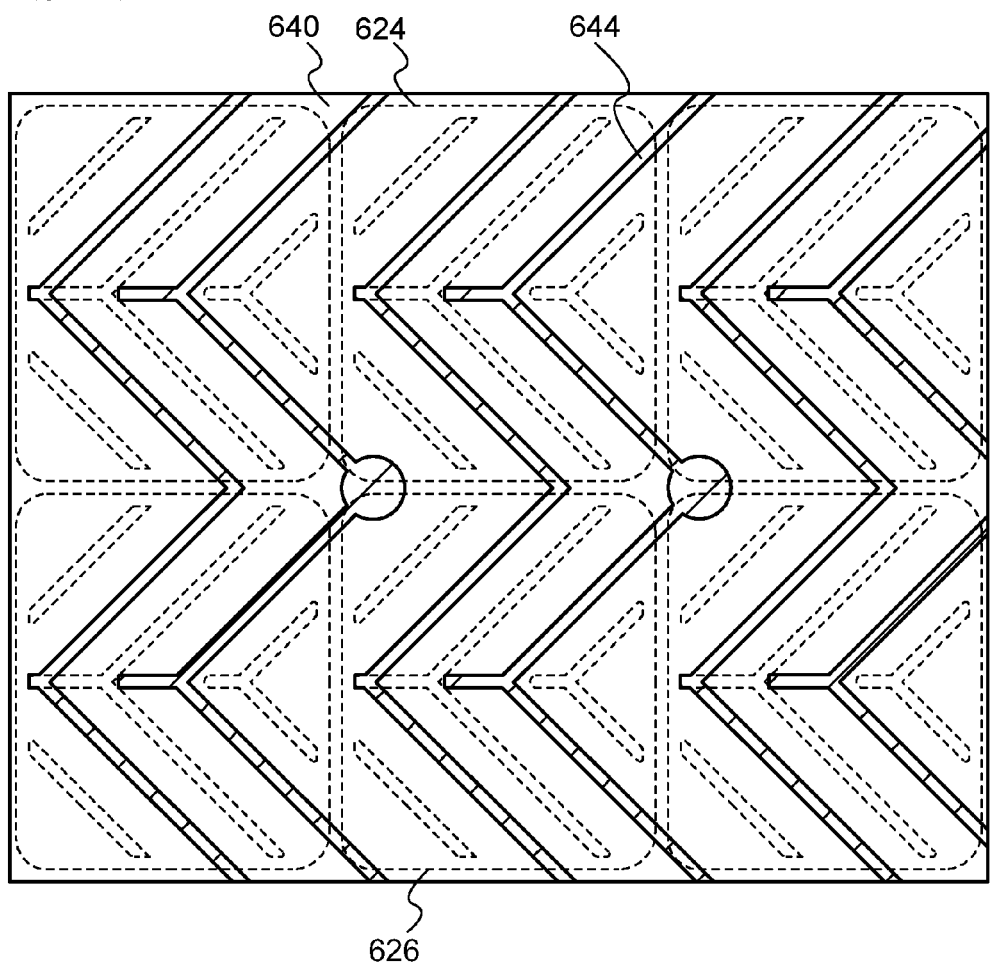
FIG. 13 is a plan view illustrating a display device.

FIGS. 12 and 13 illustrate a pixel electrode and a counter electrode, respectively. Note that FIG. 12 is a plan view illustrating a substrate side where the pixel electrode is formed. FIG. 11 illustrates a cross-sectional structure taken along a section line E-F in FIG. 12. FIG. 13 is a plan view of a substrate side where the counter electrode is formed. Hereinafter, description is made with reference to these drawings.

In FIG. 11, a substrate 600 provided with a transistor 628, a pixel electrode layer 624 connected to the transistor 628, and a storage capacitor portion 630 overlaps with a counter substrate 601 provided with a counter electrode layer 640 and the like, and liquid crystals are injected between both the substrates.

The counter substrate 601 is provided with a coloring film 636 and the counter electrode layer 640, and protrusions 644 are formed on the counter electrode layer 640. An alignment film 648 is formed over the pixel electrode layer 624, and an alignment film 646 is similarly formed on the counter electrode layer 640 and the protrusions 644. A liquid crystal layer 650 is formed between the substrate 600 and the counter substrate 601.

The transistor 628, the pixel electrode layer 624 connected thereto, and the storage capacitor portion 630 are formed over the substrate 600. The pixel electrode layer 624 is connected to a wiring 618 through a contact hole 623 formed in an insulating film 620, an insulating film 621, and an insulating film 622. The transistor described in Embodiment 1 or 2 can be used as the transistor 628 as appropriate. Further, the storage capacitor portion 630 includes a first capacitor wiring 604 which is formed concurrently with a gate wiring 602 of the transistor 628; a gate insulating layer 606; and a second capacitor wiring 617 which is formed concurrently with a wiring 616 and the wiring 618.

The pixel electrode layer 624, the liquid crystal layer 650, and the counter electrode layer 640 overlap with each other, whereby a liquid crystal element is formed.

FIG. 12 illustrates a planar structure over the substrate 600. The pixel electrode layer 624 is formed using the material described in Embodiment 1. The pixel electrode layer 624 is provided with slits 625. The slits 625 are formed to control alignment of the liquid crystals.

A transistor 629, a pixel electrode layer 626 connected thereto, and a storage capacitor portion 631 which are illustrated in FIG. 12 can be formed similarly to the transistor 628, the pixel electrode layer 624, and the storage capacitor portion 630, respectively. Both the transistors 628 and 629 are connected to the wiring 616. One pixel of this liquid crystal display panel includes the pixel electrode layers 624 and 626. That is, the pixel electrode layers 624 and 626 constitute subpixels. Although the pixel includes two subpixels in this embodiment, the pixel can include more than two subpixels.

FIG. 13 illustrates a planar structure of the counter substrate side. The counter electrode layer 640 is preferably formed using a material similar to that of the pixel electrode layer 624. The protrusions 644 which control the alignment of the liquid crystals are formed on the counter electrode layer 640. Note that in FIG. 13, the pixel electrode layers 624 and 626 formed over the substrate 600 are represented by dashed lines, and the counter electrode layer 640 and the pixel electrode layers 624 and 626 overlap with each other.

Figure 14:
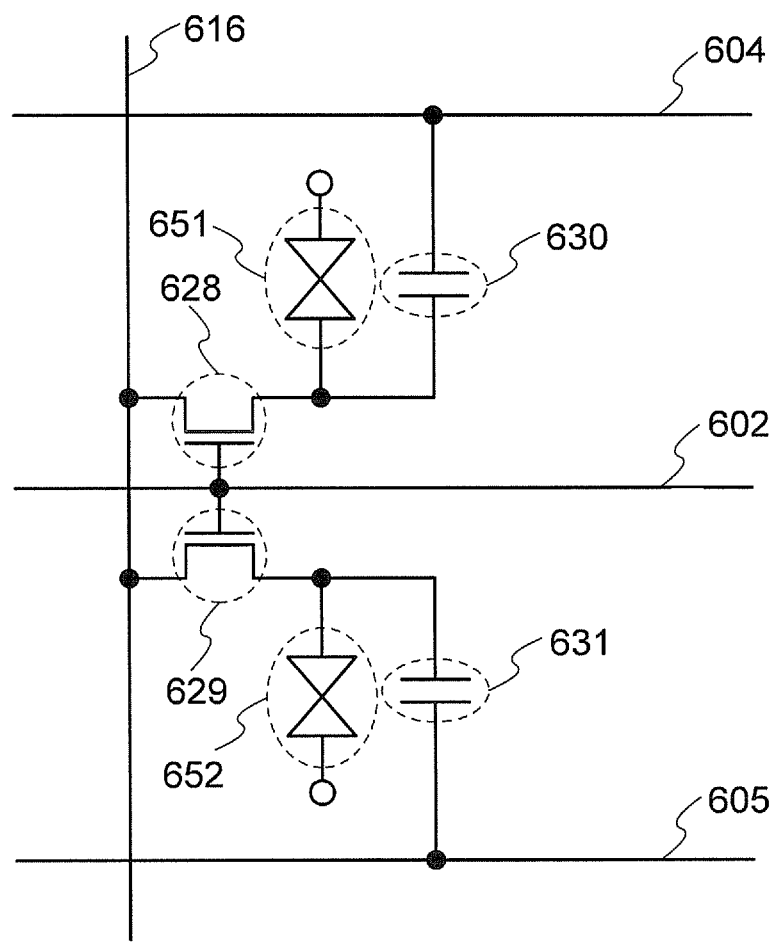
FIG. 14 illustrates an equivalent circuit of a display device.

FIG. 14 shows an equivalent circuit of this pixel structure. Both the transistors 628 and 629 are connected to the gate wiring 602 and the wiring 616. In this case, when potentials of the capacitor wiring 604 and a capacitor wiring 605 are different from each other, operations of liquid crystal elements 651 and 652 can vary. That is, alignment of the liquid crystal is precisely controlled and a viewing angle is increased by individual control of potentials of the capacitor wirings 604 and 605.

When a voltage is applied to the pixel electrode layer 624 provided with the slits 625, a distorted electric field (an oblique electric field) is generated in the vicinity of the slits 625. The slits 625 and the protrusions 644 on the counter substrate 601 side are disposed so as not to overlap with each other, thereby effectively generating the oblique electric field to control alignment of the liquid crystals, and thus the direction in which liquid crystals are aligned is different depending on the location. That is, a viewing angle of the liquid crystal display panel is increased by domain multiplication.

Next, another VA liquid crystal display device, which is different from the above-described device, is described with reference to FIG. 15, FIG. 16, FIG. 17, and FIG. 18.

Figure 15:
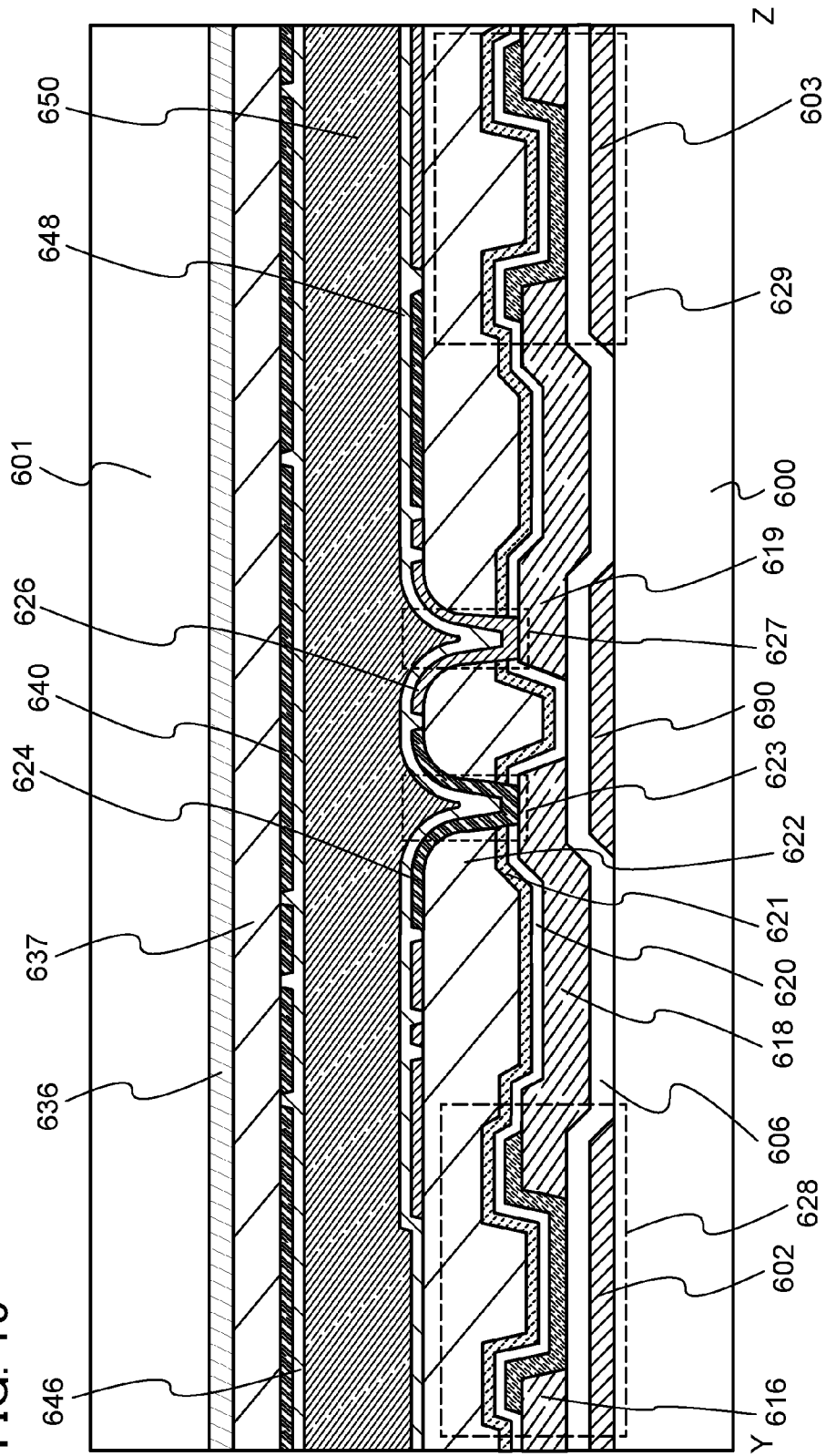
FIG. 15 is a cross-sectional view illustrating a display device.
Figure 16:
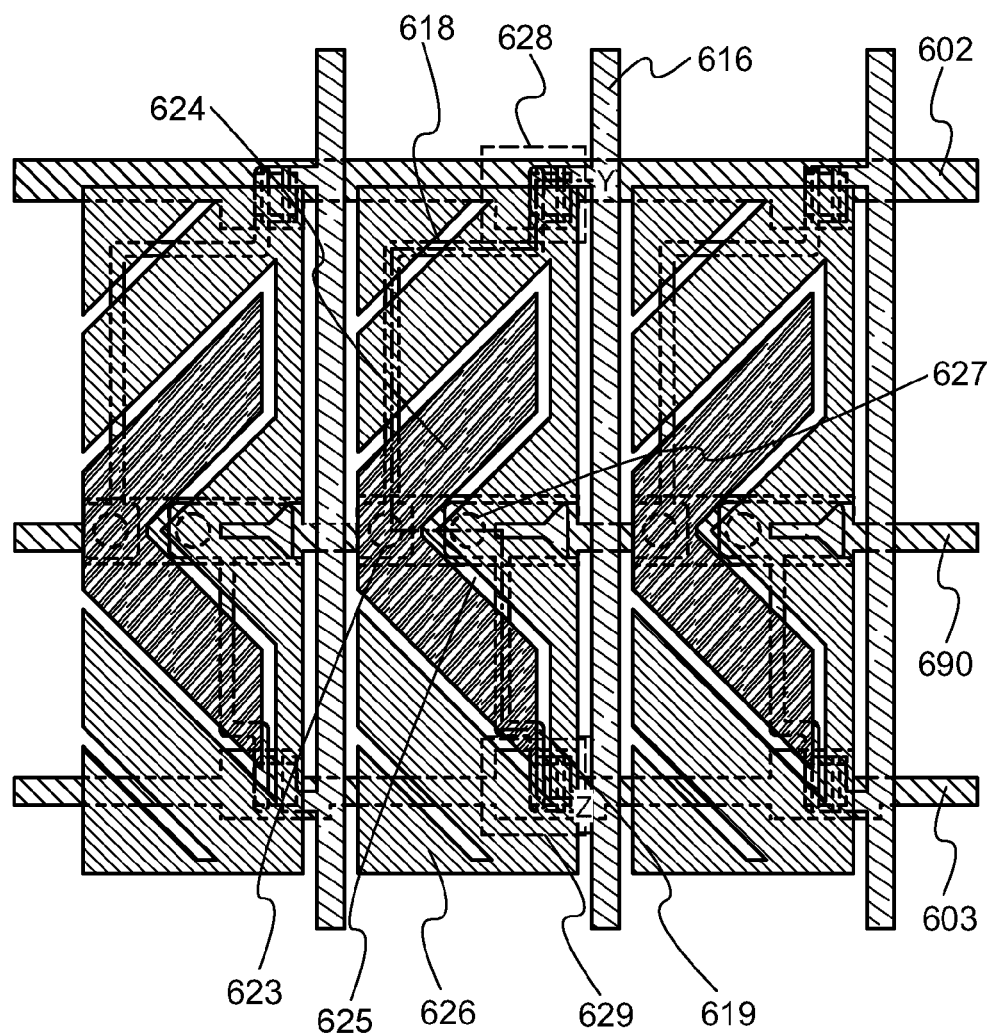
FIG. 16 is a plan view illustrating a display device.

FIG. 15 and FIG. 16 each show a pixel structure of a VA liquid crystal display panel. FIG. 16 is a plane view of the substrate 600. FIG. 15 shows a cross-sectional structure taken along a section line Y-Z in FIG. 16.

In this pixel structure, a plurality of pixel electrodes are included in one pixel, and a transistor is connected to each of the pixel electrodes. The transistors are driven by different gate signals. That is, a multi-domain pixel has a structure in which signals supplied to the respective pixel electrodes are individually controlled.

The pixel electrode layer 624 is connected to the transistor 628 via the wiring 618 in the contact hole 623. Further, in a contact hole 627, the pixel electrode layer 626 is connected to the transistor 629 via a wiring 619.

As each of the transistors 628 and 629, the transistor described in Embodiment 1 or 2 can be used as appropriate. The gate wiring 602 of the transistor 628 and a gate wiring 603 of the transistor 629 are separated so that different gate signals can be given thereto. In contrast, the wiring 616 functioning as a data line is used in common for the transistors 628 and 629. In addition, a capacitor wiring 690 is provided below the wiring 618 and a wiring 619 with the gate insulating layer 606 therebetween.

Figure 18:
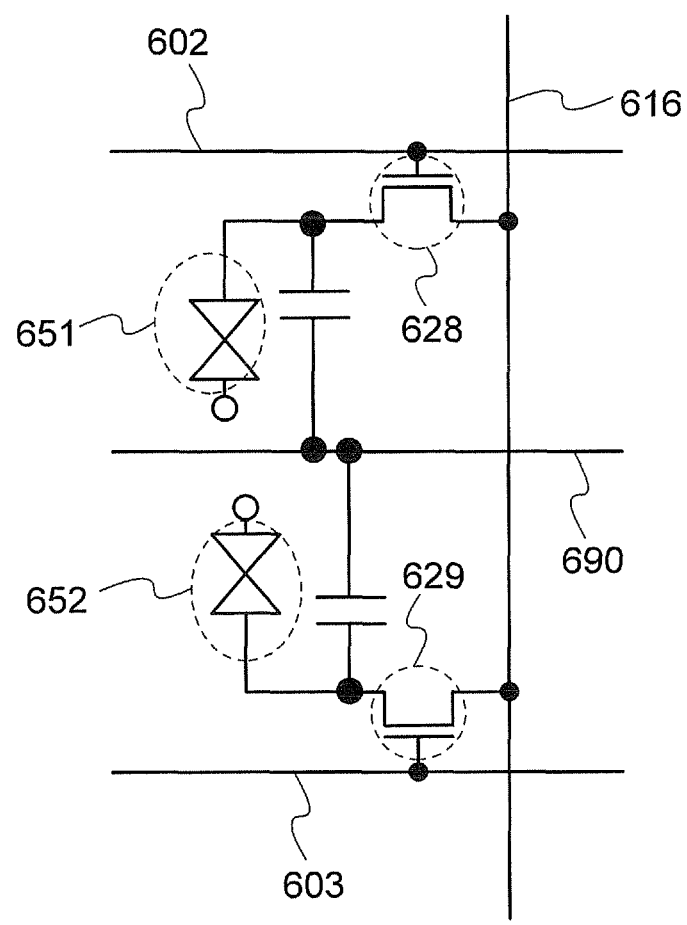
FIG. 18 illustrates an equivalent circuit of a display device.

The shape of the pixel electrode layer 624 is different from that of the pixel electrode layer 626, and the pixel electrode layers are separated by slits 625. The pixel electrode layer 626 is formed so as to surround the external side of the pixel electrode layer 624 which spreads into a V shape. Voltage application is made to vary between the pixel electrode layers 624 and 626 by the transistors 628 and 629, so that alignment of the liquid crystals is controlled. FIG. 18 shows an equivalent circuit of this pixel structure. The transistor 628 is connected to the gate wiring 602, and the transistor 629 is connected to the gate wiring 603. Both the transistors 628 and 629 are connected to the wiring 616. When different gate signals are supplied to the gate wirings 602 and 603, operations of liquid crystal elements 651 and 652 can vary. In other words, when operation of the transistors 628 and 629 is individually controlled, alignment of liquid crystal in the liquid crystal elements 651 and 652 can be precisely controlled; accordingly, viewing angle can be increased.

Figure 17:
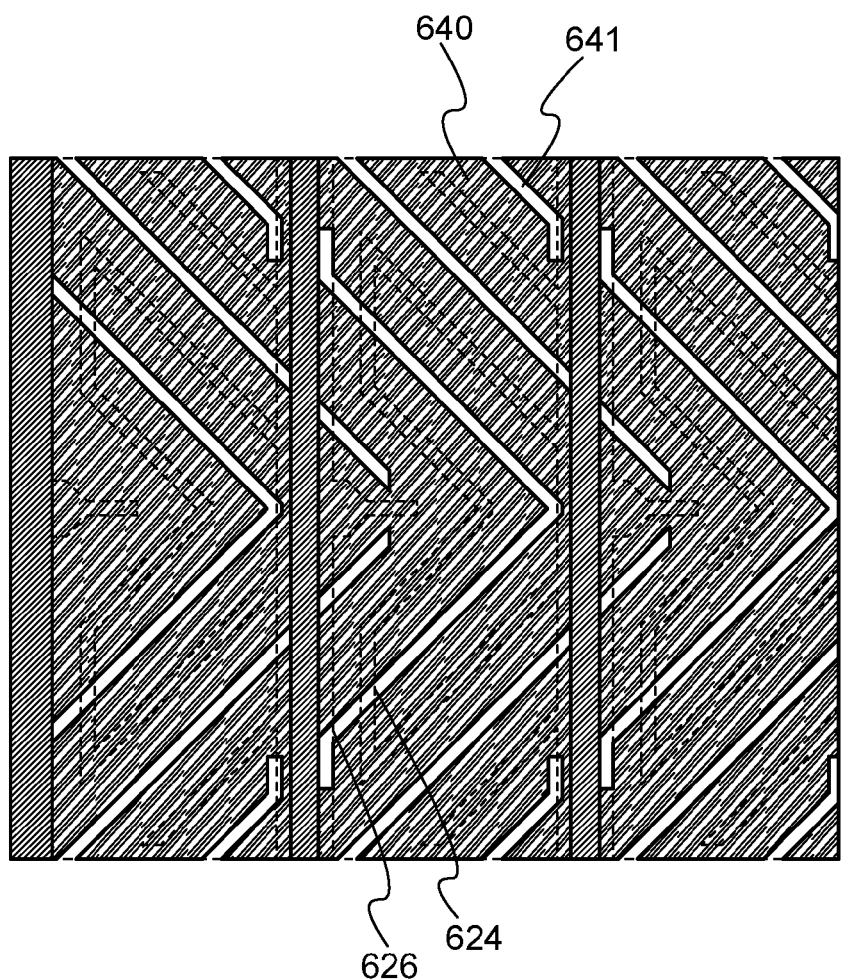
FIG. 17 is a plan view illustrating a display device.

The counter substrate 601 is provided with the coloring film 636 and the counter electrode layer 640. A planarization film 637 is formed between the coloring film 636 and the counter electrode layer 640 to prevent alignment disorder of the liquid crystals. FIG. 17 illustrates a planar structure of the counter substrate side. The counter electrode layer 640 is an electrode shared by different pixels and slits 641 are formed. The slits 641 and the slits 625 on the pixel electrode layer 624 and 626 sides are disposed so as not to overlap with each other so that an oblique electric field is effectively generated, whereby the alignment of the liquid crystals can be controlled. Accordingly, the alignment of the liquid crystals can be varied in different places, so that the viewing angle is widened. Note that in FIG. 17, the pixel electrode layers 624 and 626 formed over the substrate 600 are indicated by dashed lines, and the counter electrode layer 640 and the pixel electrode layers 624 and 626 overlap with each other.

The alignment film 648 is formed over the pixel electrode layer 624 and the pixel electrode layer 626, and similarly, the alignment film 646 is provided on the counter electrode layer 640. A liquid crystal layer 650 is formed between the substrate 600 and the counter substrate 601. The pixel electrode layer 624, the liquid crystal layer 650, and the counter electrode layer 640 overlap with each other to form a first liquid crystal element 651. The pixel electrode layer 626, the liquid crystal layer 650, and the counter electrode layer 640 overlap with each other to form a second liquid crystal element 652. The pixel structure of the display panel illustrated in FIG. 15 to FIG. 18 is a multi-domain structure in which the first liquid crystal element and the second liquid crystal element are provided in one pixel.

Next, a liquid crystal display device in a horizontal electric field mode is shown. In a horizontal electric field mode, an electric field is applied in a horizontal direction with respect to liquid crystal molecules in a cell, whereby liquid crystals are driven to express gray scales. In accordance with this method, a viewing angle can be expanded to about 180°. Hereinafter, a liquid crystal display device in the horizontal electric field mode is described.

Figure 19:
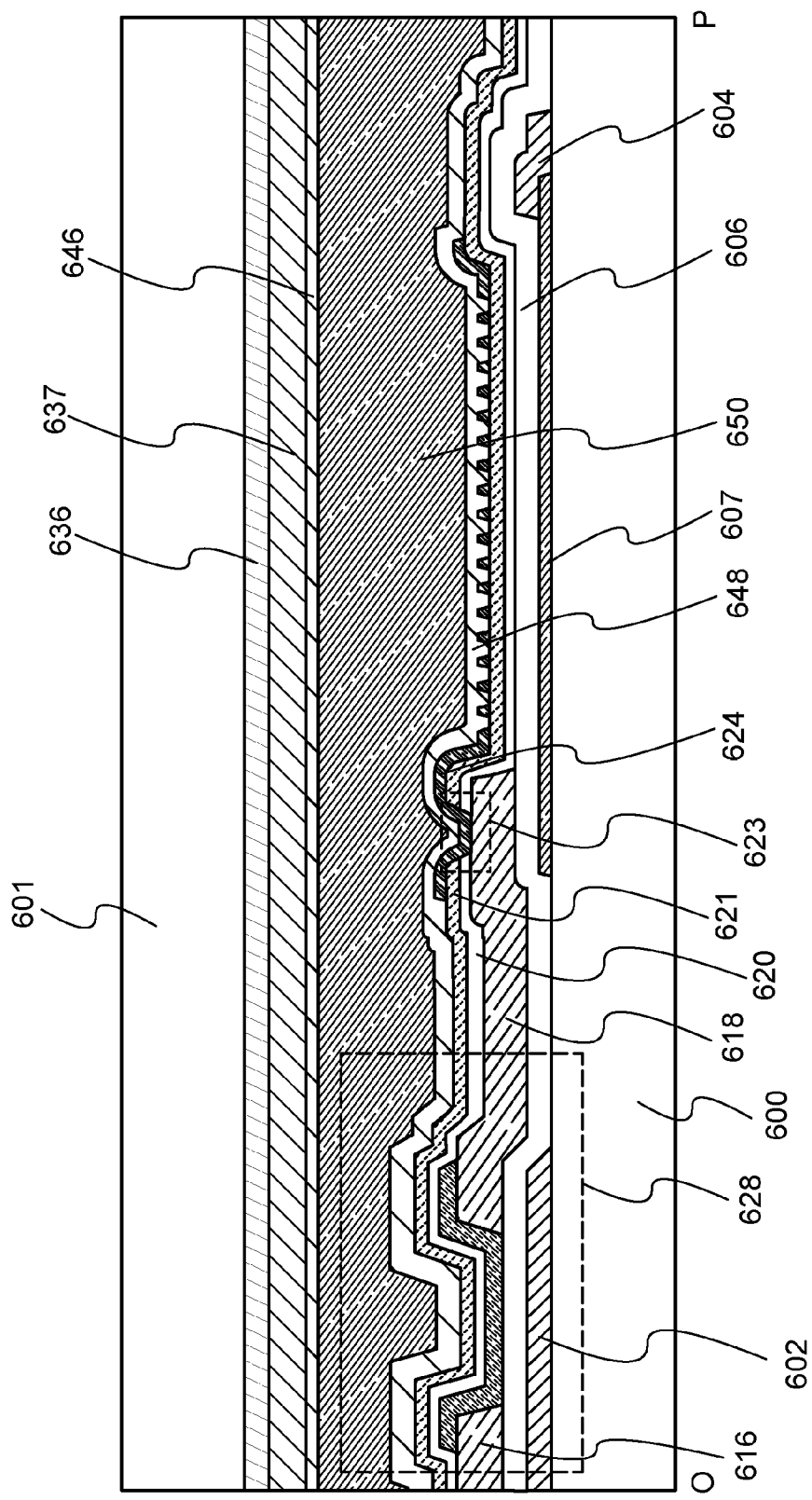
FIG. 19 is a cross-sectional view illustrating a display device.

In FIG. 19, the substrate 600 provided with an electrode layer 607, the transistor 628, and the pixel electrode layer 624 overlaps with the counter substrate 601, and liquid crystals are injected therebetween. The counter substrate 601 is provided with the coloring film 636, the planarization film 637, and the like. The pixel electrode is provided for the substrate 600, and not for the counter substrate 601. In addition, the liquid crystal layer 650 is formed between the substrate 600 and the counter substrate 601, and the alignment film 646 and the alignment film 648 are provided between the liquid crystal layer 650 and the counter substrate 601 and between the liquid crystal layer 650 and the substrate 600.

The electrode layer 607 and the capacitor wiring 604 connected to the electrode layer 607, and the transistor 628 are formed over the substrate 600. The capacitor wiring 604 can be formed concurrently with the gate wiring 602 of the transistor 628. The transistor described in any of Embodiments 1 to 5 can be used as the transistor 628. The electrode layer 607 can be formed using a material similar to that of the pixel electrode layer described in Embodiments 1 or 2. The electrode layer 607 is divided almost in a pixel form. Note that the gate insulating layer 606 is formed over the electrode layer 607 and the capacitor wiring 604.

The wirings 616 and 618 of the transistor 628 are formed over the gate insulating layer 606. The wiring 616 is a data line through which a video signal travels, extends in one direction in a liquid crystal display panel, is connected to a source or drain region of the transistor 628, and functions as one of source and drain electrodes. The wiring 618 functions as the other of the source and drain electrodes and is connected to the pixel electrode layer 624.

The insulating film 620 and the insulating film 621 are formed over the wirings 616 and 618. Over the insulating film 621, the pixel electrode layer 624 is formed to be connected to the wiring 618 through a contact hole 623 formed in the insulating film 620 and the insulating film 621. The pixel electrode layer 624 can be formed using a material similar to that of the pixel electrode layer 457 described in Embodiment 3.

Thus, the transistor 628 and the pixel electrode layer 624 connected thereto are formed over the substrate 600. Note that a storage capacitor is formed with the electrode layer 607 and the pixel electrode layer 624.

Figure 20:
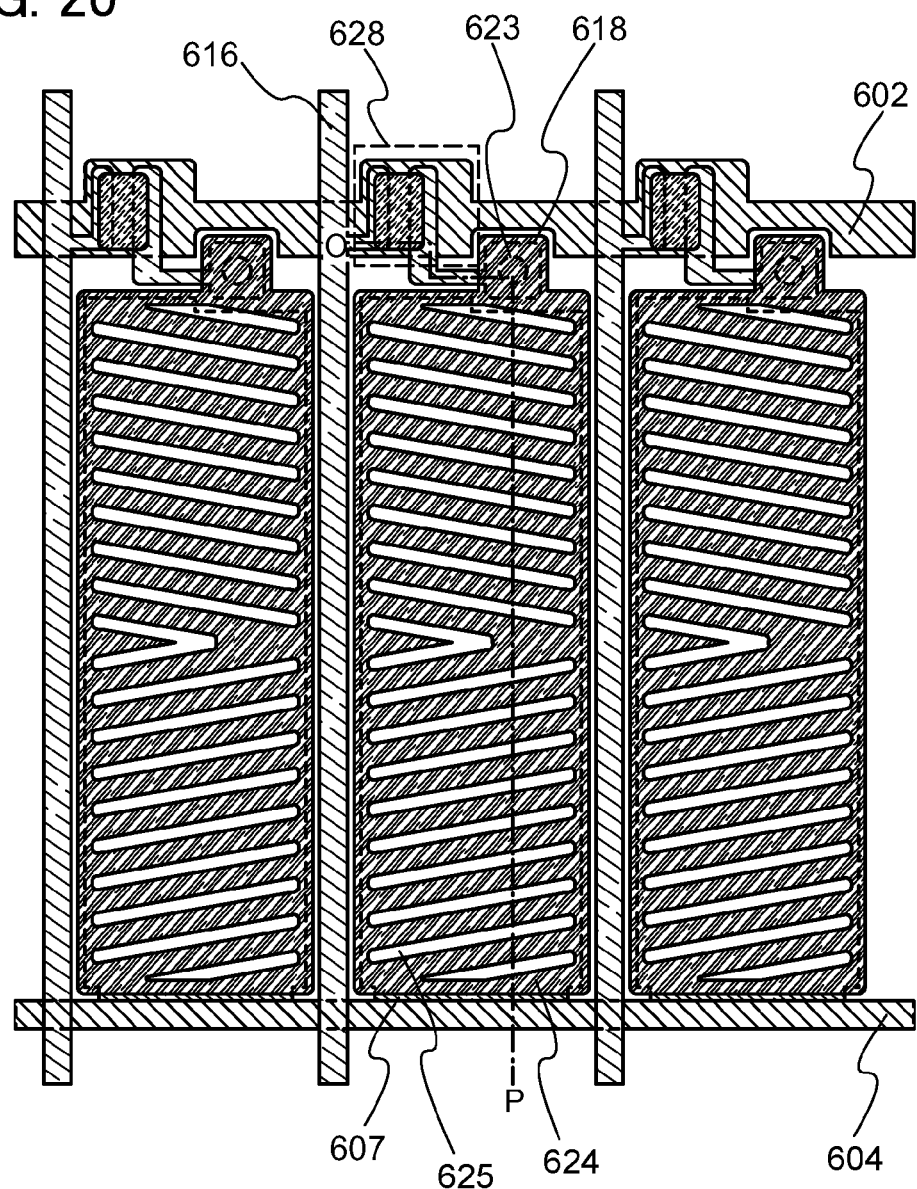
FIG. 20 is a plan view illustrating a display device.

FIG. 20 is a plan view illustrating a structure of the pixel electrode. FIG. 19 illustrates a cross-sectional structure taken along a section line O-P in FIG. 20. The pixel electrode layer 624 is provided with slits 625. The slits 625 are provided for controlling alignment of liquid crystals.

In that case, an electric field is generated between the electrode layer 607 and the pixel electrode layer 624. The thickness of the gate insulating layer 606 formed between the electrode layer 607 and the pixel electrode layer 624 is 50 nm to 200 nm, which is much smaller than the thickness of the liquid crystal layer of 2 μm to 10 μm. Thus, an electric field is generated substantially in parallel (in a horizontal direction) to the substrate 600. By this electric field, alignment of the liquid crystal is controlled, and liquid crystal molecules are horizontally rotated with use of the electric field in the direction almost parallel to the substrate. In this case, since the liquid crystal molecules are parallel to the substrate in any state, contrast is less affected by change in angle of viewing, and a viewing angle is increased. In addition, since both the electrode layer 607 and the pixel electrode layer 624 are light-transmitting electrodes, an aperture ratio can be improved.

Next, a different example of a liquid crystal display device in a horizontal electric field mode is shown.

Figure 21:
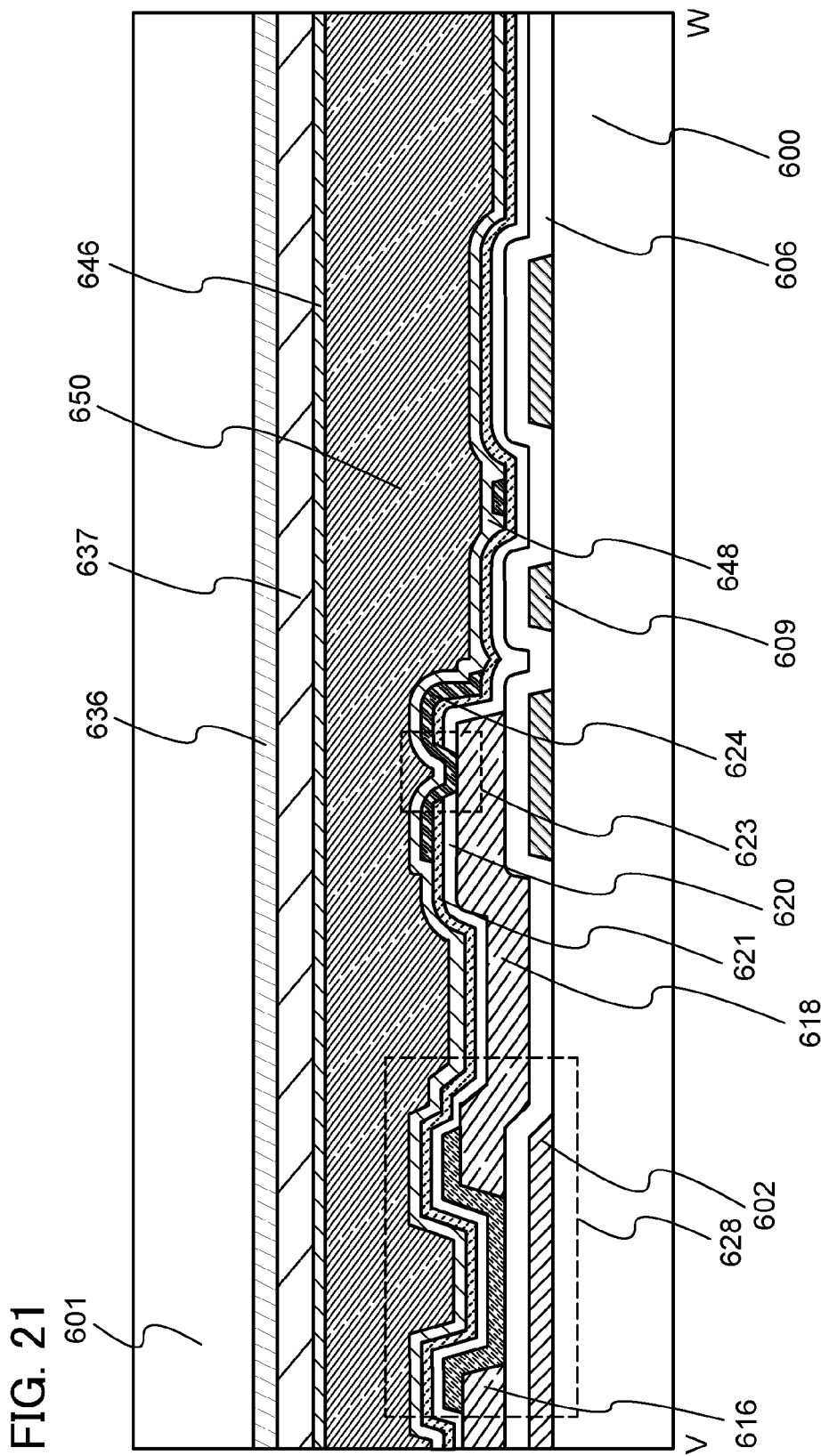
FIG. 21 is a cross-sectional view illustrating a display device.
Figure 22:
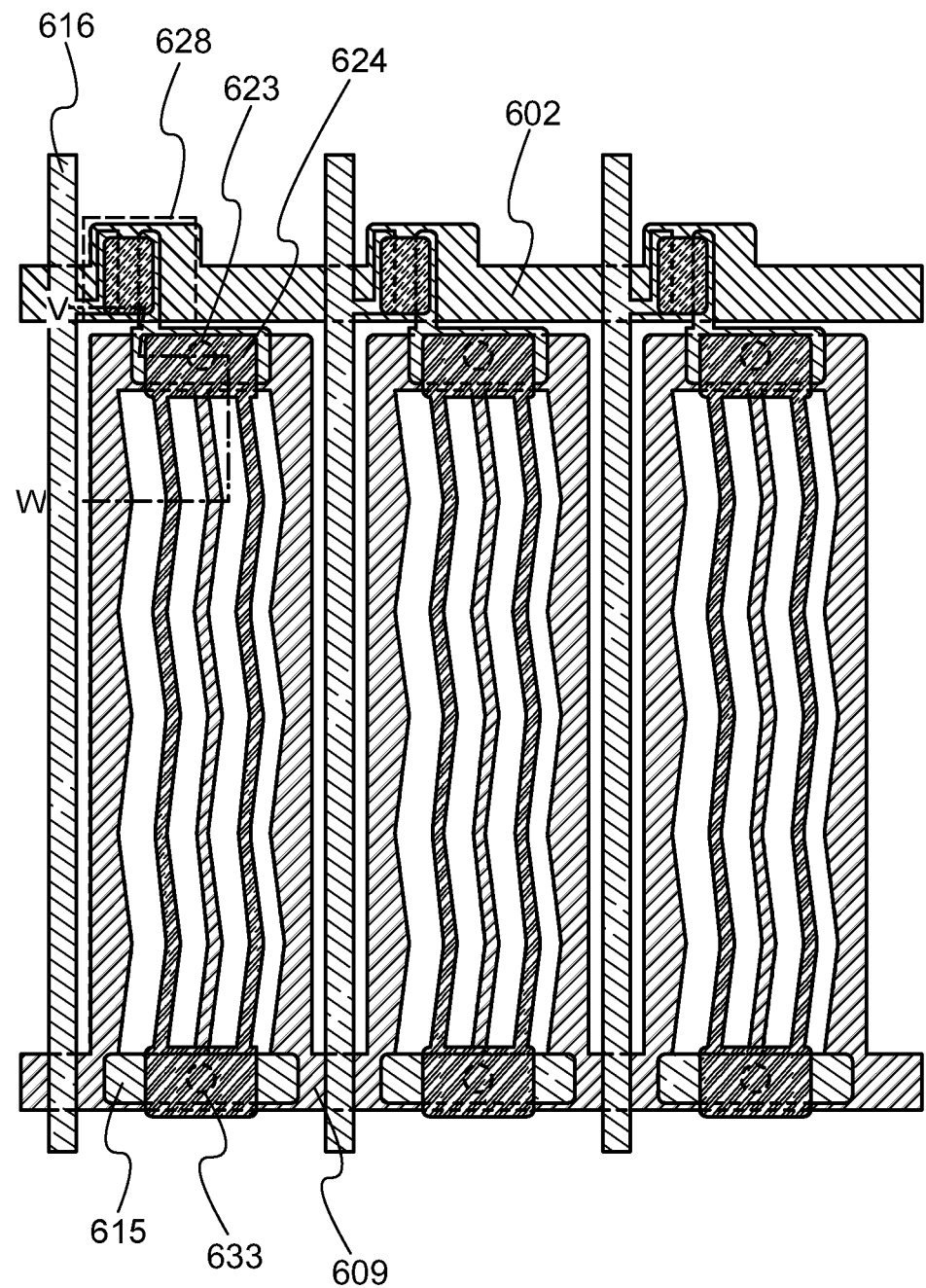
FIG. 22 is a plan view illustrating a display device.

FIGS. 21 and 22 each illustrate a pixel structure of an IPS liquid crystal display device. FIG. 22 is a plan view. FIG. 21 illustrates a cross-sectional structure taken along a section line V-W in FIG. 22.

In FIG. 21, the substrate 600 provided with the transistor 628 and the pixel electrode layer 624 connected thereto overlaps with the counter substrate 601, and liquid crystals are injected therebetween. The counter substrate 601 is provided with the coloring film 636, the planarization film 637, and the like. Note that a counter electrode is not provided on the counter substrate 601 side. In addition, the liquid crystal layer 650 is formed between the substrate 600 and the counter substrate 601, and the alignment film 646 and the alignment film 648 are provided between the liquid crystal layer 650 and the counter substrate 601 and between the liquid crystal layer 650 and the substrate 600.

A common potential line 609 and the transistor 628 are formed over the substrate 600. The common potential line 609 can be formed concurrently with the gate wiring 602 of the transistor 628. Note that the transistor described in Embodiment 1 or 2 can be used for the transistor 628.

The wirings 616 and 618 of the transistor 628 are formed over the gate insulating layer 606. The wiring 616 is a data line which supplies data signals in the liquid crystal display panel, connected to a source region or a drain region of the transistor 628, and functions as one of source and drain electrodes. The wiring 618 is a wiring connected to the pixel electrode layer 624 and functions as the other electrode of the transistor 628.

The insulating films 620 and 621 are formed over the wirings 616 and 618. Over the insulating film 620 and the insulating film 621, the pixel electrode layer 624 which is connected to the wiring 618 through the contact hole 623 formed in the insulating film 620 and the insulating film 621 is formed. The pixel electrode layer 624 can be formed using a material similar to that of the pixel electrode layer 457 described in Embodiment 3. Note that, as illustrated in FIG. 22, the pixel electrode layer 624 is formed such that a horizontal electric field is formed between the pixel electrode layer 624 and a comb-like electrode that is formed at the same time as the common potential line 609. Further, a comb-like portion of the pixel electrode layer 624 and the comb-like electrode that is formed at the same time as the common potential line 609 are disposed so as not to overlap with each other.

The alignment of the liquid crystals is controlled by an electric field generated between a potential applied to the pixel electrode layer 624 and a potential of the common potential line 609. The liquid crystal molecules are horizontally rotated using the electric field which is approximately parallel to the substrate. In this case, since the liquid crystal molecules are parallel to the substrate in any state, contrast or the like is less affected by change in angle of viewing, and a viewing angle is increased.

Thus, the transistor 628 and the pixel electrode layer 624 connected thereto are formed over the substrate 600. The storage capacitor is formed with the common potential line 609, the gate insulating layer 606, and a capacitor electrode 615. The capacitor electrode 615 and the pixel electrode layer 624 are connected through a contact hole 633.

Next, a mode of a liquid crystal display device in a TN mode is described.

Figure 23:
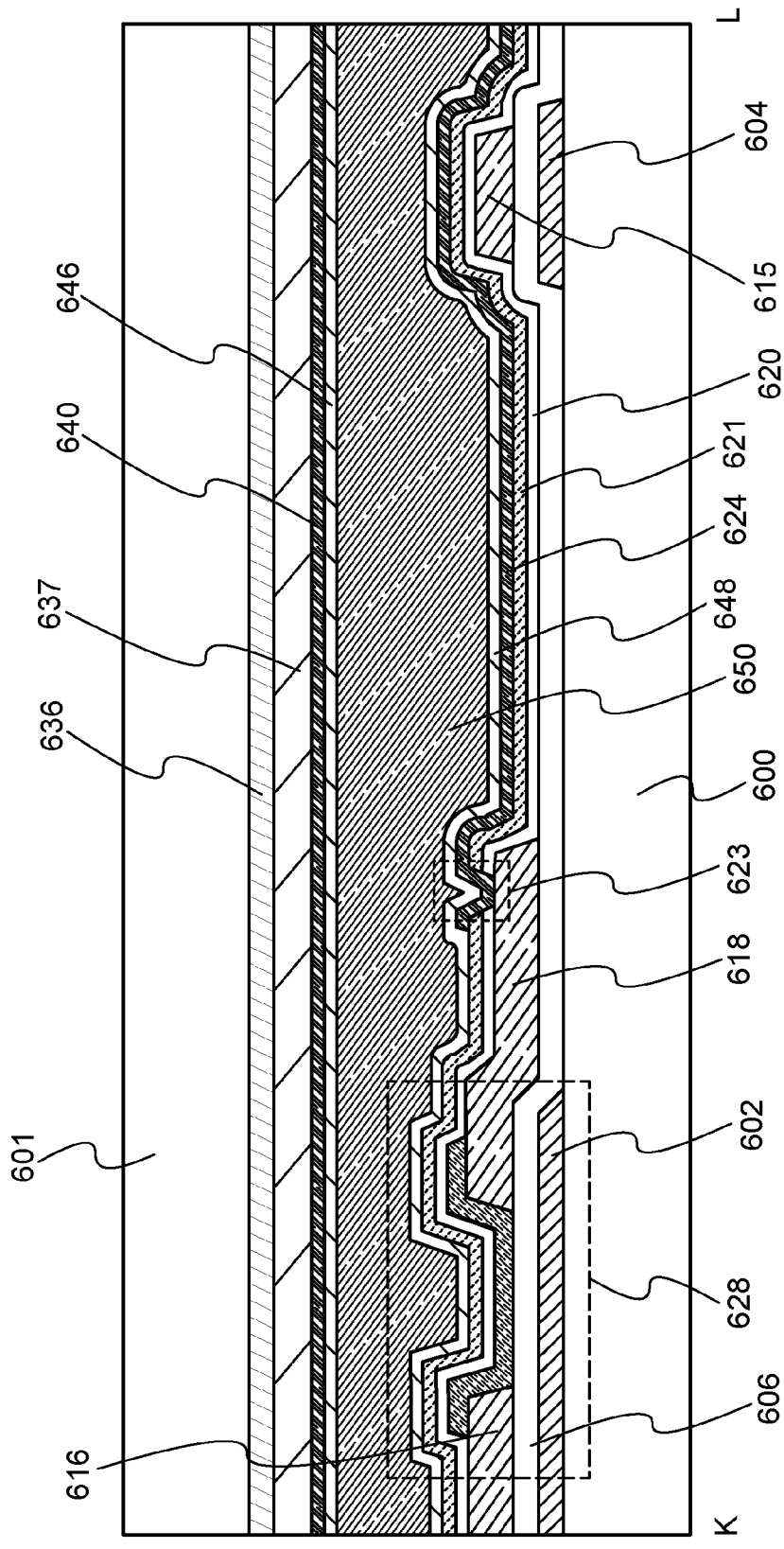
FIG. 23 is a cross-sectional view illustrating a display device.
Figure 24:
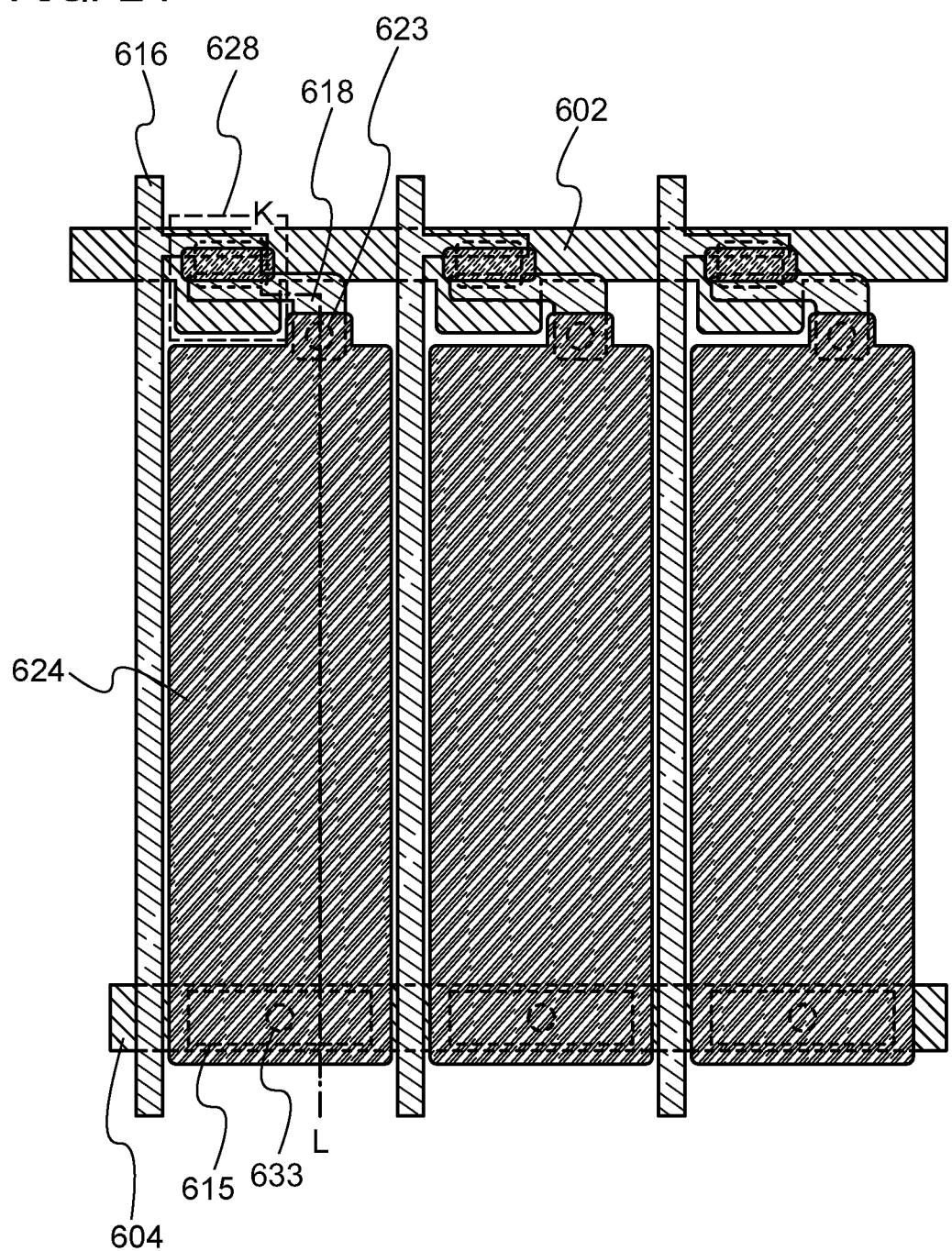
FIG. 24 is a plan view illustrating a display device.

FIG. 23 and FIG. 24 each illustrate a pixel structure of a TN liquid crystal display device. FIG. 24 is a plane view. FIG. 23 illustrates a cross-sectional structure taken along a section line K-L in FIG. 24.

The pixel electrode layer 624 is connected to the transistor 628 via the wiring 618 in the contact hole 623. The wiring 616 functioning as a data line is connected to the transistor 628. The transistor described in Embodiment 1 or 2 can be used for the transistor 628.

The pixel electrode layer 624 can be formed using a material similar to that of the pixel electrode layer 457 described in Embodiment 3.

The counter substrate 601 is provided with the coloring film 636 and the counter electrode layer 640. The planarization film 637 is formed between the coloring film 636 and the counter electrode layer 640 to prevent alignment disorder of the liquid crystals. The liquid crystal layer 650 is formed between the pixel electrode layer 624 and the counter electrode layer 640 with the alignment films 646 and 648 therebetween. The pixel electrode layer 624, the liquid crystal layer 650, and the counter electrode layer 640 overlap with each other to form a liquid crystal element.

The coloring film 636 may be formed on the substrate 600 side. A polarizing plate is attached to a surface of the substrate 600, which is the reverse of the surface provided with the transistor, and a polarizing plate is attached to a surface of the counter substrate 601, which is the reverse of the surface provided with the counter electrode layer 640.

Through the above steps, a liquid crystal display device with high aperture ratio can be manufactured.

Note that this embodiment can be freely combined with any of the other embodiments.

(Embodiment 8)

A display device disclosed in this specification can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 25A:
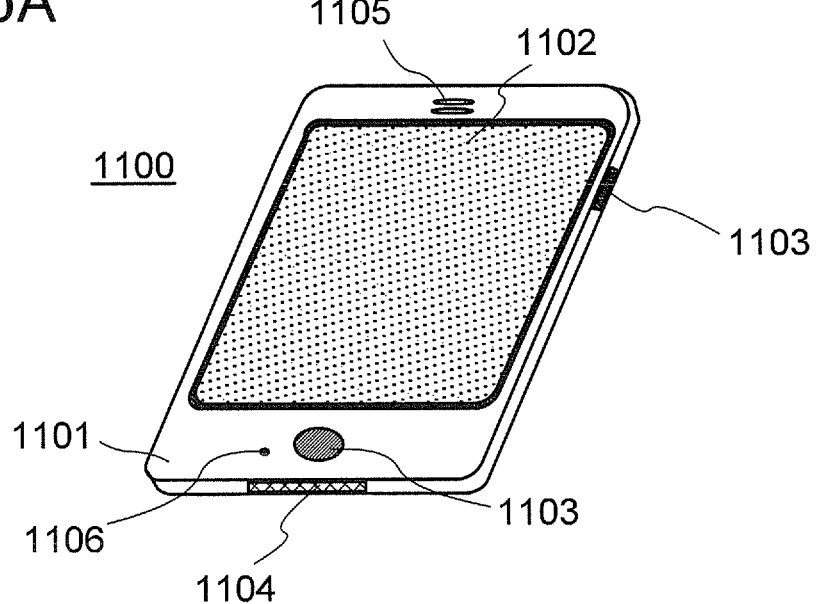
FIGS. 25A and 25B each illustrate an electronic appliance.

FIG. 25A illustrates an example of a mobile phone. A mobile phone 1100 includes a housing 1101, a display portion 1102 incorporated in the housing 1101, an operation button 1103, an external connection port 1104, a speaker 1105, a microphone 1106, and the like.

Information can be inputted to the mobile phone 1100 in FIG. 25A when the display portion 1102 is touched with a finger or the like. Operation such as telephone call and sending and receiving mails can be conducted when the display portion 1102 is touched with a finger or the like.

There are mainly three screen modes of the display portion 1102. The first mode is a display mode mainly for displaying images. The second mode is an input mode mainly for inputting data such as text. The third mode is a display-and-input mode in which two modes of the display mode and the input mode are combined.

For example, in the case of making a call or texting, a text input mode mainly for inputting text is selected for the display portion 1102 so that characters displayed on a screen can be input. In that case, it is preferable to display a keyboard or number buttons on the display portion 1102 with high recognition.

When a detection device including a sensor for detecting inclination, such as a gyroscope or an acceleration sensor, is provided inside the mobile phone 1100, display on the screen of the display portion 1102 can be automatically switched by determining the direction of the mobile phone 1100 (whether the mobile phone 1100 is placed horizontally or vertically for a landscape mode or a portrait mode).

The screen modes are changed by touching the display portion 1102 or using the operation button 1103 of the housing 1101. Alternatively, the screen modes can be switched depending on kinds of images displayed on the display portion 1102. For example, when a signal of an image displayed on the display portion is a signal of moving image data, the screen mode is switched to the display mode. When the signal is a signal of text data, the screen mode is switched to the input mode.

Further, in the input mode, a signal is detected by an optical sensor in the display portion 1102 and if input by touching the display portion 1102 is not performed for a certain period, the screen mode may be controlled so as to be switched from the input mode to the display mode.

The display portion 1102 may function as an image sensor. For example, an image of a palm print, a fingerprint, or the like is taken by touching the display portion 1102 with the palm or the finger, whereby personal authentication can be performed. Further, by using a light source which emits a near-infrared light, an image of a finger vein, a palm vein, or the like can be taken. Here, the display portion 1102 includes a plurality of transistors 460 described in Embodiment 1 or 2. Since the transistor 460 has a light-transmitting property, a light sensor can be provided below the transistor 460. Further, in the case of using a light source which emits a near-infrared light, light is not blocked by the transistor 460, so that an object can be irradiated with a near-infrared light with high light intensity.

Figure 25B:
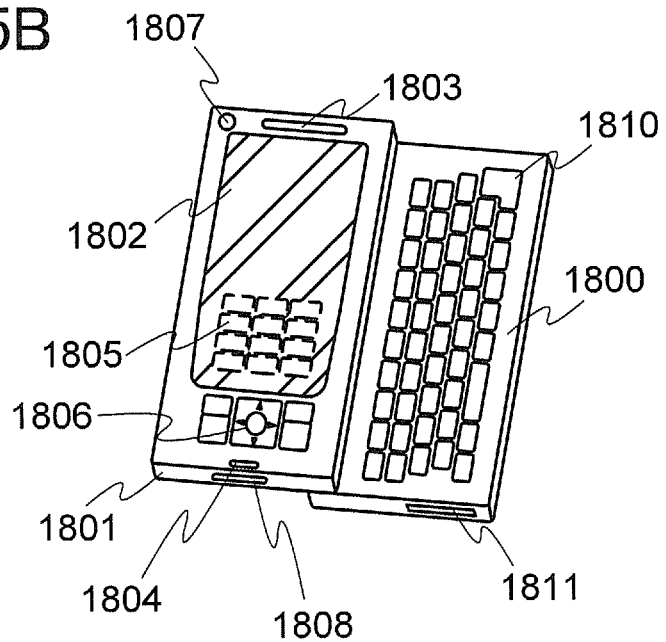

FIG. 25B also illustrates an example of a mobile phone. A portable information terminal whose example is illustrated in FIG. 25B can have a plurality of functions. For example, such a portable information terminal incorporates a computer and can have a function of processing a variety of pieces of data, in addition to a telephone function.

The portable information terminal illustrated in FIG. 25B has a housing 1800 and a housing 1801. The housing 1800 includes a display panel 1802, a speaker 1803, a microphone 1804, a pointing device 1806, a camera lens 1807, an external connection terminal 1808, and the like. The housing 1801 includes a keyboard 1810, an external memory slot 1811, and the like. In addition, an antenna is incorporated in the housing 1801.

The display panel 1802 is provided with a touch panel. A plurality of operation keys 1805 which are displayed as images are illustrated by dashed lines in FIG. 25B.

Further, in addition to the above structure, a contactless IC chip, a small memory device, or the like may be incorporated.

The display device of the present invention can be used for the display panel 1802 and the direction of display is changed appropriately depending on an application mode. Further, the display device is provided with the camera lens 1807 on the same surface as the display panel 1802, and thus it can be used as a video phone. The speaker 1803 and the microphone 1804 can be used for recording, and playing sound, etc. as well as voice calls. Moreover, the housings 1800 and 1801 in a state where they are developed as illustrated in FIG. 25B can shift so that one is lapped over the other by sliding; therefore, the size of the portable information terminal can be reduced, which makes the portable information terminal suitable for being carried.

The external connection terminal 1808 is an input-output terminal for inputting power supply and information communication, and storing electric power and data communication with a personal computer or the like are possible. Moreover, a storage medium can be inserted into the external memory slot 1811 so that a large amount of data can be stored and can be moved.

Further, in addition to the above functions, an infrared communication function, a television reception function, or the like may be provided.

Figure 26A:
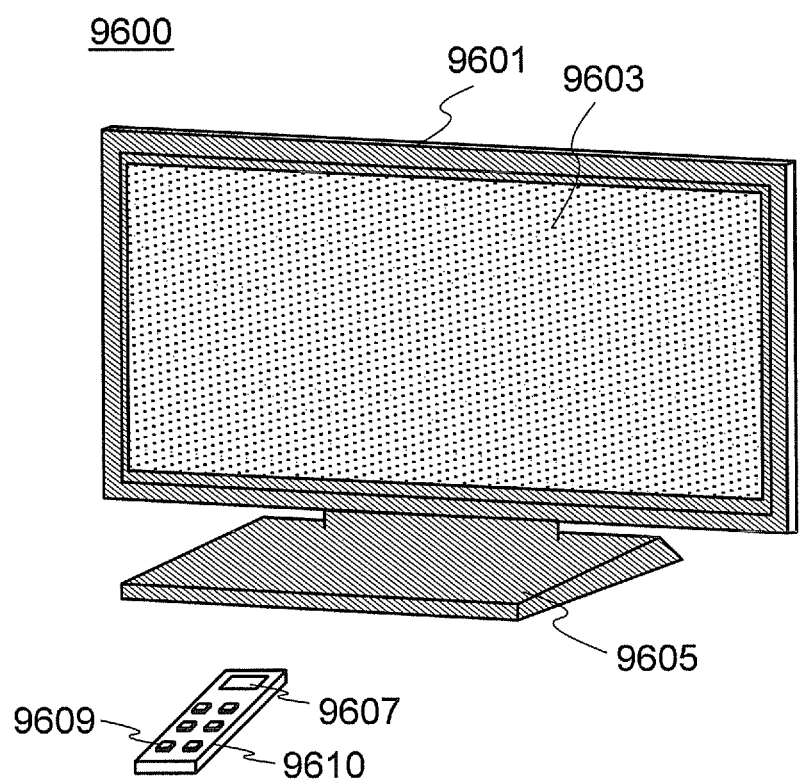
FIGS. 26A and 26B each illustrate an electronic appliance.

FIG. 26A illustrates an example of a television set. In a television set 9600, a display portion 9603 is incorporated in a housing 9601. The display portion 9603 can display images. Here, the housing 9601 is supported by a stand 9605.

The television set 9600 can be operated by an operation switch of the housing 9601 or a separate remote controller 9610. Switching channels and volume can be controlled by an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 26B:
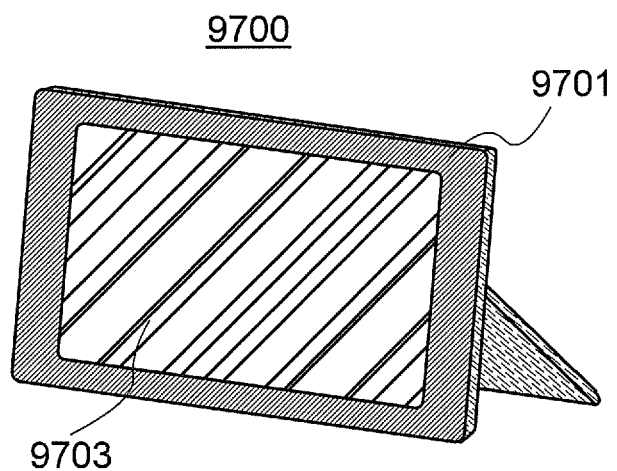

FIG. 26B illustrates an example of a digital photo frame. For example, in the digital photo frame 9700, a display portion 9703 is incorporated in a housing 9701. The display portion 9703 can display a variety of images. For example, the display portion 9703 can display image data taken with a digital camera or the like and function as a normal photo frame Note that the digital photo frame 9700 is provided with an operation portion, an external connection terminal (such as a USB terminal), an external memory slot, and the like. Although these components may be provided on the surface on which the display portion is provided, it is preferable to provide them on the side surface or the back surface for the design of the digital photo frame 9700. For example, a memory storing image data taken with a digital camera is inserted in the external memory slot of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 27:
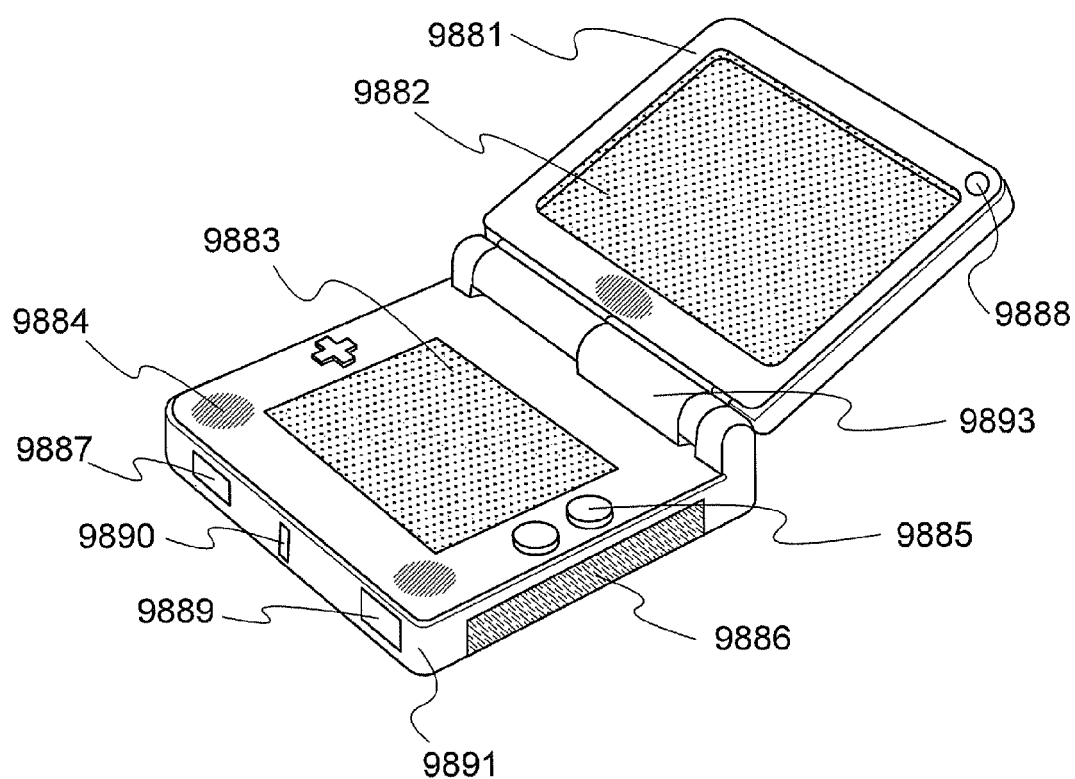
FIG. 27 illustrates an electronic appliance.

FIG. 27 is a portable game machine and includes two housings, a housing 9881 and a housing 9891, which are connected with a joint portion 9893 so that the portable game machine can be opened or folded. A display portion 9882 and a display portion 9883 are incorporated in the housing 9881 and the housing 9891, respectively.

In addition, the portable game machine illustrated in FIG. 27 includes a speaker portion 9884, an external memory slot 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable game machine is not limited to the above and other structures provided with at least a display device disclosed in this specification may be employed. The portable game machine may include an additional accessory as appropriate. The portable game machine illustrated in FIG. 27 has a function of reading a program or data stored in a recording medium to display it on the display portion, and a function of sharing information with another portable game machine by wireless communication. The portable game machine illustrated in FIG. 27 can have various functions without limitation to the above.

As described above, the display devices described in other embodiments can be provided in display portions of a variety of electronic appliances as described above.

Note that this embodiment can be freely combined with any of the other embodiments.

(Embodiment 9)

Figure 28A:
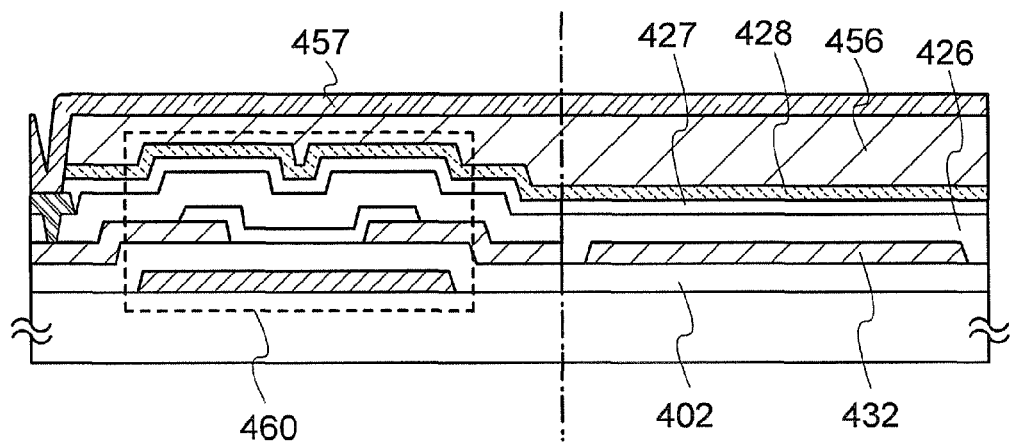
FIGS. 28A and 28B are cross-sectional views illustrating one embodiment of the present invention.
Figure 28B:
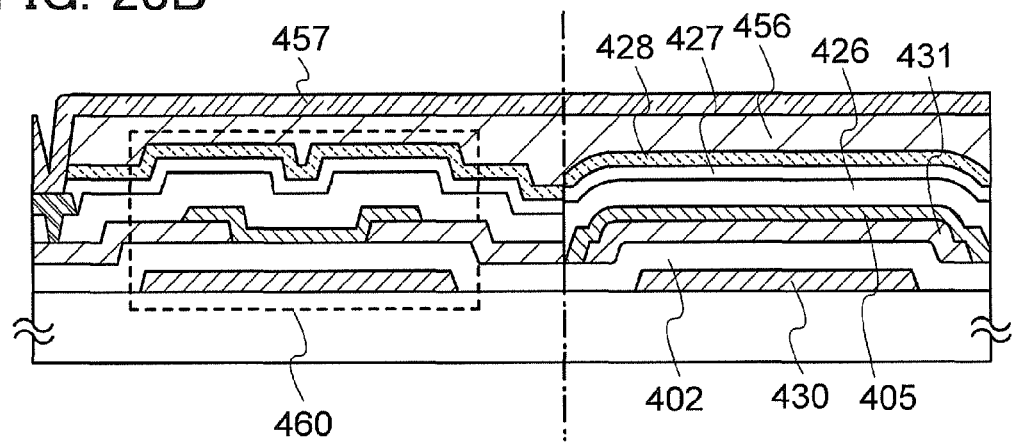

In this embodiment, an example of a structure of a storage capacitor which is different from that in Embodiment 3 will be described with reference to FIGS. 28A and 28B. FIGS. 28A and 28B are each a cross-sectional view of the transistor 460 and a storage capacitor in the pixel portion. Note that FIGS. 28A and 28B are the same as FIG. 3 except for a structure of the storage capacitor; therefore, the same portions are denoted by the same reference numerals and detailed description of the same portions is omitted.

FIG. 28A illustrates an example in which a storage capacitor is formed with the pixel electrode layer 457 and a capacitor wiring layer 432 in which the oxide insulating layers 426 and 427, the protective insulating layer 428, and the planarization insulating layer 456 are used as dielectrics. Since the capacitor wiring layer 432 is formed using the same light-transmitting material in the same step as the source electrode layer of the transistor 460 in the pixel portion, the capacitor wiring layer 432 is arranged so as not to overlap with a source wiring layer of the transistor 460.

In the storage capacitor illustrated in FIG. 28A, a pair of electrodes and the dielectrics have light-transmitting properties, and thus, the whole storage capacitor has light-transmitting properties.

FIG. 28B illustrates an example of a structure of the storage capacitor, which is different from that in FIG. 28A.

FIG. 28B illustrates an example in which a storage capacitor is formed with the capacitor wiring layer 430, and a stack of the capacitor electrode 431 and the oxide semiconductor layer 405, in which the gate insulating layer 402 is used as a dielectric. Here, the oxide semiconductor layer 405 formed in contact with the capacitor electrode 431 serves as one of electrodes of the storage capacitor. Note that the oxide semiconductor layer 405 is formed using the same light-transmitting material in the same step as the source electrode layer and the drain electrode layer of the transistor 460. Moreover, since the capacitor wiring layer 430 is formed using the same light-transmitting material in the same step as the gate electrode layer of the transistor 460, the capacitor wiring layer 430 is arranged so as not to overlap with a gate wiring layer of the transistor 460.

Although not illustrated, the capacitor electrode 431 is electrically connected to the pixel electrode layer 457.

Also in the storage capacitor illustrated in FIG. 28B, a pair of electrodes and the dielectrics have light-transmitting properties, and thus the whole storage capacitor has a light-transmitting property.

Each of the storage capacitors illustrated in FIGS. 28A and 28B has light-transmitting properties; thus, sufficient capacitance and high aperture ratio can be obtained even when the size of a pixel is decreased in order to realize higher definition of display images.

Note that this embodiment can be freely combined with any of the other embodiments.

This application is based on Japanese Patent Application serial no. 2009-196618 filed with Japan Patent Office on Aug. 27, 2009, the entire contents of which are hereby incorporated by reference.

What is claimed is:

1. A method for manufacturing a semiconductor device, comprising the steps of:
    forming an oxide semiconductor layer over an insulating layer;
    forming a source electrode layer and a drain electrode layer over and in contact with a first region of the oxide semiconductor layer;
    forming an oxide insulating layer over and in contact with a second region of the oxide semiconductor layer; and
    performing a heat treatment on the oxide insulating layer so that oxygen in the oxide insulating layer is supplied to the second region of the oxide semiconductor layer,
    wherein a conductivity of the first region of the oxide semiconductor layer is higher than a conductivity of the second region of the oxide semiconductor layer.

2. The method for manufacturing a semiconductor device according to claim 1, further comprising a step of performing a heat treatment on the oxide semiconductor layer before the step of forming the oxide insulating layer.

3. The method for manufacturing a semiconductor device according to claim 1, further comprising a step of performing a heat treatment on the oxide semiconductor layer under an atmosphere including nitrogen before the step of forming the oxide insulating layer.

4. The method for manufacturing a semiconductor device according to claim 1, wherein the oxide semiconductor layer comprises indium, gallium, and zinc.

5. The method for manufacturing a semiconductor device according to claim 1, wherein the oxide semiconductor layer comprises indium, tin, and zinc.

6. The method for manufacturing a semiconductor device according to claim 1,
    wherein the first region is an n-type region, and
    wherein the second region is an i-type region.

7. The method for manufacturing a semiconductor device according to claim 1, wherein thickness of the oxide semiconductor layer is from 15 nm to 50 nm inclusive.

8. The method for manufacturing a semiconductor device according to claim 1, wherein the semiconductor device includes a field effect transistor, a liquid crystal display device, a television device, a mobile phone, a camera, a portable information terminal, or a personal computer.

9. A method for manufacturing a semiconductor device, comprising the steps of:
    forming an oxide semiconductor layer over an insulating layer;
    performing a first heat treatment on the oxide semiconductor layer;
    forming a source electrode layer and a drain electrode layer over and in contact with a first region of the oxide semiconductor layer;
    forming an oxide insulating layer over and in contact with a second region of the oxide semiconductor layer; and
    performing a second heat treatment on the oxide insulating layer so that oxygen in the oxide insulating layer is supplied to the second region of the oxide semiconductor layer,
    wherein a conductivity of the first region of the oxide semiconductor layer is higher than a conductivity of the second region of the oxide semiconductor layer.

10. The method for manufacturing a semiconductor device according to claim 9, wherein the first heat treatment is performed before the steps of forming the source electrode layer, the drain electrode layer, and the oxide insulating layer.

11. The method for manufacturing a semiconductor device according to claim 9, wherein the first heat treatment is performed under an atmosphere including nitrogen.

12. The method for manufacturing a semiconductor device according to claim 9, wherein a temperature of the first heat treatment is higher than a temperature of the second heat treatment.

13. The method for manufacturing a semiconductor device according to claim 9, wherein the oxide semiconductor layer comprises indium, gallium, and zinc.

14. The method for manufacturing a semiconductor device according to claim 9, wherein the oxide semiconductor layer comprises indium, tin, and zinc.

15. The method for manufacturing a semiconductor device according to claim 9,
    wherein the first region is an n-type region, and
    wherein the second region is an i-type region.

16. The method for manufacturing a semiconductor device according to claim 9, wherein thickness of the oxide semiconductor layer is from 15 nm to 50 nm inclusive.

17. The method for manufacturing a semiconductor device according to claim 9, wherein the semiconductor device includes a field effect transistor, a liquid crystal display device, a television device, a mobile phone, a camera, a portable information terminal, or a personal computer.

* * * * *

UNITED STATES PATENT AND TRADEMARK OFFICE
CERTIFICATE OF CORRECTION

| | | |
|---|---|---|
| PATENT NO. | : 8,879,011 B2 | Page 1 of 1 |
| APPLICATION NO. | : 14/196236 | |
| DATED | : November 4, 2014 | |
| INVENTOR(S) | : Shunpei Yamazaki et al. | |

It is certified that error appears in the above-identified patent and that said Letters Patent is hereby corrected as shown below:

In the Specification

At column 22, line 1, "nm" should be --nm.--.

Signed and Sealed this
Thirty-first Day of March, 2015

Michelle K. Lee
*Director of the United States Patent and Trademark Office*